United States Patent [19]
Tsukude et al.

[11] Patent Number: 5,633,831
[45] Date of Patent: May 27, 1997

[54] SEMICONDUCTOR MEMORY DEVICE HAVING SELF-REFRESHING FUNCTION

[75] Inventors: Masaki Tsukude; Kazutami Arimoto, both of Hyogo, Japan

[73] Assignee: Mitsubishi Denki Kabushiki Kaisha, Tokyo, Japan

[21] Appl. No.: 607,497

[22] Filed: Feb. 27, 1996

Related U.S. Application Data

[62] Division of Ser. No. 382,557, Feb. 2, 1995, Pat. No. 5,568,440.

[30] Foreign Application Priority Data

Feb. 3, 1994 [JP] Japan ................................. 6-11900
Mar. 15, 1994 [JP] Japan ................................. 6-44369

[51] Int. Cl.$^6$ ........................................... G11C 7/00
[52] U.S. Cl. ................. 365/222; 365/226; 365/189.09; 365/189.07
[58] Field of Search ............................ 365/222, 226, 365/227, 189.07, 233.5, 233, 189.08, 189.09

[56] References Cited

U.S. PATENT DOCUMENTS

| | | | |
|---|---|---|---|
| 4,688,196 | 8/1987 | Inagaki et al. | 365/222 |
| 4,901,283 | 2/1990 | Hanbury et al. | 365/222 |
| 5,249,155 | 9/1993 | Arimoto et al. | 365/222 |
| 5,295,110 | 3/1994 | Sakakibara | 365/222 |
| 5,337,282 | 8/1994 | Koike | 365/222 |
| 5,469,559 | 11/1995 | Parks et al. | 365/222 |
| 5,475,646 | 12/1995 | Ogihara | 365/222 |
| 5,488,587 | 1/1996 | Fukumoto | 365/222 |

FOREIGN PATENT DOCUMENTS 61-57097 3/1986 Japan.
5-198165 8/1993 Japan.

*Primary Examiner*—Tan T. Nguyen
*Attorney, Agent, or Firm*—Lowe, Price, LeBlanc & Becker

[57] ABSTRACT

A timing generating circuit generates a signal SRE defining a period in which a self-refreshing operation is carried out based on a signal $ext\overline{RAS}$ and a signal $ext\overline{CAS}$. An internal voltage down-converting circuit controls the level of an internal power supply voltage intVcc to be generated in the period defined by the signal SRE lower in the self-refreshing operation than in a normal operation. As a result, a semiconductor memory device is obtained which reduces current consumption in the self-refreshing operation by simple control in an internal circuit.

18 Claims, 27 Drawing Sheets

FIG.11 { SRE1, SRE2, int.Vcc }

(IN NORMAL OPERATION)  (IN SELF-REFRESHING OPERATION)

FIG.23
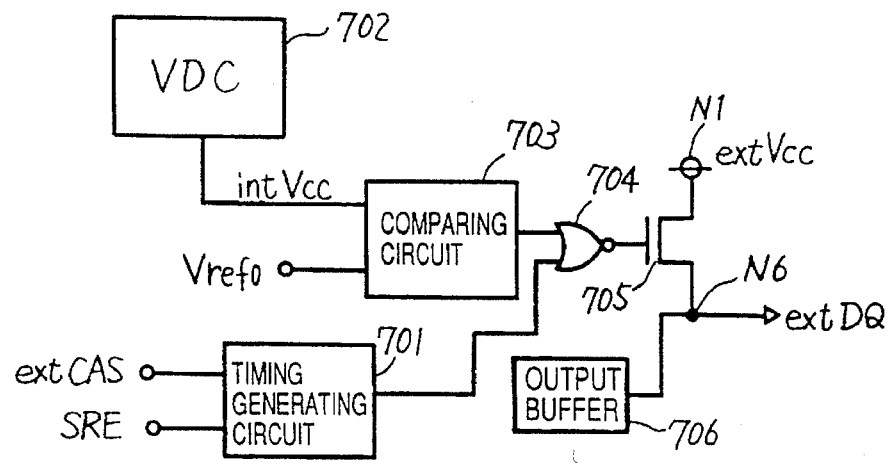
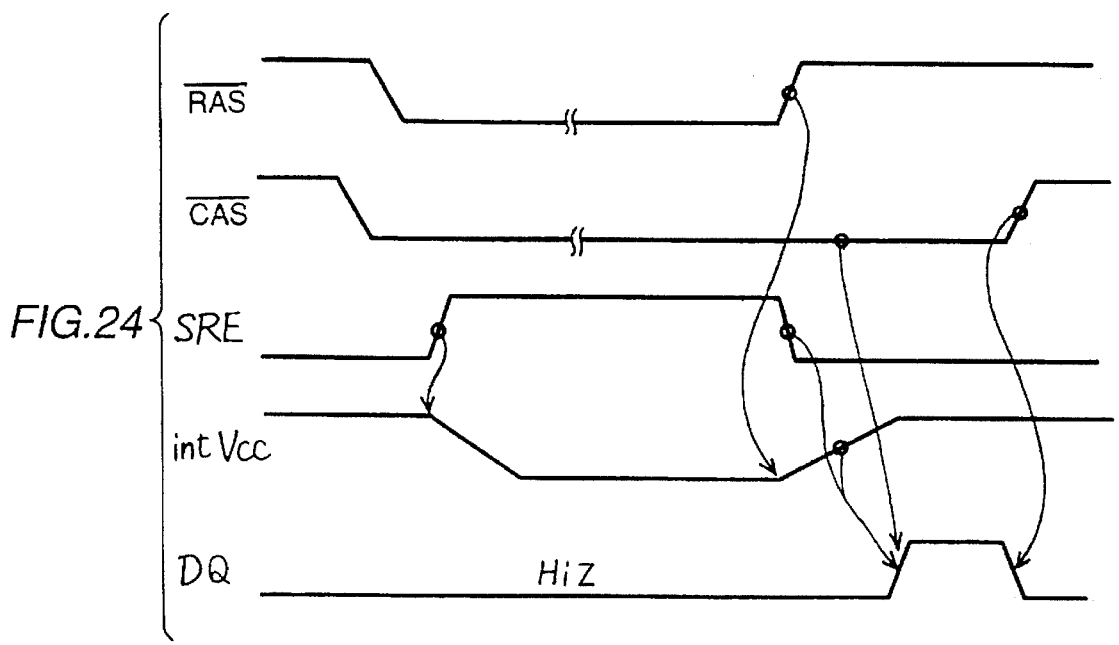
FIG.24

FIG.25
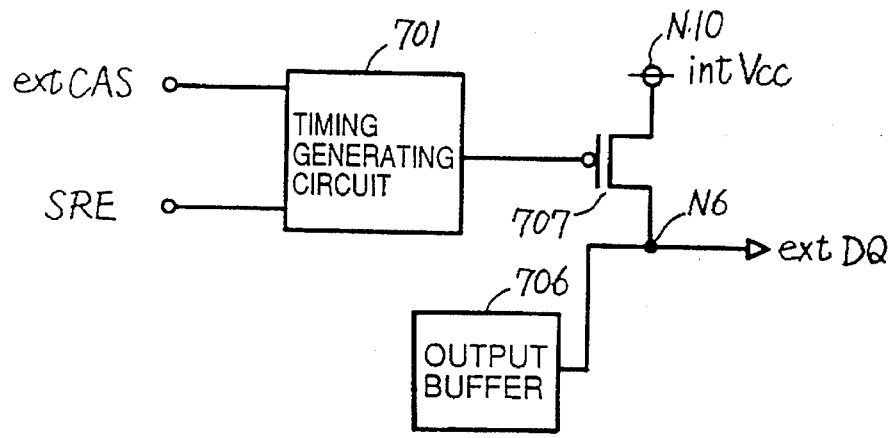
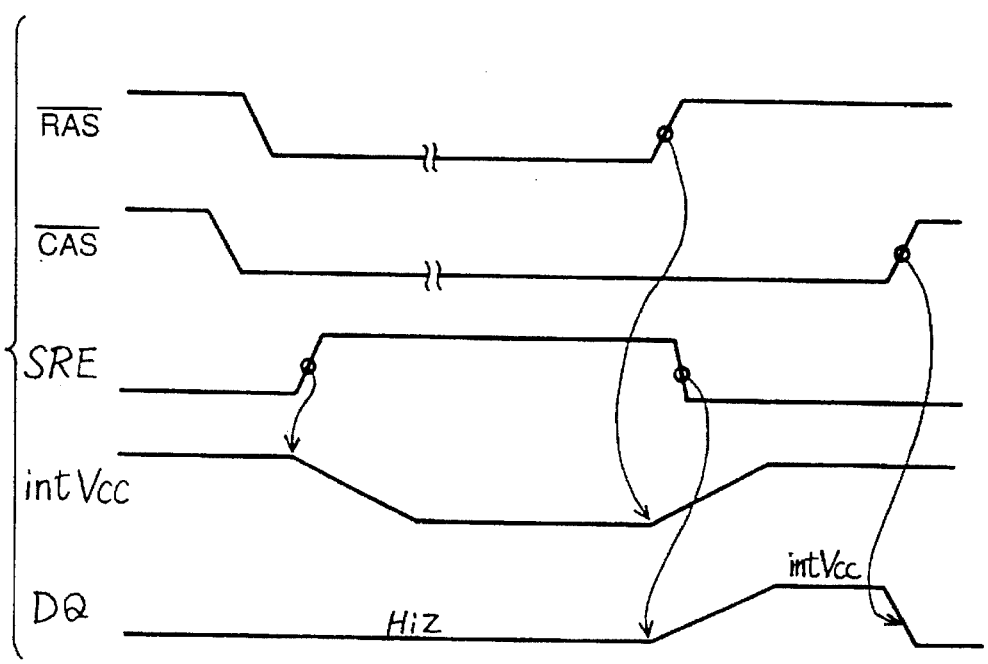
FIG.26

SEMICONDUCTOR MEMORY DEVICE HAVING SELF-REFRESHING FUNCTION

This application is a division of application Ser. No. 08/382,557 filed Feb. 2, 1995 now U.S. Pat. No. 5,568,440.

BACKGROUND OF THE INVENTION

1. Field of the Invention

The present invention generally relates to semiconductor memory devices, and more particularly, to a DRAM (Dynamic Random Access Memory) carrying out a self-refreshing operation.

2. Description of the Background Art

In the DRAM serving as a semiconductor memory device, a memory cell is self-refreshed. In one method of self-refreshing, a memory cell is refreshed in a refresh cycle generated by an internal circuit of a chip on which the DRAM is formed.

In the self-refreshing operation, a memory cell can be refreshed without an externally applied refresh cycle. More specifically, a relatively long refresh cycle is generated in an internal circuit of a chip, and the refreshing operation is carried out by the internal circuit of the chip in the generated refresh cycle.

Description will now be given of a conventional self-refreshing operation. FIG. 37 is a timing chart showing one example of timings of the conventional self-refreshing operation.

Referring to FIG. 37, after an external column address strobe signal ext$\overline{CAS}$ falls to an L or logical low level, an external row address strobe signal ext$\overline{RAS}$ falls to the L level. When these signals both hold the L level for a predetermined period after that timing, that is, a $\overline{CAS}$ Before $\overline{RAS}$ timing (hereinafter referred to as a "CBR timing"), a self-refresh enable signal SRE defining a self-refreshing period rises to an H or logical high level.

In response to the signal SRE attaining the H level, an internal row address strobe signal int$\overline{RAS}$ generates a relatively long refresh cycle trc within a chip. In response to the signal int$\overline{RAS}$, the refreshing operation is carried out. Also during the self-refreshing operation, an internal power supply voltage intVcc is held constant.

A problem associated with such a self-refreshing operation is how to make a refresh cycle longer, and how to reduce current consumption both in a stand-by period and an active period in the self-refreshing operation.

However, in a 16 MDRAM and other devices developed thereafter, scale down of a power supply voltage has not caught up with progress of miniaturization. Therefore, in order to implement high integration density while securing reliability of the device, an internal voltage down-converting circuit has been provided in the chip. The internal voltage down-converting circuit generates a low internal power supply voltage obtained by down-converting an external power supply voltage.

In order to implement high speed access in a device operating based on the internal power supply voltage lower than the external power supply voltage, a word line boosted voltage generating circuit has also been provided in the chip.

As described above, the internal voltage down-converting circuit and the boosted voltage generating circuit were provided in the chip in the DRAM. Therefore, these circuits increased current consumption in a stand-by period or the like in the self-refreshing operation.

One method of reducing an active current in the self-refreshing operation is to decrease the external power supply voltage in the self-refreshing operation. In this method, however, it is necessary to control the power supply voltage out of the chip. Therefore, it was difficult to control increase and decrease of the power supply voltage on a memory board.

SUMMARY OF THE INVENTION

One object of the present invention is to provide a semiconductor memory device which can reduce current consumption at the time of self-refreshing by control in an internal circuit.

Another object of the present invention is to reduce current consumption in an internal voltage down-converting circuit.

Still another object of the present invention is to reduce current consumption in a boosted voltage generating circuit.

A further object of the present invention is to implement initialization of a refresh ability without requiring complicated external control in transition from a normal operation to a self-refreshing operation, and in transition from the self-refreshing operation to the normal operation.

According to one aspect of the present invention, a semiconductor memory device which carries out a normal operation and a self-refreshing operation based on a potential swing having a swing width defined by an internal power supply potential difference includes a self-refresh period defining circuit and an internal power supply potential difference generating circuit. The self-refresh period defining circuit generates a self-refresh period definition signal defining a period in which the self-refreshing operation is carried out.

The internal power supply potential generating circuit generates, in response to the self-refresh period definition signal, an internal power supply potential difference so that a potential swing width in the period defined by the signal is smaller than that in the normal operation.

Therefore, the internal power supply potential difference generated by the internal power supply potential difference generating circuit defines the potential swing width so that the potential swing width is smaller in the self-refreshing operation than in the normal operation. Therefore, current consumption in the self-refreshing operation can be reduced by simple control in an internal circuit.

A semiconductor memory device according to another aspect of the present invention which carries out a normal operation and a self-refreshing operation based on a voltage swing having a swing width defined by an internal power supply voltage includes a self-refresh period defining circuit and an internal power supply voltage generating circuit.

The self-refresh period defining circuit generates a self-refresh period definition signal defining a period in which the self-refreshing operation is carried out.

The internal power supply voltage generating circuit generates, in response to the self-refresh period definition signal, the internal power supply voltage so that it is lower in the period defined by the signal than in the normal operation.

Therefore, the internal power supply voltage generated by the internal power supply voltage generating circuit is made lower in the self-refreshing operation than in the normal operation. Therefore, current consumption in the self-refreshing operation can be reduced by simple control in an internal circuit.

A semiconductor memory device according to still another aspect of the present invention which carries out a normal operation and a self-refreshing operation based on a voltage swing having a swing width defined by an internal power supply potential difference includes a self-refresh period defining circuit and an internal power supply voltage generating circuit.

The self-refresh period defining circuit generates a self-refresh period definition signal defining a period in which the self-refreshing operation is carried out.

The internal power supply voltage generating circuit generates the internal power supply potential difference, and in response to the self-refresh period definition signal, controls the internal power supply potential difference to be generated.

More specifically, the internal power supply voltage generating circuit controls the internal power supply potential difference to be generated to decrease from a first potential difference to a second potential difference in response to the beginning of the period defined by the self-refresh period definition signal, and to increase from the second potential difference to the first potential difference in response to the end of the period defined by the self-refresh period definition signal.

As described above, at the beginning of the self-refreshing operation, the internal power supply potential difference is decreased from the first potential to the second potential, and, at the end of the self-refreshing operation, the internal power supply potential difference is increased from the second potential difference to the first potential difference. Therefore, the internal power supply potential difference is made smaller in the self-refreshing operation than in the normal operation. Therefore, current consumption in the self-refreshing operation can be reduced by simple control in an internal circuit.

The semiconductor memory device according to this aspect may include a circuit making different in length a period in which the internal power supply potential difference is decreased by the internal power supply voltage generating means and a period in which the internal power supply potential difference is increased by the internal power supply voltage generating circuit.

Since the period in which the internal power supply potential difference is decreased and the period in which the internal power supply potential difference is increased are different in length, stabilization of operation of the semiconductor memory device suitable for the decrease period and the increase period, respectively, can be implemented.

The semiconductor memory device according to this aspect of the present invention further includes a decrease period definition signal generating circuit, an increase period definition signal generating circuit, a hold period definition signal generating circuit, and a refresh cycle setting circuit. The refresh cycle setting circuit may include a first refresh cycle setting circuit, a second refresh cycle setting circuit, and a third refresh cycle circuit setting circuit.

The decrease period definition signal generating circuit generates a decrease period definition signal activated in the period in which the internal power supply potential difference is decreased from the first potential difference to the second potential difference by the internal power supply voltage generating circuit.

The increase period definition signal generating circuit generates an increase period definition signal activated in the period in which the internal power supply potential difference is increased from the second potential difference to the first potential difference by the internal power supply voltage generating circuit.

The hold period definition signal generating circuit generates a hold period definition signal activated in a period in which the internal power supply potential difference is held at the second potential difference by the internal power supply voltage generating circuit.

The refresh cycle setting circuit sets refresh cycles in the self-refreshing operation in response to the decrease period definition signal, the increase period definition signal, and the hold period definition signal.

The refresh cycle setting circuit includes a first refresh cycle setting circuit, a second refresh cycle setting circuit, and a third refresh cycle setting circuit. The first refresh cycle setting circuit sets a first refresh cycle in response to the decrease period definition signal. The second refresh cycle setting circuit sets a second refresh cycle in response to the increase period definition signal. The third refresh cycle setting circuit sets a third refresh cycle in response to the hold period definition signal. The first and second refresh cycles are set shorter than the third refresh cycle.

By thus structured, the first and second refresh cycles set corresponding to the decrease period and the increase period of the internal power supply potential difference are shorter than the third refresh cycle. Therefore, the self-refreshing operation is carried out in a shorter cycle in the increase period and the decrease period of the internal power supply potential difference than in the hold period. Therefore, the semiconductor memory device is less likely to be affected by bump or the like caused by decrease in electric charge stored in a memory cell during the increase period and the decrease period of the internal power supply potential difference, making it possible to stabilize the operation.

In the semiconductor memory device according to this aspect, the internal power supply voltage generating circuit may include a voltage control circuit controlling decrease in the internal power supply potential difference from the first potential difference to the second potential difference and increase in the internal power supply potential difference from the second potential difference to the first potential difference in a plurality of steps.

Since decrease and increase of the internal power supply potential difference are carried out in a plurality of stages, respectively, the internal power supply potential difference does not change abruptly. Therefore, the operation of the semiconductor memory device during the increase period and the decrease period of the internal power supply potential difference can be stabilized, which would be otherwise unstabilized by bump or the like.

In the semiconductor memory device according to this aspect, at least one internal power supply voltage generating circuit includes a reference voltage generating circuit generating a reference voltage of the internal power supply voltage. The reference voltage generating circuit may include a first potential node, a second potential node, an output node, a constant current generating circuit, a resistor circuit, and a transistor circuit.

The first potential node receives a first potential. The second potential node receives a second potential. The output node provides the reference voltage.

The constant current generating circuit is provided between the first potential node and the output node, and generates a constant current. The resistor circuit is provided between the output node and the second potential node. The transistor circuit is connected in parallel with a part of the resistor circuit, and turned on/off in response to the self-refresh period definition signal.

When the transistor circuit is turned on in response to the self-refresh period definition signal, a resistance value of the resistor circuit is decreased. Therefore, in this case, the voltage at the output node, that is, the reference voltage of the internal power supply voltage, is decreased. As a result, the internal power supply voltage is decreased. Therefore, current consumption in the self-refreshing operation can be reduced.

In the semiconductor memory device according to this aspect, at least one internal power supply voltage generating circuit may include a reference voltage generating circuit, a differential amplifying circuit, a halting circuit, a voltage output node, a power supply node, an N channel transistor, and a transistor control circuit.

The reference voltage generating circuit generates the reference voltage of the internal power supply voltage. The differential amplifying circuit provides a control voltage for controlling the internal power supply voltage based on a difference between the internal power supply voltage to be generated and the reference voltage. The halting circuit halts, in response to the self-refresh period definition signal, operation of the differential amplifying circuit in a period of the self-refreshing operation defined by the signal.

The voltage output node provides the internal power supply voltage. The power supply node receives an external power supply voltage. The N channel transistor is provided between the power supply node and the voltage output node, and supplies the internal power supply voltage based on the external power supply voltage to the output node in response to a signal it receives at its gate electrode.

The transistor control circuit applies, in response to the self-refresh period definition signal, the reference voltage to the gate electrode of the N channel transistor in the period of the self-refreshing operation defined by the signal.

In the self-refreshing operation, the operation of the differential amplifying circuit is halted, and the N channel transistor is rendered conductive. When the N channel transistor is rendered conductive, the internal power supply voltage based on the external power supply voltage is supplied to the voltage output node. Therefore, since the differential amplifying circuit consuming current also at the time of stand-by of the self-refreshing operation is halted at the time of self-refreshing, current consumption in the self-refreshing operation can be reduced.

The semiconductor memory device according to this aspect of the present invention further includes a boosted voltage generating circuit generating a boosted voltage. The boosted voltage generating circuit may include a ring oscillating circuit, a pumping circuit, and a frequency changing circuit.

The ring oscillating circuit oscillates a pulse signal. The pumping circuit provides the boosted voltage in response to the pulse signal. In response to the self-refresh period definition signal, the frequency changing circuit makes the frequency of the pulse signal oscillated by the ring oscillating circuit lower in the period of the self-refreshing operation defined by the signal than in the normal operation.

By thus structured, the frequency of the pulse signal oscillated by the ring oscillating circuit is made lower in the self-refreshing operation than in the normal operation. Therefore, the pumping frequency of the pumping circuit becomes lower, and current consumption in the self-refreshing operation can be reduced.

The semiconductor memory device according to this aspect of the present invention may further include a comparing circuit and an external output circuit.

The comparing circuit compares the internal power supply potential difference generated by the internal power supply voltage generating circuit and a predetermined potential difference, and activates an output signal when the internal power supply potential difference and the predetermined potential difference become approximately the same.

The external output circuit receives the output signal of the comparing circuit. When the signal is activated, the external output circuit provides to the outside world a signal at a predetermined level indicating that the internal power supply potential difference has returned to a potential difference in the normal operation.

By thus structured, when the internal power supply potential difference returns to the level of the normal operation at the end of the self-refreshing operation, if the internal power supply potential difference becomes equal or approximately equal to a predetermined value, the output signal of the comparing circuit is activated. A signal at a predetermined level is provided to the outside world by the external output circuit in response to the activation.

Therefore, after completion of the self-refreshing operation, it can be externally known that the internal power supply potential difference has returned to a potential difference in the normal operation.

A semiconductor memory device according to a further aspect of the present invention which carries out a self-refreshing operation based on an internal power supply voltage includes a power supply node, a self-refresh period definition circuit, and an internal voltage down-converting circuit. The internal voltage down-converting circuit includes a reference voltage generating circuit. The reference voltage generating circuit includes an output node, a first reference voltage supplying circuit, a second reference voltage supplying circuit, and a supply stop circuit.

The power supply node receives an external power supply voltage. The self-refresh period defining circuit generates a self-refresh period definition signal defining a period in which the self-refreshing operation is carried out. The internal voltage down-converting circuit down-converts the external power supply voltage, and generates the internal power supply voltage.

The reference voltage generating circuit generates a reference voltage of the internal power supply voltage. The output node provides the reference voltage. The first reference voltage supplying circuit supplies a first constant reference voltage to the output node. The second reference voltage supplying circuit receives the external power supply voltage, and, when the external power supply voltage exceeds a predetermined level for a burn-in test, supplies a second reference voltage in response to the external power supply voltage to the output node.

The supply stop circuit receives the self-refresh period definition signal, and stops supply of the external power supply voltage to the second reference voltage supplying circuit during the period of the self-refreshing operation defined by the signal.

The reference voltage generating circuit provides from the output node a sum of the first reference voltage from the first reference voltage supplying circuit and the second reference voltage from the second reference voltage supplying circuit.

Since the second reference voltage is a reference voltage for a burn-in test, the voltage is not needed in the self-refreshing operation. Therefore, the second reference voltage supplying circuit is halted by the supply stop circuit in the self-refreshing operation. As a result, current consumption in the self-refreshing operation can be reduced.

A semiconductor memory device according to a further aspect of the present invention which has a memory cell array and a peripheral circuit and carries out a normal operation and a self-refreshing operation based on an internal power supply voltage includes a first internal power supply voltage generating circuit, a second internal power supply voltage generating circuit, a first voltage control circuit, and a second voltage control circuit.

The first internal power supply voltage generating circuit generates a first internal power supply voltage to be supplied to the memory cell array. The second internal power supply voltage generating circuit generates a second internal power supply voltage to be supplied to the peripheral circuit.

The first voltage control circuit controls the first internal power supply voltage generated by the first internal power supply voltage generating circuit to be lower in the self-refreshing operation than in the normal operation.

The second voltage control circuit controls the second internal power supply voltage generated by the second internal power supply voltage generating circuit to be lower in the self-refreshing operation than in the normal operation.

As described above, the first and second internal power supply voltage generating circuits are provided corresponding to the memory cell array and the peripheral circuit. The first and second internal power supply voltages generated by the first and second internal power supply voltage generating circuits are controlled to be lower in the self-refreshing operation than in the normal operation by the first and second voltage control circuits.

Different internal power supply voltages can be supplied to the memory cell array and the peripheral circuit. Therefore, especially in the self-refreshing operation, the memory cell array and the peripheral circuit can be operated based on respective optimal power supply voltages.

A semiconductor memory device according to a further aspect of the present invention which carries out a normal operation and a self-refreshing operation based on an internal power supply voltage and a boosted voltage obtained by boosting the internal power supply voltage includes a self-refresh period defining circuit and a boosted voltage generating circuit. The boosted voltage generating circuit includes a reference power supply node, a boosted voltage output node, a ring oscillating circuit, a pumping circuit, a cut-off circuit, and an N channel transistor.

The self-refresh period defining circuit generates a self-refresh period definition signal defining a period in which the self-refreshing operation is carried out. The boosted voltage generating circuit generates the boosted voltage obtained by boosting the internal power supply voltage.

The reference power supply node receives a predetermined reference power supply voltage. The boosted voltage output node provides the generated boosted voltage.

The ring oscillating circuit oscillates a pulse signal in the normal operation, and stops oscillation of the pulse signal in the self-refreshing operation, in response to the self-refresh period definition signal. The pumping circuit supplies the boosted voltage to the boosted voltage output node in response to the pulse signal.

In response to the self-refresh period definition signal, the cut-off circuit cuts off supply of the boosted voltage from the pumping circuit to the boosted voltage output node in the self-refreshing operation.

The N channel transistor is provided between the reference power supply node and the boosted voltage output node. In response to the self-refresh period definition signal, the N channel transistor is rendered conductive in the self-refreshing operation. The N channel transistor supplies to the boosted voltage output node the boosted voltage lower than the reference power supply voltage by a threshold voltage.

As described above, at the time of self-refreshing, the ring oscillating circuit is halted, and supply of the boosted voltage from the pumping circuit to the boosted voltage output node is cut off in the boosted voltage generating circuit. At the same time, the boosted voltage lower than the reference power supply voltage by the threshold voltage is supplied to the boosted voltage output node through the N channel transistor.

As described above, the operation of the ring oscillating circuit is halted in the self-refreshing operation. Accordingly, the operation of the pumping circuit is also halted, resulting in supply of the boosted voltage through another supply path. Therefore, current consumption at the time of self-refreshing can be reduced.

A semiconductor memory device according to a further aspect of the present invention which carries out a normal operation and a self-refreshing operation based on an internal power supply voltage and a boosted voltage obtained by boosting the internal power supply voltage includes a self-refresh period defining circuit and a boosted voltage generating circuit. The boosted voltage generating circuit includes a power supply node, a boosted voltage output node, a ring oscillating circuit, a pumping circuit, a cut-off circuit, and an external power supply voltage supplying circuit.

The self-refresh period defining circuit generates a self-refresh period definition signal defining a period in which the self-refreshing operation is carried out. The boosted voltage generating circuit generates the boosted voltage obtained by boosting the internal power supply voltage. The power supply node receives an external power supply voltage. The boosted voltage output node provides the generated boosted voltage. In response to the self-refresh period definition signal, the ring oscillating circuit oscillates a pulse signal in the normal operation, and stops oscillation of the pulse signal in the self-refreshing operation. The pumping circuit supplies the boosted voltage to the boosted voltage output node in response to the pulse signal.

In response to the self-refresh period definition signal, the cut-off circuit cuts off supply of the boosted voltage from the pumping circuit to the boosted voltage output node in the self-refreshing operation. The external power supply voltage supplying circuit receives the external power supply voltage, and, in response to the self-refresh period definition signal, supplies the external power supply voltage to the boosted voltage output node in the self-refreshing operation.

At the time of self-refreshing, the ring oscillating circuit is halted, and supply of the boosted voltage from the pumping circuit to the boosted voltage output node is cut off in the boosted voltage generating circuit. At the same time, the external power supply voltage is supplied from the external power supply voltage supplying circuit to the boosted voltage output node as the boosted voltage.

As described above, the operation of the ring oscillating circuit is halted in the self-refreshing operation. Accordingly, the operation of the pumping circuit is also halted, resulting in supply of the boosted voltage through another supply path. Therefore, current consumption in the self-refreshing operation can be reduced.

Further, since the boosted voltage attains a level of the external power supply voltage, the semiconductor memory device can be used not only when the self-refreshing operation is carried out based on a lower internal power supply voltage than in the normal operation, but also when the self-refreshing operation is carried out based on the same internal power supply voltage as in the normal operation.

A semiconductor memory device according to a further aspect of the present invention which carries out a normal operation and a self-refreshing operation based on an internal power supply voltage includes a CMOS circuit, an analog circuit, a first internal power supply voltage supplying circuit, and a second internal power supply voltage supplying circuit.

The CMOS circuit and the analog circuit operate as a peripheral circuit.

The first internal power supply voltage supplying circuit, provided corresponding to the CMOS circuit, supplies a first internal power supply voltage lower in the self-refreshing operation than in the normal operation.

The second internal power supply voltage supplying circuit, provided corresponding to the analog circuit, supplies a second internal power supply voltage lower in the self-refreshing operation than in the normal operation.

As described above, the CMOS circuit and the analog circuit are supplied with the first and second internal power supply voltages from the corresponding first and second internal power supply voltage supplying circuits, respectively. The first and second internal power supply voltages are made lower in the self-refreshing operation than in the normal operation. As a result, current consumption in the self-refreshing operation can be reduced.

Further, since the internal power supply voltages are supplied from different supply sources, the first and second internal power supply voltages in the self-refreshing operation can be made optimal for stable operation of the CMOS circuit and the analog circuit. As a result, the CMOS circuit and the analog circuit can be operated stably.

A semiconductor memory device according to a further aspect of the present invention which carries out a normal operation and a self-refreshing operation based on a potential swing having a swing width defined by a potential difference between a first internal power supply potential and a second internal power supply potential lower than the first internal power supply potential includes a first internal power supply potential generating circuit and a second internal power supply potential generating circuit. The first internal power supply potential generating circuit includes a first potential control circuit, and the second internal power supply potential generating circuit includes a second potential control circuit.

The first internal power supply potential generating circuit generates a first internal power supply potential. The second internal power supply potential generating circuit generates a second internal power supply potential.

The first potential control circuit controls the level of the first internal power supply potential to be lower in the self-refreshing operation than in the normal operation by a predetermined width.

The second potential control circuit controls the level of the second internal power supply potential to be higher in the self-refreshing operation than in the normal operation by the same width as the change width of the level of the potential by the first potential control circuit.

The potential swing is controlled to have the same or approximately the same center value in the normal operation and in the self-refreshing operation.

As described above, in the self-refreshing operation, the first internal power supply potential generated by the first internal power supply potential generating circuit and the second internal power supply potential generated by the second internal power supply potential generating circuit change, respectively.

The level of the first internal power supply potential is made lower by the first potential control circuit in the self-refreshing operation than in the normal operation by a predetermined width. The level of the second internal power supply potential is made higher by the second potential control circuit in the self-refreshing operation than in the normal operation by the same width as that of the change width of the level of the first internal power supply potential.

Therefore, the difference between the internal power supply potentials in the self-refreshing operation is made smaller than the potential difference in the normal operation. Therefore, current consumption in the self-refreshing operation is reduced. Further, in this case, the change of the first internal power supply potential and the change of the second internal power supply potential are equal in width and opposite in the direction. Therefore, a value of ½ level of the internal power supply potential difference which is the center value of the potential swing in the self-refreshing operation can be made unchanged with respect to that in the normal operation.

The value of ½ level of the internal power supply potential difference is a reference potential for writing and reading of data. However, the value does not change even if the internal power supply potential difference is changed. Therefore, the semiconductor memory device is not affected at all by bump when the internal power supply potential difference is changed.

A semiconductor memory device according to a further aspect of the present invention which carries out a normal operation and a self-refreshing operation based on a potential swing having a swing width defined by an internal power supply potential difference includes an internal power supply potential difference generating circuit, a first refresh cycle setting circuit, and a second refresh cycle setting circuit.

The internal power supply potential difference generating circuit generates the internal power supply potential difference. The internal power supply potential difference generating circuit decreases the internal power supply potential difference more in the self-refreshing operation than in the normal operation so that the potential swing width is made smaller in at least a predetermined period in the self-refreshing operation than in the normal operation. After holding the internal power supply potential difference at a constant value, the internal power supply potential difference generating circuit increases the internal power supply potential difference in the self-refreshing operation to that in the normal operation.

The first refresh cycle setting circuit sets a standard refresh cycle in the self-refreshing operation.

The second refresh cycle setting circuit sets a refresh cycle in the self-refreshing operation before the internal power supply potential difference is decreased by the internal power supply potential difference generating circuit to a cycle shorter than the standard refresh cycle.

As described above, the internal power supply potential difference generated by the internal power supply potential difference generating circuit is made smaller at least in a predetermined period in the self-refreshing operation than in the normal operation. Therefore, current consumption in the self-refreshing operation can be reduced.

Refreshing in the self-refreshing operation is basically carried out in the standard refresh cycle set by the first refresh cycle setting circuit. Exceptionally, refreshing before the internal power supply potential difference is decreased is carried out in a cycle shorter than the standard refresh cycle. The shorter refresh cycle is set by the second refresh cycle setting circuit.

Therefore, a memory cell in a severe state in which stored electric charge has been reduced before the beginning of the self-refreshing operation has sufficient electric charge stored therein. Therefore, a refresh ability can be initialized at this time. As a result, the semiconductor memory device is less likely to be affected by bump caused by decrease of the internal power supply potential difference, whereby the operation can be stabilized.

In addition, since refreshing is carried out in a shorter cycle at the beginning of the self-refreshing operation, the memory cell is in a state in which sufficient electric charge is stored. Therefore, the condition regarding a refresh ability required at the beginning of refreshing can be met without external complicated control.

A semiconductor memory device according to a further aspect of the present invention which carries out a normal operation and a self-refreshing operation based on a potential swing having a swing width defined by an internal power supply potential difference includes an internal power supply potential difference generating circuit, a first refresh cycle setting circuit, and a second refresh cycle setting circuit.

The internal power supply potential difference generating circuit generates the internal power supply potential difference. The internal power supply potential difference generating circuit decreases the internal power supply potential difference more in the self-refreshing operation than in the normal operation so that the potential swing width is made smaller in at least a predetermined period in the self-refreshing operation than in the normal operation. After holding the internal power supply potential difference at a constant value, the internal power supply potential difference generating circuit increases the internal power supply potential difference in the self-refreshing operation to that in the normal operation.

The first refresh cycle setting circuit sets a standard refresh cycle in the self-refreshing operation.

The second refresh cycle setting circuit sets a refresh cycle in a predetermined period in the self-refreshing operation before the internal power supply potential difference is increased by the internal power supply potential difference generating circuit to a cycle shorter than the standard refresh cycle.

In the semiconductor memory device according to this aspect, the internal power supply potential difference generated by the internal power supply potential difference generating circuit is made smaller at least in a predetermined period in the self-refreshing operation than in the normal operation. Therefore, current consumption in the self-refreshing operation can be reduced.

Further, refreshing in the self-refreshing operation is basically carried out in the standard refresh cycle set by the first refresh cycle setting circuit. Exceptionally, the refreshing in a predetermined period before increase of the internal power supply potential difference is carried out in a cycle shorter than the standard refresh cycle. The shorter refresh cycle is set by the second refresh cycle setting circuit.

Therefore, a memory cell in which stored electric charge is reduced before increase of the internal power supply potential difference is brought to a state where sufficient electric charge is stored.

As a result, the semiconductor memory device is less likely to be affected by bump caused by increase in the internal power supply potential difference, and as a result, the operation of the semiconductor memory device can be stabilized.

A semiconductor memory device according to a further aspect of the present invention which carries out a normal operation and a self-refreshing operation based on a potential swing having a swing width defined by an internal power supply potential difference includes an internal power supply potential difference generating circuit, a first refresh cycle setting circuit, and a second refresh cycle setting circuit.

The internal power supply potential difference generating circuit generates the internal power supply potential difference. The internal power supply potential difference generating circuit decreases the internal power supply potential difference more in the self-refreshing operation than in the normal operation so that the potential swing width is made smaller in at least a predetermined period in the self-refreshing operation than in the normal operation. After holding the internal power supply potential difference at a constant value, the internal power supply potential difference generating circuit increases the internal power supply potential difference in the self-refreshing operation to that in the normal operation.

The first refresh cycle setting circuit sets a standard refresh cycle in the self-refreshing operation.

The second refresh cycle setting circuit sets a refresh cycle in the self-refreshing operation after increase of the internal power supply potential difference by the internal power supply potential difference generating circuit to a cycle shorter than the standard refresh cycle.

As described above, the internal power supply potential difference generated by the internal power supply potential difference generating circuit is made smaller in at least a predetermined period in the self-refreshing operation than in the normal operation. Therefore, current consumption in the self-refreshing operation can be reduced.

Refreshing in the self-refreshing operation is basically carried out in the standard refresh cycle set by the first refresh cycle setting circuit. Exceptionally, the refreshing after increase of the internal power supply potential difference is carried out in a cycle shorter than the standard refresh cycle. The shorter refresh cycle is set by the second refresh cycle setting circuit.

Therefore, a memory cell in a severe state in which stored electric charge has been reduced before completion of increase of the internal power supply potential difference is brought to a state where sufficient electric charge is stored. Therefore, at this time, a refresh ability can be initialized. Therefore, the condition regarding the refresh ability required before transition from the refreshing operation to the normal operation can be satisfied without external complicated control.

A semiconductor memory device according to a further aspect of the present invention which carries out a normal operation and a self-refreshing operation based on a potential swing having a swing width defined by an internal power supply potential difference includes a first refresh cycle setting circuit and a second refresh cycle setting circuit.

The first refresh cycle setting circuit sets a standard refresh cycle in the self-refreshing operation.

The second refresh cycle setting circuit sets a refresh cycle in a predetermined period at the beginning of the self-refreshing operation to a cycle shorter than the standard refresh cycle.

As described above, refreshing in the self-refreshing operation is basically carried out in the standard refresh cycle set by the first refresh cycle setting circuit. Exceptionally, in a predetermined period at the beginning of the self-refreshing operation, refreshing is carried out in a refresh cycle shorter than the standard refresh cycle set by the second refresh cycle setting circuit.

Therefore, at the beginning of the self-refreshing operation, a state in which sufficient electric charge is stored in a memory cell can be implemented. As a result, a refresh ability can be initialized at this time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a timing chart showing operation timings of the circuit of FIG. 9 in the self-refreshing operation.

FIG. 23 is a block diagram of a circuit which provides to the outside world a signal indicating a return state of an internal power supply voltage after completion of self-refreshing according to a twelfth embodiment.

FIG. 24 is a timing chart showing operation timings of the circuit of FIG. 23.

FIG. 25 is a block diagram of a circuit which provides to the outside world a signal indicating a return state of an internal power supply voltage after completion of self-refreshing according to a thirteenth embodiment.

FIG. 26 is a timing chart showing operation timings of the circuit of FIG. 25.

DESCRIPTION OF THE PREFERRED EMBODIMENTS

Embodiments of the present invention will now be described in detail with reference to the drawings.

First Embodiment

The first embodiment will be described.

In the following description, a normal operation refers to operation excluding a self-refreshing operation. The normal operation includes a writing operation and a reading operation.

Figure 1:
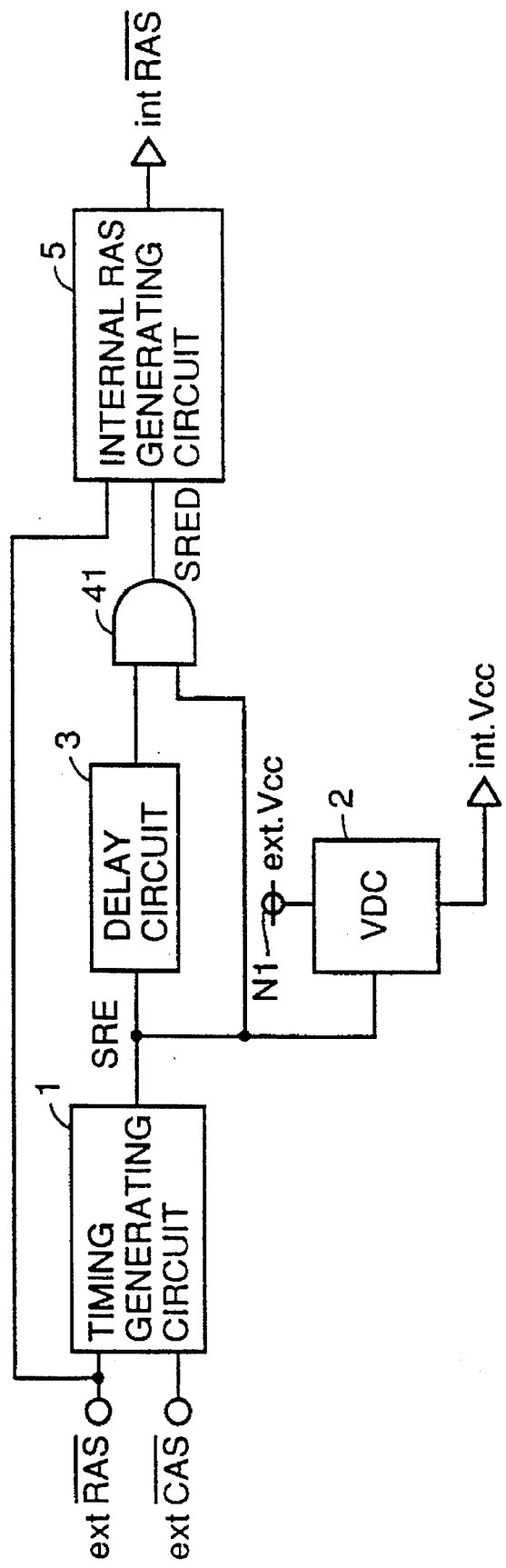
FIG. 1 is a block diagram showing a circuit portion regarding self-refreshing of a DRAM according to a first embodiment.

FIG. 1 is a block diagram of a circuit portion regarding self-refreshing of a DRAM according to the first embodiment. Referring to FIG. 1, this circuit includes a timing generating circuit 1, an internal voltage down-converting circuit 2, a delay circuit 3, an AND gate 41, and an internal RAS generating circuit 5.

Timing generating circuit 1 receives an external row address strobe signal extRAS and an external column address strobe signal extCAS, and generates a self-refresh enable signal SRE in response to these signals.

Internal voltage down-converting circuit (VDC) 2 receives an external power supply voltage extVcc from an external power supply node N1 as power supply voltage, and the signal SRE as a control signal. Internal voltage down-converting circuit 2 generates an internal power supply voltage intVcc obtained by down-converting the external power supply voltage extVcc. Internal voltage down-converting circuit 2 controls the level of the internal power supply voltage intVcc in response to the signal SRE.

AND gate 41 receives the signal SRE and a signal obtained by delaying the signal SRE by delay circuit 3, and provides a signal SRED in response to these signals.

Internal RAS generating circuit 5 receives the signal extRAS and the signal SRED, and generates an internal row address strobe signal intRAS in response to these signals. The signal intRAS is a signal defining a self-refresh cycle.

Internal RAS generating circuit 5 of FIG. 1 will now be described in detail.

Figure 2:
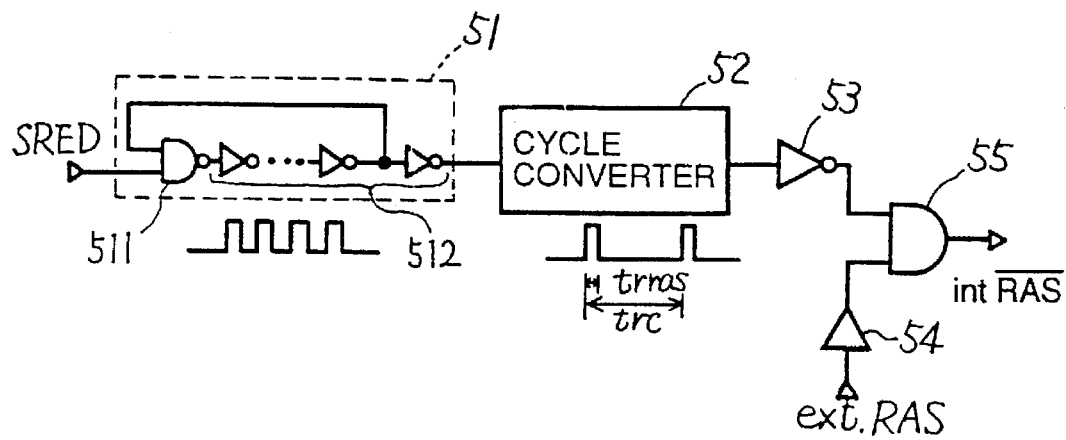
FIG. 2 is a circuit diagram showing a configuration of an internal RAS generating circuit according to the first embodiment.

FIG. 2 is a circuit diagram showing a configuration of internal RAS generating circuit 5 according to the first embodiment. Referring to FIG. 2, internal RAS generating circuit 5 includes a ring oscillator 51, a cycle converter 52, an inverter 53, a buffer 54, and an AND gate 55.

Ring oscillator 51 includes an NAND gate 511 and an inverter group 512 formed of a plurality of series-connected inverters. NAND gate 511 and inverter group 512 are connected in a circular manner. NAND gate 511 receives a signal fed back from one of nodes of inverter group 512, and the signal SRED.

Ring oscillator 51 generates a pulse signal having a predetermined cycle using the signal SRED as a trigger signal. Cycle converter 52 skips pulse signals provided from ring oscillator 51, and generates a pulse signal having a longer cycle than the input pulse signal.

A pulse width trras of the pulse signal generated by cycle converter 52 defines an active period of the self-refreshing operation. Therefore, the pulse width trras of the pulse signal is set to have a sufficient operation margin even in an operating state based on low power supply voltage.

AND gate 55 receives a signal obtained by inverting the pulse signal provided from cycle converter 52 by inverter 53, and a signal obtained by the signal extRAS passing through buffer 54. AND gate 55 provides the signal intRAS in response to these signals. More specifically, the internal row address strobe signal intRAS is formed into a pulse signal having a predetermined cycle in a state where the signal SRED is at an H or logic high level, and the signal extRAS is at the H level.

Internal voltage down-converting circuit 2 of FIG. 1 will now be described in detail.

Figure 3:
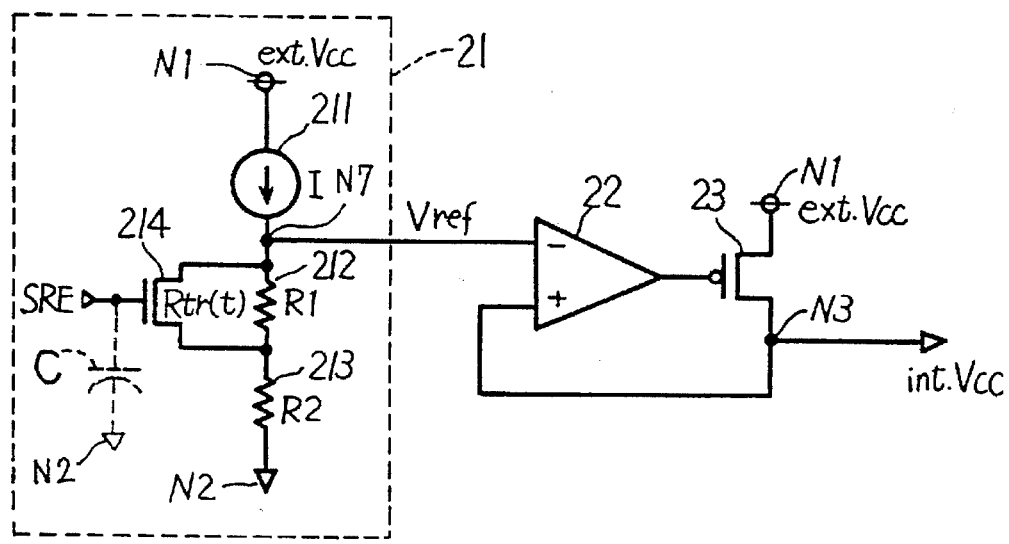
FIG. 3 is a circuit diagram showing a configuration of an internal voltage down-converting circuit according to the first embodiment.

FIG. 3 is a circuit diagram showing a configuration of internal voltage down-converting circuit 2 according to the first embodiment. Referring to FIG. 3, internal voltage down-converting circuit 2 includes a reference voltage generating circuit 21, a differential amplifier circuit 22, and a PMOS transistor 23.

Reference voltage generating circuit 21 includes a constant current source 211, a resistor 212, a resistor 213, and an NMOS transistor 214. Constant current source 211 is connected between external power supply node N1 and an output node N7. Resistors 212 and 213 are connected in series between output node N7 and a ground node N2 receiving ground potential. Transistor 214 is connected between output node N7 and a node between resistors 212 and 213. Transistor 214 operates in receipt of the signal SRE at its gate.

Reference voltage generating circuit 21 operates as follows, and generates a reference voltage Vref.

Constant current source 211 generates a constant current i. Therefore, a current from constant current source 211 flows through resistors 212 and 213, and transistor 214. Based on such a current, a resistance value R1 of resistor 212, a resistance value R2 of resistor 213, and a resistance value Rtr(t) of transistor 214, the reference voltage Vref which is a voltage at output node N7 is generated. The reference voltage Vref is given by the following expression (1):

$$Vref=I\times\{R1/[1+R1/Rtr(t)+R2]\} \quad (1)$$

Based on the above expression (1), description will now be given of the reference voltage Vref in the cases where transistor 214 is turned on and off, respectively.

The reference voltage Vref when transistor 214 is completely turned on is given by the following expression (2), wherein Rtr is the on resistance of transistor 214 in this case:

$$Vref=I\times(R1/(1+R1/Rtr)+R2) \quad (2)$$

The reference voltage Vref when transistor 214 is turned off takes a value given by the following expression (3):

$$Vref=I\times(R1+R2) \quad (3)$$

As described above, the reference voltage Vref generated by reference voltage generating circuit 21 is set lower in the self-refreshing operation in which the signal SRE attains the H level than in the normal operation in which the signal SRE attains an L or logic low level.

Transistor 23 is connected between external power supply node N1 and an output node N3 serving as an internal power supply voltage output node. Differential amplifying circuit 22 receives the reference voltage Vref from reference voltage generating circuit 21 at its negative side input terminal, and the internal power supply voltage intVcc provided from output node N3 at its positive side input terminal.

Differential amplifying circuit 22 differentially amplifies these voltages, and applies the output voltage to the gate of transistor 23. The conductive state of transistor 23 is controlled in response to the voltage which it receives at its gate. Due to change of the conductive state, the internal power supply voltage intVcc is controlled to be the same as the reference voltage Vref.

Description will now be given of operation of the circuit of FIG. 1.

Figure 4:
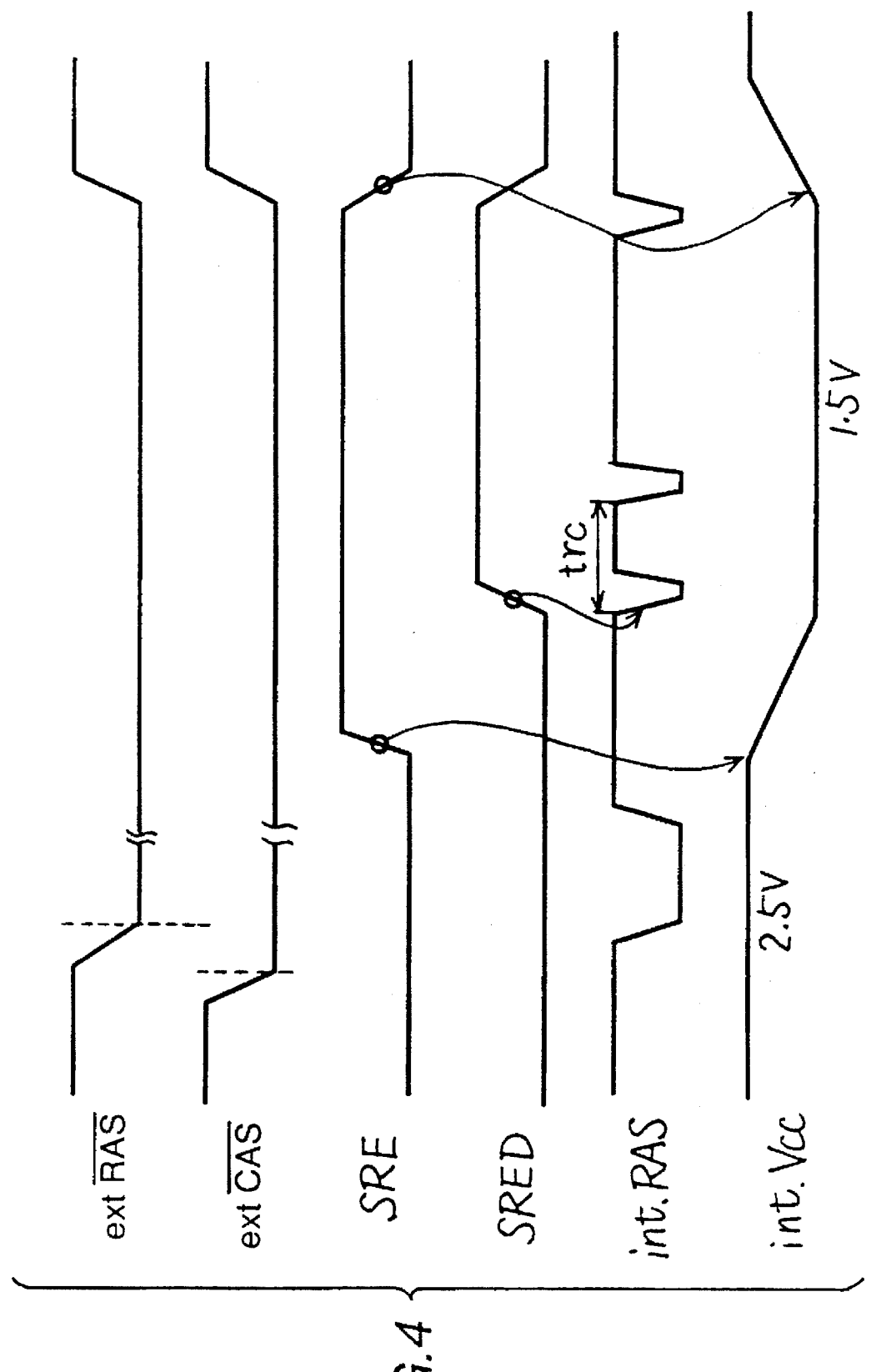
FIG. 4 is a timing chart showing operation timings of the circuit of FIG. 1 in a self-refreshing operation.

FIG. 4 is a timing chart showing operation timings of the circuit of FIG. 1 in the self-refreshing operation. Referring to FIG. 4, when a state after the CBR timing is held for a predetermined period, the signal SRE is pulled up to the H level by timing generating circuit 1. In response to this, internal voltage down-converting circuit 2 pulls down the internal power supply voltage intVcc from, for example, 2.5 V to 1.5 V.

Then, delayed from the rising of the signal SRE, the output signal of delay circuit 3 attains the H level, causing the signal SRED to rise to the H level. In response to the rising, the signal intRAS provided from internal RAS generating circuit 5 attains a pulse signal state having a predetermined refresh cycle trc, whereby the self-refreshing operation is initiated.

The self-refreshing operation is carried out based on the internal power supply voltage intVcc of, for example, 1.5 V. Therefore, the voltage swing width in this case is 1.5 V which is smaller than 2.5 V in the normal operation.

Then, the signal extRAS rises to the H level. In response to the rising, the signal SRE falls to the L level. This triggers termination of the self-refreshing operation.

In response to the falling of the signal SRE, internal voltage down-converting circuit 2 increases the internal power supply voltage intVcc from, for example, 1.5 V to 2.5 V. In response to the falling of the signal SRE, the signal SRED falls to the L level. In response to the falling, the signal intRAS provided from internal RAS generating circuit 5 stops generation of a pulse, whereby the self-refreshing operation is terminated.

As described above, in the circuit of FIG. 1, the level of the internal power supply voltage intVcc in the self-refreshing operation is controlled to be lower than the level of the internal power supply voltage intVcc in the normal operation. As a result, current consumption in the self-refreshing operation can be reduced.

More specifically, under the condition that the internal power supply voltage intVcc is decreased from 2.5 V in the normal operation to 1.5 V in the self-refreshing operation, current consumption in an active period in the self-refreshing operation is reduced to 1.5/2.5.

As described above, a low internal power supply voltage causes an access speed to decrease. However, since a minimum access speed is enough in the self-refreshing operation, decrease in the access speed is not a big problem. Therefore, it is only necessary that the internal power supply voltage intVcc in the self-refreshing operation is such a voltage as can secure a sufficient margin for the self-refreshing operation.

As described above, in the first embodiment, current consumption in the self-refreshing operation can be reduced by simple control in an internal circuit.

It should be noted that a following circuit may be used as internal voltage down-converting circuit 2 alternatively. Referring to FIG. 3, in the internal voltage down-converting circuit, a capacitor C having a polarity may be provided between the gate of transistor 214 and ground node N2. The capacitor C is an MOS capacitor, for example.

By provision of such capacitor C, it is possible to make different a speed at which the signal SRE which transistor 214 receives at its gate changes from the L level to the H level and a speed at which the signal SRE changes from the H level to the L level because of the capacitance of the capacitor C.

Therefore, it is possible to make different a length of a period in which the internal power supply voltage intVcc is decreased and a length of a period in which the internal power supply voltage intVcc is increased. Preferably, the period in which the internal power supply voltage intVcc is increased is set longer than the period in which the internal power supply voltage intVcc is decreased.

By thus structured, it is possible to increase the internal power supply voltage intVcc slowly in an increase period of the internal power supply voltage, during which the semiconductor memory device is likely to be affected by bump. Therefore, the semiconductor memory device is less likely affected by bump, and the operation of the semiconductor memory device can be stabilized.

Second Embodiment

The second embodiment will now be described. In the second embodiment, as another example in which current consumption in the self-refreshing operation is reduced, the case will be described where ground potential of a memory cell array is controlled to be higher than external ground potential extGND in the self-refreshing operation.

Figure 5:
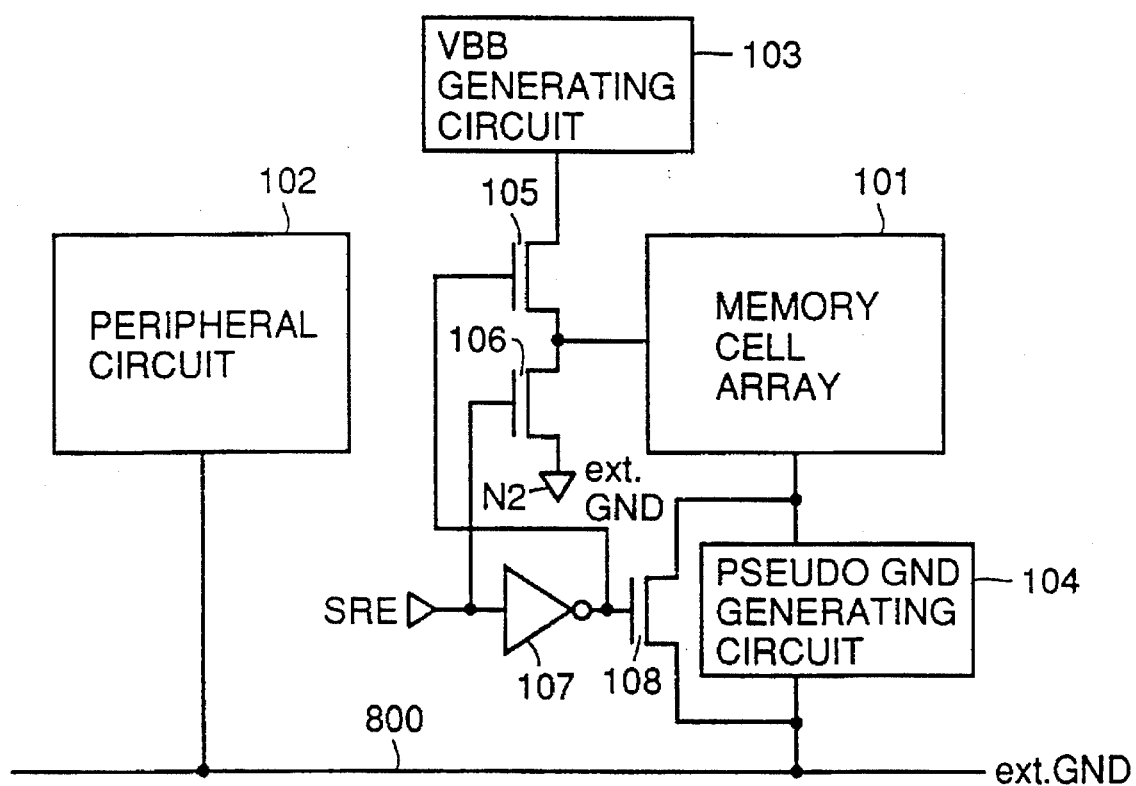
FIG. 5 is a block diagram showing a circuit portion regarding self-refreshing of a DRAM according to a second embodiment.

FIG. 5 is a block diagram of a circuit portion regarding self-refreshing of a DRAM according to the second embodiment. Referring to FIG. 5, the DRAM includes a memory cell array 101, a peripheral circuit 102, a VBB generating circuit 103, a pseudo GND generating circuit 104, NMOS transistors 105, 106, 108, and an inverter 107.

A ground line 800 receives the external ground potential extGND. Peripheral circuit 102 is connected to ground line 800. Memory cell array 101 is connected to ground line 800 through pseudo GND generating circuit 104 and transistor 108, respectively. In other words, pseudo GND generating circuit 104 and transistor 108 are connected in parallel between memory cell array 101 and ground line 800.

VBB generating circuit 103 generates a substrate potential VBB. Transistors 105 and 106 are connected in series between VBB generating circuit 103 and external ground node N2 receiving the external ground potential extGND. The substrate potential is applied to memory cell array 101 from a node between transistors 105 and 106.

Inverter 107 receives the signal SRE as shown in FIG. 1, and inverts the signal to apply the inverted signal to the gates of transistors 105 and 108. The signal SRE is applied to the gate of transistor 106.

Pseudo GND generating circuit 104 generates a pseudo GND potential. The pseudo GND potential here refers to ground potential at a level between the precharge level of a bit line in memory cell array 101 and the level of the external ground potential extGND.

Specifically, such a pseudo GND potential is generated in pseudo GND generating circuit 104 as follows, for example. Pseudo GND generating circuit 104 includes a pseudo GND line connected to memory cell array 101, and an NMOS transistor connected between the pseudo GND line and ground line 800. Pseudo GND generating circuit 104 generates the pseudo GND potential which is higher than the external ground potential extGND which is a potential of ground line 800 by a threshold voltage of the NMOS transistor, and applies the potential to the pseudo GND line.

Description will now be given of operation of the circuit of FIG. 5.

In the normal operation, the signal SRE is at the L level. In this case, both transistors 105 and 108 are turned on, and transistor 106 is turned off. Therefore, the substrate potential generated by VBB generating circuit 103 is applied to memory cell array 101 through transistor 105. At the same time, the external ground potential extGND is applied to memory cell array 101 through transistor 108.

In the self-refreshing operation, the signal SRE attains the H level. In this case, transistor 106 is turned on, and both transistors 105 and 108 are turned off. Therefore, supply of the substrate potential to memory cell array 101 is stopped. At the same time, the pseudo GND potential from pseudo GND generating circuit 104 is supplied to memory cell array 101 as ground potential.

In such a self-refreshing operation, since the ground potential of memory cell array 101 attains the pseudo GND potential higher than the external ground potential extGND, a voltage swing width of a memory cell is reduced. Therefore, current consumption in the self-refreshing operation is reduced.

Further, since supply of the substrate potential to memory cell array 101 is stopped in the self-refreshing operation, current consumption of VBB generating circuit 103 is reduced. Therefore, current consumption in the self-refreshing operation is further reduced.

The ground potential of the memory cell array is set to a potential higher than the external ground potential extGND. As a result, a leakage current is reduced, and therefore, it is not necessary to supply the substrate potential to the memory cell array. This is the reason why supply of the substrate potential to memory cell array 101 is stopped in the self-refreshing operation.

In the first embodiment, the internal power supply voltage was decreased in the self-refreshing operation. In the second embodiment, the ground potential was increased in the self-refreshing operation. However, the internal power supply voltage may be decreased, and the ground potential may be increased in the self-refreshing operation.

Third Embodiment

Figure 6:
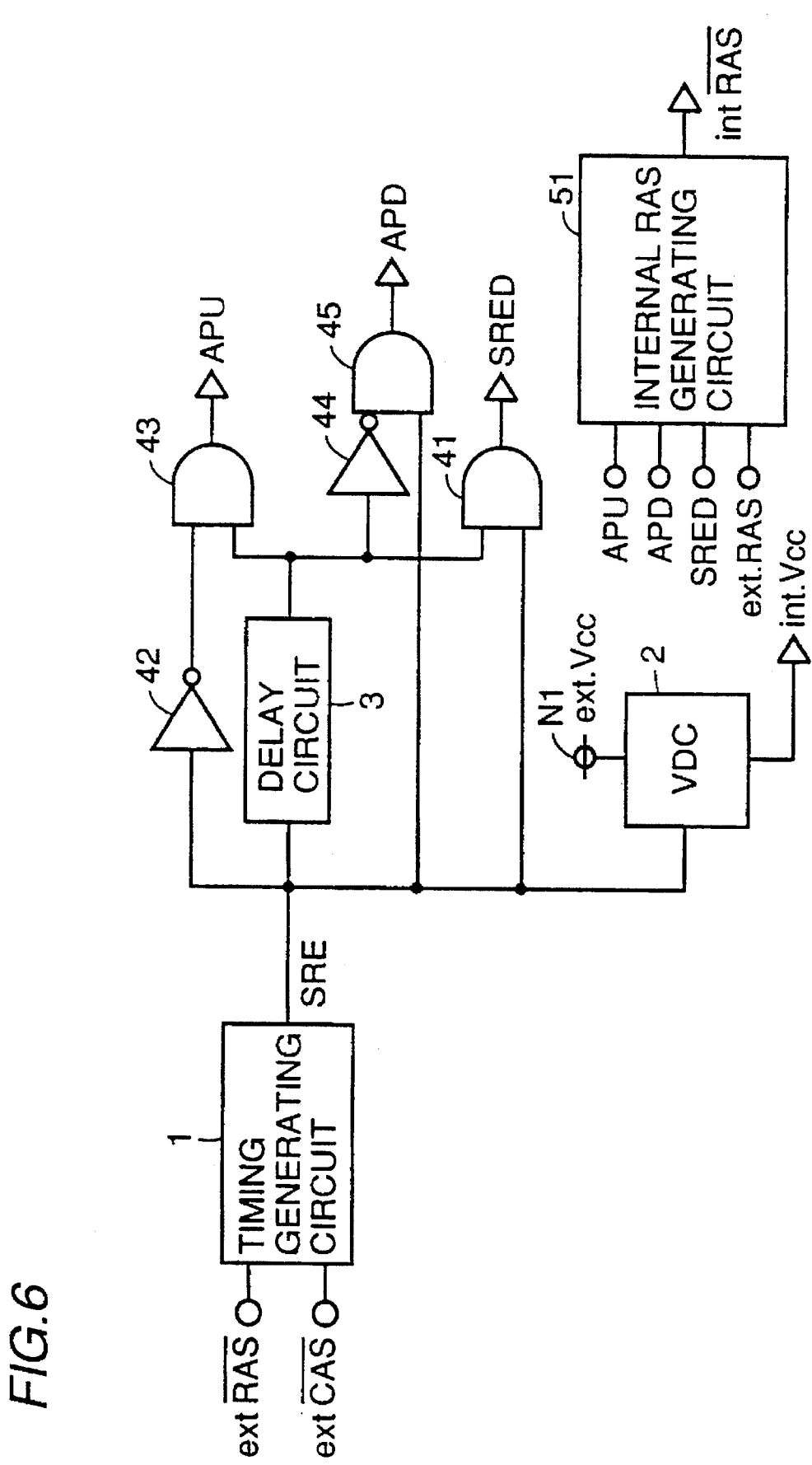
FIG. 6 is a block diagram showing a circuit portion regarding self-refreshing of a DRAM according to a third embodiment.

The third embodiment will now be described. FIG. 6 is a block diagram of a circuit portion regarding self-refreshing of a DRAM according to the third embodiment.

The circuit of FIG. 6 is different from the circuit of FIG. 1 in the following points. An inverter 44 and an AND gate 45 for generating an internal power supply voltage down activation signal APD defining a period in which the internal power supply voltage is decreased at the beginning of the self-refreshing operation are added to the circuit of FIG. 1.

An inverter 42 and an AND gate 43 for generating an internal power supply voltage up activation signal APU defining a period in which the internal power supply voltage is increased at the end of the self-refreshing operation are further added to the circuit of FIG. 1. In addition, the configuration of an internal RAS generating circuit 51 is different from that of internal RAS generating circuit 5 of FIG. 1.

AND gate 43 receives a signal obtained by inversion of the signal SRE by inverter 42, and the output signal of delay circuit 3, and generates the signal APU in response to these signals. AND gate 45 receives a signal obtained by inversion of the output signal of delay circuit 3 by inverter 44, and the signal SRE, and generates the signal APD in response to these signals.

Internal RAS generating circuit 51 receives the signals APU, APD, SRED, and extRAS, and, in response to these signals, generates the signal intRAS at frequencies corresponding to the decrease period, the hold period, and the increase period of the internal power supply voltage intVcc, respectively.

Operation of internal RAS generating circuit 51 will now be described in detail.

Figure 7:
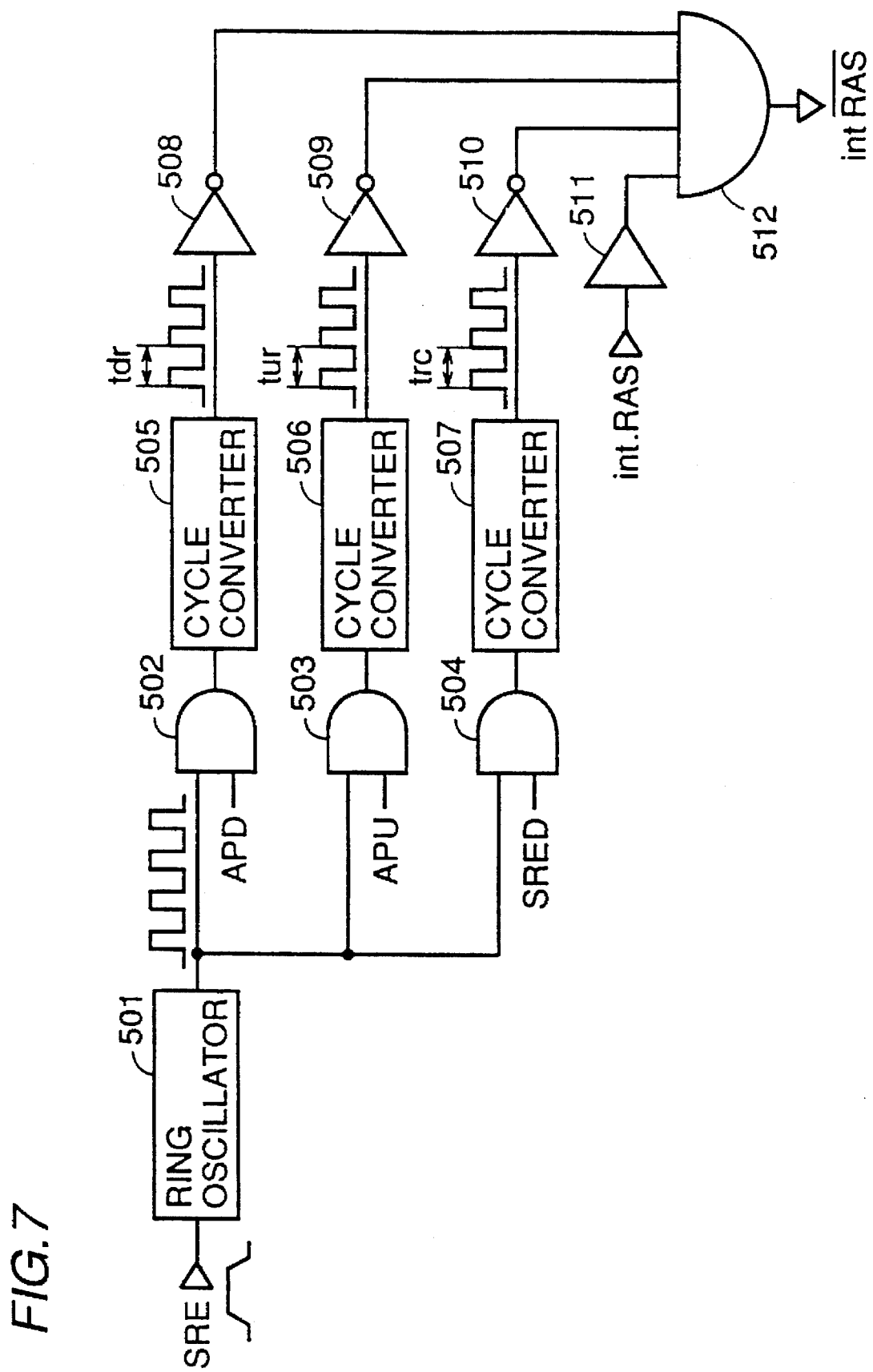
FIG. 7 is a block diagram showing a configuration of an internal RAS generating circuit according to the third embodiment.

FIG. 7 is a block diagram showing the configuration of internal RAS generating circuit 51. Referring to FIG. 7, internal RAS generating circuit 51 includes a ring oscillator 501, AND gates 502, 503, 504, cycle converters 505, 506, 507, inverters 508, 509, 510, a buffer 511, and a four-input AND gate 512.

Ring oscillator 501 receives the signal SRE, and generates a pulse signal having a predetermined cycle in response to the signal. AND gate 502 receives the signal APU and the pulse signal from ring oscillator 501, and generates an output signal in response to these signals. AND gate 503 receives the signal APD and the pulse signal from ring oscillator 501, and generates an output signal in response to these signals. AND gate 504 receives the signal SRED and the pulse signal from ring oscillator 501, and generates an output signal in response to these signals.

Cycle converter 505 receives the pulse signal from AND gate 502, and, in response to the signal, generates a pulse signal having a first cycle tdr. Cycle converter 506 receives the pulse signal from AND gate 503, and, in response to the signal, generates a pulse signal having a second cycle tur. Cycle converter 507 receives the pulse signal from AND gate 504, and, in response to the signal, generates a pulse signal having a third cycle trc.

The pulse signal generated by cycle converter 505 is inverted through inverter 508, and applied to AND gate 512. The pulse signal generated by cycle converter 506 is inverted through inverter 509, and applied to AND gate 512. The pulse signal generated by cycle converter 507 is inverted through inverter 510, and applied to AND gate 512. Further, extRAS which is an inverted signal of the signal ext $\overline{RAS}$ is applied to AND gate 512 through buffer 511.

In response to the four applied signals, AND gate 512 generates the signal int$\overline{RAS}$.

In such internal RAS generating circuit 51, the signal SRE and the signal extRAS both attain the H level when the self-refreshing operation is carried out. Therefore, the pulse signal is generated in ring oscillator 501.

When the signal APD attains the H level in this state, the pulse signal is provided from AND gate 502. Therefore, the pulse signal having the first cycle tdr from cycle converter 505 is inverted by inverter 508, and applied to AND gate 512. In this state, since the signals applied from inverter 509 and inverter 510 to AND gate 512 are both at the H level, the signal int$\overline{RAS}$ provided from AND gate 512 is formed into a pulse signal having the first cycle tdr.

Similarly, when the signal SRED attains the H level in such a state, the int$\overline{RAS}$ provided from AND gate 512 is formed into a pulse signal having the third cycle trc. Similarly, when the signal APU attains the H level in such a state, a pulse signal having the second cycle tur is provided from AND gate 512.

As described above, in internal RAS generating circuit 51, a pulse signal having three kinds of cycles is generated as the signal int$\overline{RAS}$ in response to the signal APD, the signal SRED, and the signal APU, respectively.

The above described first to third cycles are set to be optimal for the decrease period, the hold period, and the increase period of the internal power supply voltage intVcc, respectively. Since the decrease period and the increase period are transition periods of the internal power supply voltage intVcc, the semiconductor memory device is likely to be affected by bump or the like in these periods. Therefore, in order to decrease the influence of bump or the like, the first cycle tdr and the second cycle tur are set to a cycle shorter than the third cycle trc in the hold period.

As a result, the semiconductor memory device is less likely to be affected by bump or the like in the decrease period and the increase period of the internal power supply voltage intVcc in the self-refreshing operation.

Operation of the circuit of FIG. 6 will now be described.

Figure 8:
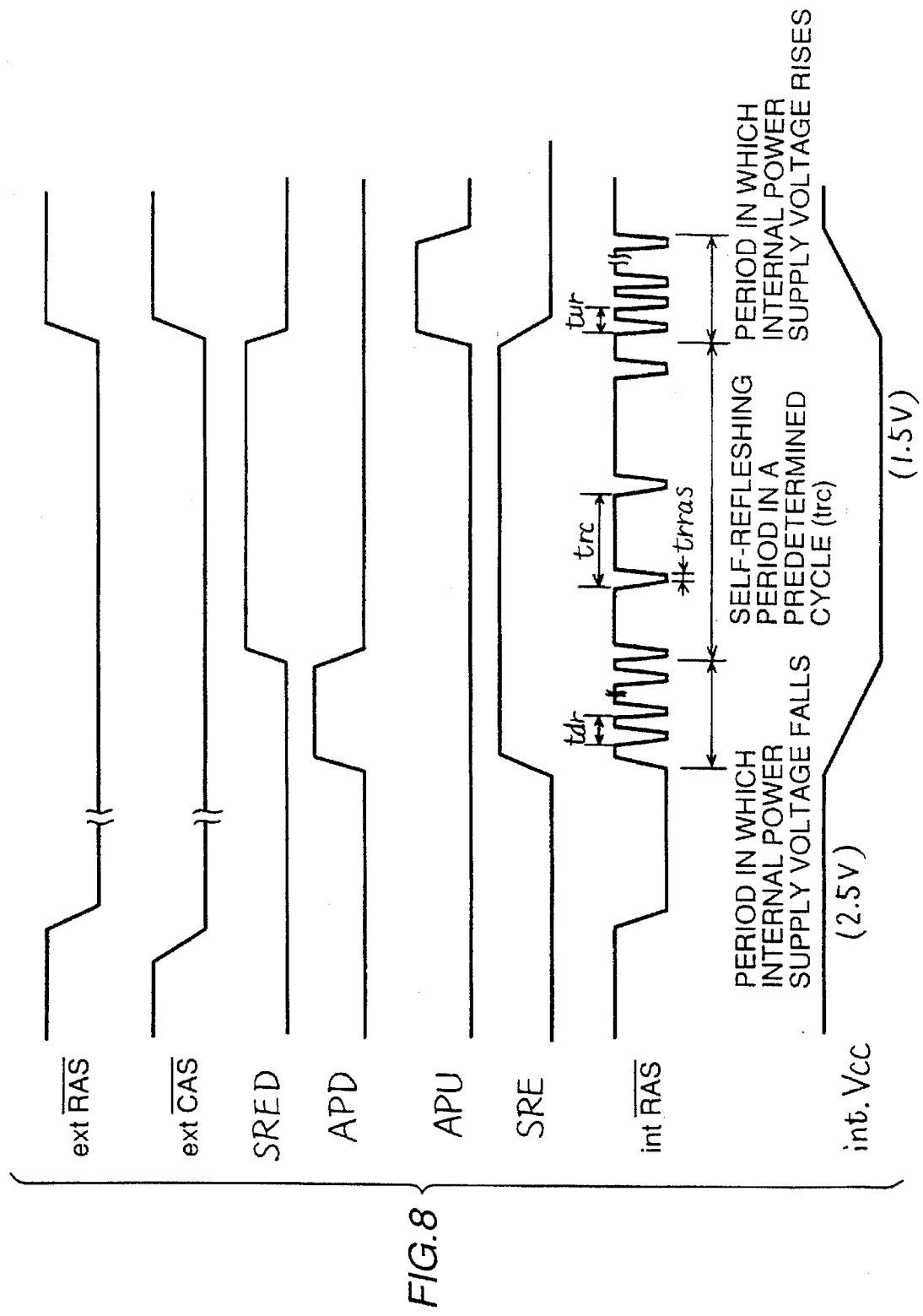
FIG. 8 is a timing chart showing operation timings of the circuit of FIG. 6 in the self-refreshing operation.

FIG. 8 is a timing chart showing operation timings of the circuit of FIG. 6 in the self-refreshing operation. The operation timings of FIG. 8 are different from those of FIG. 4 in respective changes of the signal SRED, the signal APD, the signal APU, and the signal int$\overline{RAS}$.

The internal power supply voltage intVcc changes similar to the case of FIG. 4.

When the signal SRE rises to the H level, the signal APD rises in response to this. The signal APD is held at the H level corresponding to the decrease period of the internal power supply voltage intVcc. As a result, the signal int$\overline{RAS}$ is formed into a pulse signal having the first cycle tdr in a period in which the signal APD is at the H level, that is, in the decrease period of the internal power supply voltage intVcc. Accordingly, the self-refreshing operation is carried out in the first cycle tdr.

After a delay time of the signal in delay circuit 3, the signal APD falls to the L level, and the signal SRED rises to the H level. The signal SRED is held at the H level corresponding to a period in which the internal power supply voltage intVcc is held at a low level. The signal intRAS is formed into a pulse signal having the third cycle trc in a period in which the signal SRED is held at the H level, that is, in the hold period of the internal power supply voltage intVcc. Therefore, in the hold time of the internal power supply voltage intVcc, the self-refreshing operation is carried out in the third cycle trc.

Then, the signal SRE falls to the L level. In response to the falling, the signal SRED falls to the L level, and the signal APU rises to the H level. The signal APU is held at the H level corresponding to the increase period of the internal power supply voltage intVcc. Therefore, the signal intRAS is formed into a pulse signal having the second cycle tur in a period in which the signal APU is held at the H level, that is, in the increase period of the internal power supply voltage intVcc. Therefore, in the increase period of the internal power supply voltage intVcc, the self-refreshing operation is carried out in the second cycle tur.

As described above, in the third embodiment, current consumption in the self-refreshing operation can be reduced by simple control in an internal circuit similar to the case of the first embodiment. In addition, in the third embodiment, since self-refreshing is carried out in an optimum cycle in which the semiconductor memory device is less likely to be affected by bump or the like in the decrease period and in the increase period of the internal power supply voltage inVcc, the self-refreshing operation can be more stabilized than the case of the first embodiment.

In the third embodiment, the voltage swing width was reduced by decreasing the internal power supply voltage intVcc in the self-refreshing operation. However, this embodiment is not limited thereto. In this embodiment, the voltage swing width may be reduced by increasing the ground potential as shown in the second embodiment. Both the decrease control and the increase control may be used.

Fourth Embodiment

The fourth embodiment of the present invention will now be described.

Figure 9:
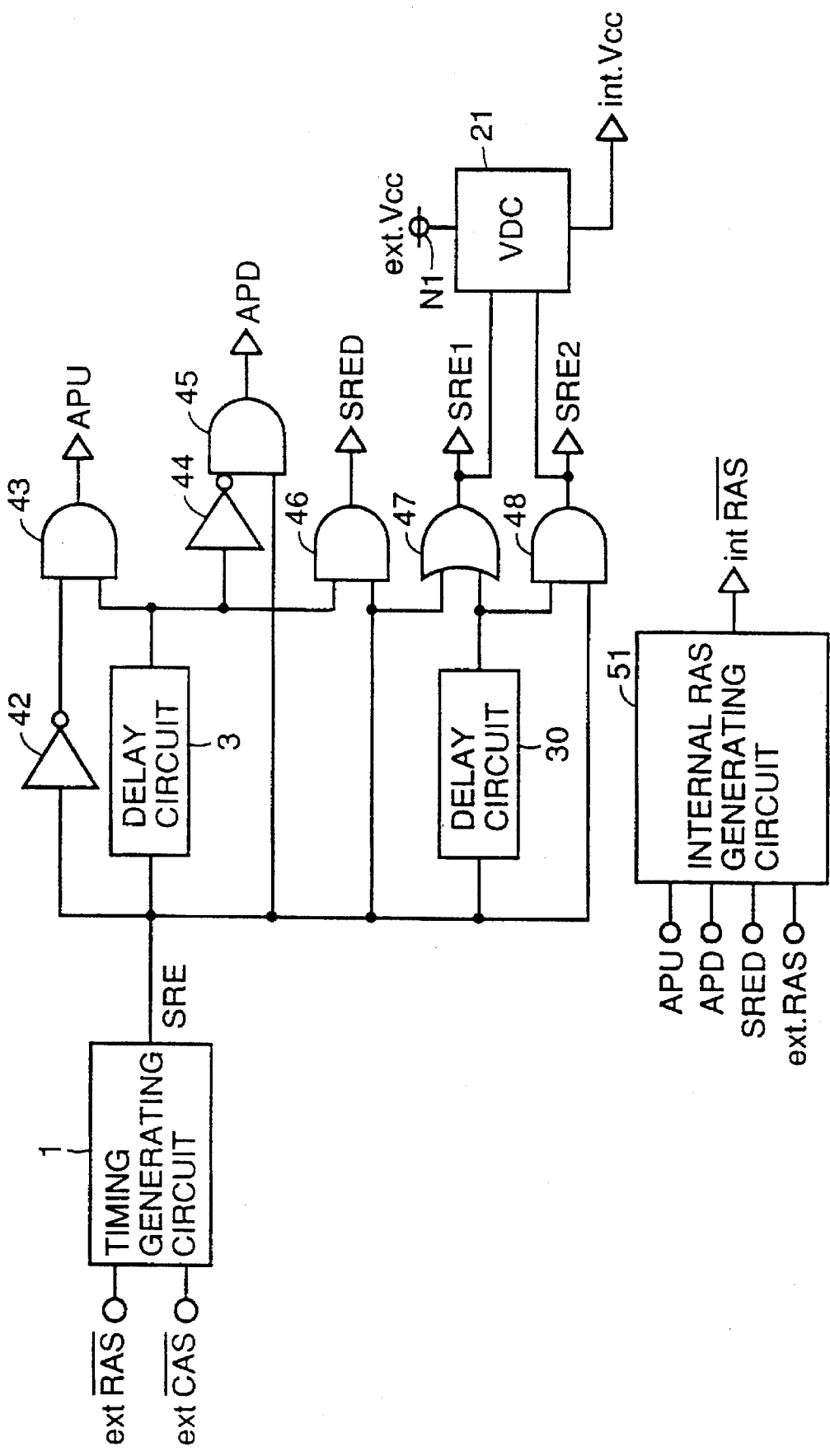
FIG. 9 is a block diagram showing a circuit portion regarding self-refreshing of a DRAM according to a fourth embodiment.

FIG. 9 is a block diagram of a circuit portion regarding self-refreshing of a DRAM according to the fourth embodiment. Referring to FIG. 9, the circuit of FIG. 9 is different from that of FIG. 6 in the following points.

In order to generate signals SRE1 and SRE2 defining periods in which the internal power supply voltage intVcc is decreased and increased in the self-refreshing operation in a plurality of stages, respectively, a delay circuit 30, an OR gate 47, and an AND gate 48 are provided in addition to the circuit of FIG. 6.

Further, the configuration of an internal voltage down-converting circuit 21 is different from that of internal voltage down-converting circuit 2 of FIG. 6.

Delay circuit 30 receives the signal SRE, and delays the signal for output. OR gate 47 receives the signal SRE and the output signal of delay circuit 30, and, in response to these signals, generates the signal SRE1. AND gate 48 receives the output signal of delay circuit 30 and the signal SRE, and, in response to these signals, generates the signal SRE2.

Internal voltage down-converting circuit 21 receives the signals SRE1 and SRE2. Internal voltage down-converting circuit 21 increases and decreases the internal power supply voltage intVcc in the self-refreshing operation in two stages, respectively.

Internal voltage down-converting circuit 21 of FIG. 9 will now be described in detail.

Figure 10:
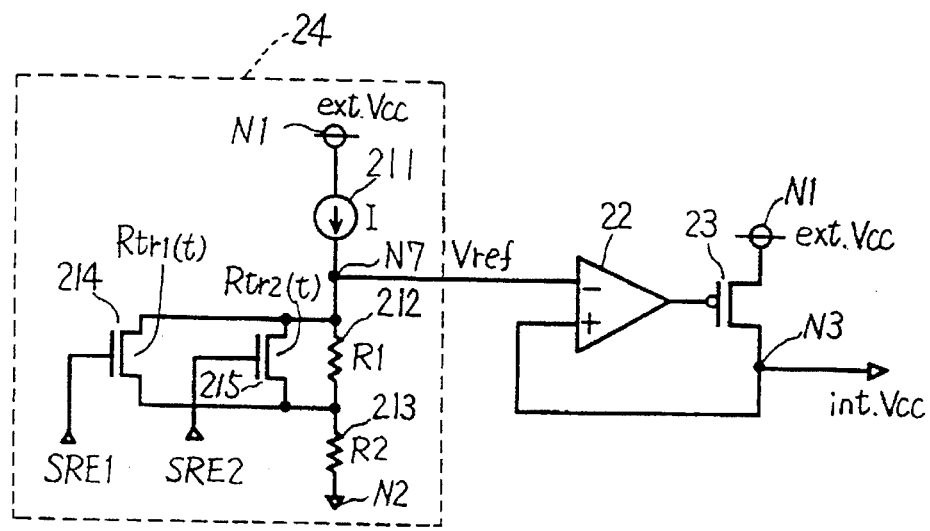
FIG. 10 is a circuit diagram showing a configuration of an internal voltage down-converting circuit according to a fourth embodiment.

FIG. 10 is a circuit diagram showing the configuration of internal voltage down-converting circuit 21 according to the fourth embodiment. Referring to FIG. 10, the circuit of FIG. 10 is different from the circuit of FIG. 3 in the configuration of a reference voltage generating circuit 24.

Reference voltage generating circuit 24 is different from reference voltage generating circuit 21 of FIG. 3 in that an NMOS transistor 215 in addition to transistor 214 is connected between output node N7 and a node between resistors 212 and 213. In reference voltage generating circuit 24, transistor 214 receives the signal SRE1 at its gate, while transistor 215 receives the signal SRE2 at its gate.

Operation of the internal voltage down-converting circuit of FIG. 10 will be described. The difference in operation between the internal voltage down-converting circuit of FIG. 10 and that of FIG. 3 will be mainly described.

A current from constant current source 211 flows through resistors 212 and 213 and transistors 214 and 215. Based on such a current, the resistance value R1 of resistor 212, the resistance value R2 of resistor 213, a resistance value Rtr1(t) of transistor 214, and a resistance value Rtr2(t) of transistor 215, the reference voltage Vref which is a voltage at output node N7 is generated. The reference voltage Vref is given by the following expression (4):

$$Vref=I\times(R1/(1+R1/(Rtr1(t)+Rtr2(t)))+R2) \quad (4)$$

Based on the above expression (4), description will now be given of the reference voltage Vref generated in respective operation states of transistors 214 and 215.

The reference voltage Vref when both transistors 214 and 215 are completely turned on is given by the following expression (5), wherein Rtr1 and Rtr2 are the on resistances of transistors 214 and 215 in this case, respectively:

$$Vref=I\times(R1/(1+R1/(Rtr1+Rtr2)+R2)) \quad (5)$$

The reference voltage Vref when only transistor 215 is turned off takes a value given by the following expression (6):

$$Vref=I\times(R1/(1+R1/Rtr1)+R2) \quad (6)$$

The reference voltage Vref when both transistors 214 and 215 are turned off takes a value given by the following expression (7):

$$Vref=I\times(R1+R+2) \quad (7)$$

As described above, in internal voltage down-converting circuit 24, the reference voltage Vref can take three levels of values. Therefore, the internal power supply voltage intVcc can be decreased and increased in two steps, respectively.

In FIG. 10, a circuit which changes the internal power supply voltage intVcc in two steps was illustrated. However, it is also possible to change the internal power supply voltage intVcc in three or more steps. More specifically, by providing three or more NMOS transistors such as transistors 214 and 215, and controlling the transistors by different signals, the internal power supply voltage intvcc can be decreased and increased in three or more steps.

Operation of the circuit of FIG. 9 will be described.

FIG. 11 is a timing chart showing operation timings of the circuit of FIG. 9 in the self-refreshing operation. Signals other than the signal SRE1, the signal SRE2, and the internal power supply voltage intVcc shown in FIG. 11 change as shown in the timing chart of FIG. 8. Therefore, description will be given only of the signal SRE1, the signal SRE2, and the internal power supply voltage intVcc.

Referring to FIGS. 11, 9 and 10, simultaneously with the rising of the signal SRE, the signal SRE1 rises to the H level. In response to this, transistor 214 is turned on, and the internal power supply voltage intVcc is decreased by one step. After a delay period of delay circuit 30, the signal SRE2 rises to the H level. In response to this, transistor 215 is turned on, and the internal power supply voltage intVcc is decreased by another step.

Simultaneously with the falling of the signal SRE, the signal SRE2 falls to the L level. In response to the falling, transistor 215 is turned off, and the internal power supply voltage intVcc is increased by one step. After a delay period of delay circuit 30, the signal SRE1 falls to the L level. In response to the falling, transistor 214 is turned off, and the internal power supply voltage intVcc is further increased by another step.

As described above, since the internal power supply voltage intVcc is decreased and increased in two stages, respectively, the internal power supply voltage intVcc changes by a little amount in one stage. Therefore, the operation can be further stabilized as compared to the first and third embodiments.

A period t1 which is one stage of the decrease period of the internal power supply voltage is synchronized with the timing at which all memory cells are refreshed. A period t2 which is one stage of the increase period of the internal power supply voltage is also synchronized with the timing at which all memory cells are refreshed. Preferably, the periods t1 and t2 are set to multiples of periods in which all memory cells are refreshed in the second cycle trd and the first cycle tur, respectively. By setting the periods as described above, the influence of bump on the semiconductor memory device is decreased in a transition period of power supply voltage such as the decrease period and the increase period. Therefore, the operation can be stabilized.

Fifth Embodiment

The fifth embodiment will now be described.

In the fifth embodiment, another example of the reference voltage generating circuit in the internal voltage down-converting circuit will be described.

More specifically, description will be given of a reference voltage generating circuit having a function of making the reference voltage higher than the normal internal power supply voltage in a burn-in test.

Figure 12:
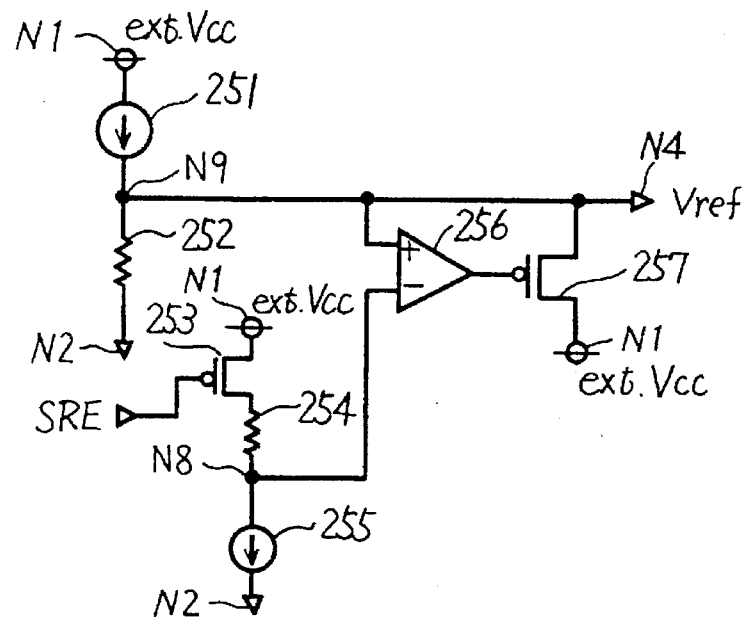
FIG. 12 is a block diagram showing a configuration of a reference voltage generating circuit of an internal voltage down-converting circuit according to a fifth embodiment.

FIG. 12 is a block diagram showing the configuration of the reference voltage generating circuit in the internal voltage down-converting circuit according to the fifth embodiment. The reference voltage generating circuit corresponds to reference voltage generating circuit 21 of FIG. 3, for example. Referring to FIG. 12, the reference voltage generating circuit includes constant current sources 251, 255, resistors 252, 254, PMOS transistors 253, 257, and a differential amplifying circuit 256.

Constant current source 251 and resistor 252 are connected between external power supply node N1 and ground node N2. A node N9 between constant current source 251 and resistor 252 is connected to output node N4. Transistor 253, resistor 254, and constant current source 255 are connected in series between external power supply node N1 and ground node N2.

Transistor 253 receives the self-refresh enable signal SRE as shown in FIG. 1, for example, at its gate. A voltage is provided from a node N8 between resistor 254 and constant current source 255. Differential amplifying circuit 256 has its positive side input terminal connected to output node N9, and its negative side input terminal connected to node N8.

Transistor 257 is connected between external power supply node N1 and output node N4. The gate of transistor 257 receives the output voltage of differential amplifying circuit 256.

Operation of the reference voltage generating circuit of FIG. 12 will be described. A constant current flows through resistor 252 from constant current source 251. As a result, a voltage at a node between constant current source and resistor 252 (hereinafter referred to as a first reference voltage) always becomes constant.

In the normal operation, since the signal SRE is at the L level, transistor 253 is turned on. In this case, the voltage at node N8 takes a value of the external power supply voltage extVcc minus the voltage drop of resistor 254. More specifically, the voltage at node N8 depends on the external power supply voltage extVcc.

At the time of a burn-in test, since the external power supply voltage extVcc is set higher than a normal value, the voltage at node N8 becomes higher than the voltage at node N9. Therefore, the output voltage of differential amplifying circuit 256 becomes negative, thereby rendering transistor 257 conductive. As a result, a voltage based on the external power supply voltage extVcc is supplied to output node N4 as a second reference voltage.

In this case, the reference voltage Vref is a sum of the first reference voltage and the second reference voltage. As described above, since the reference voltage Vref becomes high in the burn-in test, the burn-in test can be carried out.

However, in the self-refreshing operation, such a burn-in test as described above does not have to be carried out. Therefore, in the self-refreshing operation, transistor 253 is turned off in response to the signal SRE. As a result, the circuit supplying the second reference voltage is halted. Therefore, current consumption in the self-refreshing operation can be reduced.

Sixth Embodiment

The sixth embodiment will now be described. Such an internal voltage down-converting circuit as described above is basically configured of a reference voltage generating circuit and a differential amplifying circuit. The differential amplifying circuit always compares an internal power supply voltage and a reference voltage, and adjusts the internal power supply voltage. Therefore, in a stand-by period in a self-refreshing operation, the differential amplifying circuit consumes direct current.

In the sixth embodiment, an example will be described in which current consumption is reduced by eliminating such waste current consumption.

Figure 13:
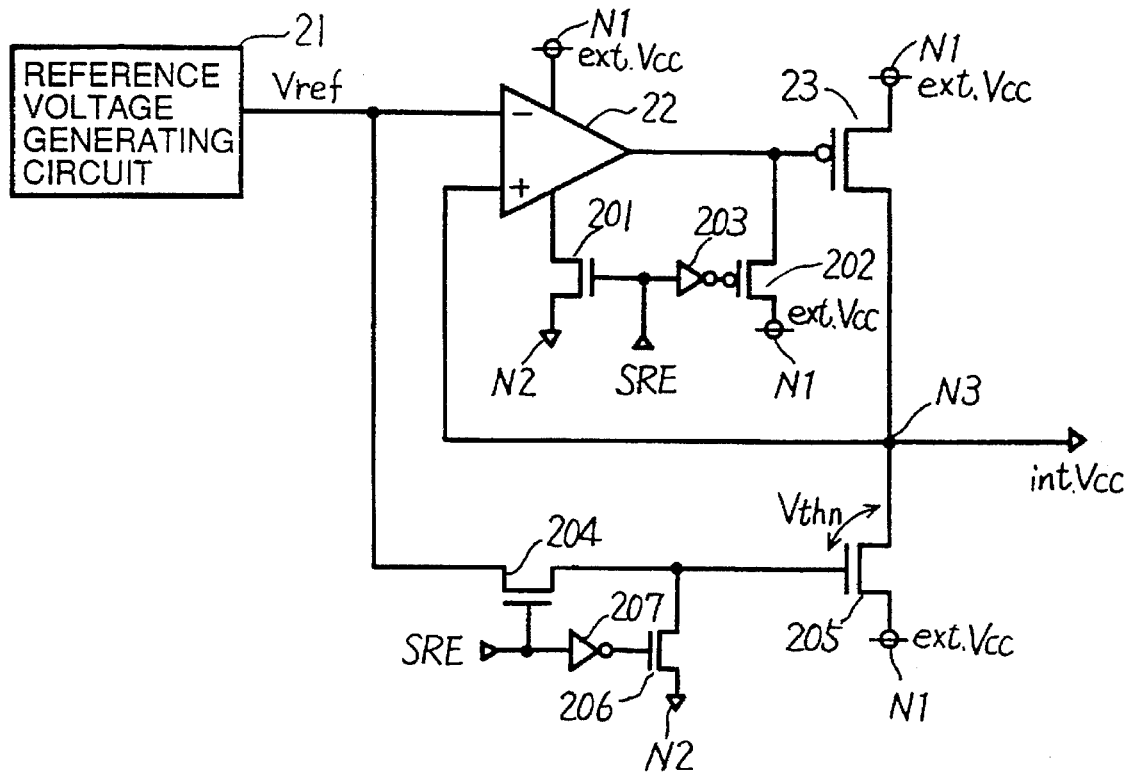
FIG. 13 is a circuit diagram showing a configuration of an internal voltage down-converting circuit according to a sixth embodiment.

FIG. 13 is a circuit diagram showing the configuration of an internal voltage down-converting circuit according to the sixth embodiment. The same portions as those of FIG. 3 are labeled with the same reference characters. The internal voltage down-converting circuit of FIG. 13 is different from that of FIG. 3 in the following points.

Referring to FIG. 13, in order to halt operation of differential amplifying circuit 22, and to stop supply of the external power supply voltage extVcc to output node N3 through PMOS transistor 23 in the self-refreshing operation, an NMOS transistor 201, a PMOS transistor 202, and an inverter 203 are provided.

In order to supply a voltage based on the external power supply voltage extVcc to output node N3 in the self-refreshing operation, NMOS transistors 204, 205, 206, and an inverter 207 are provided.

Transistor 201 is connected between differential amplifying circuit 22 and ground node N2. Transistor 202 is connected between the gate of transistor 23 and external power supply node N1. Transistor 201 receives the signal SRE at its gate, and transistor 202 receives an inverted signal of the signal SRE applied through inverter 203 at its gate.

Transistor 205 is connected between external power supply node N1 and output node N3. Transistor 204 is connected between the output node of reference voltage generating circuit 21 and the gate of transistor 205. Transistor 206 is connected between the gate of transistor 205 and ground node N2. Transistor 205 forms a source-follower.

The signal SRE is applied to the gate of transistor 204, and an inverted signal of the signal SRE is applied to the gate of transistor 206.

Operation of the internal voltage down-converting circuit of FIG. 13 will now be described. In the normal operation, transistors 201, 202, 204 are turned off, and transistor 206 is turned on. Since ground potential is supplied to the gate of transistor 205, transistor 205 is turned off. Therefore, the internal voltage down-converting circuit of FIG. 13 operates similar to that of FIG. 3 in the normal operation.

On the other hand, in the self-refreshing operation, transistors 201, 202, 204 are turned on, and transistor 206 is turned off. In this case, differential amplifying circuit 22 is halted. At the same time, the gate potential of transistor 23 attains a voltage based on the external power supply voltage extVcc, and supply of the external power supply voltage extVcc through transistor 23 is stopped.

Further, since the reference voltage Vref is applied to the gate of transistor 205 through transistor 204, transistor 205 is turned on. As a result, a voltage lower than the reference voltage Vref by a threshold voltage Vthn of transistor 205 is supplied to output node N3 as the internal power supply voltage.

As described above, since differential amplifying circuit 22 is halted in the self-refreshing operation, current consumption in the self-refreshing operation can be reduced. Since a voltage lower than the reference voltage Vref is supplied as the internal power supply voltage in the self-refreshing operation, current consumption in the self-refreshing operation can be reduced similar to the case of FIG. 3. Description will now be given of a specific example of the reference voltage Vref and the internal power supply voltage intVcc in the normal operation and in the self-refreshing operation of the internal voltage down-converting circuit of FIG. 13.

Figure 14:
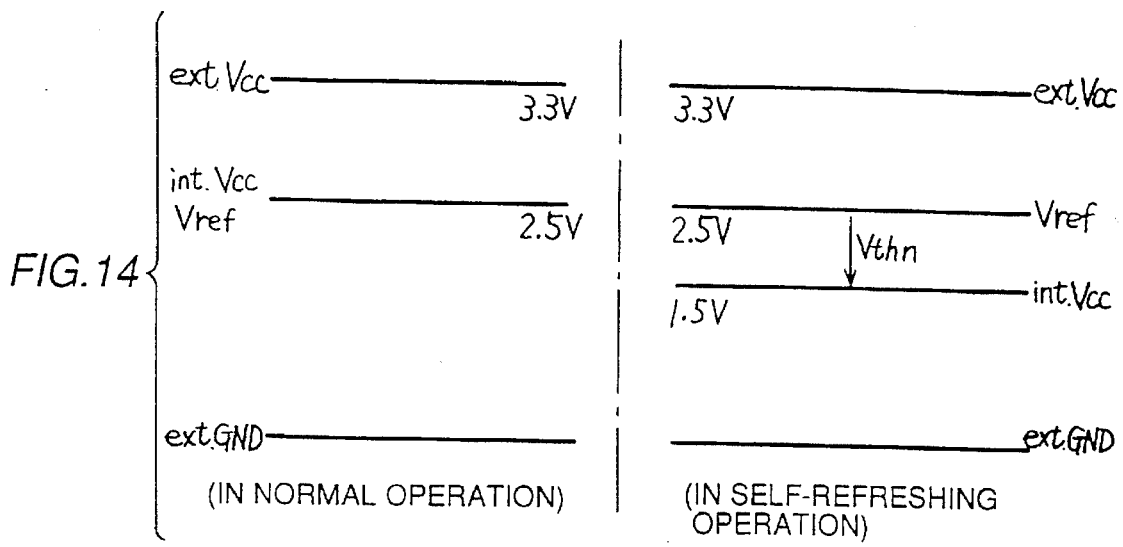
FIG. 14 is a diagram showing one example of a reference voltage and an internal power supply voltage of the internal voltage down-converting circuit of FIG. 13.

FIG. 14 is a diagram showing an example of the reference voltage Vref and the internal power supply voltage intVcc of the internal voltage down-converting circuit of FIG. 13.

Referring to FIG. 14, when the external power supply voltage extVcc is 3.3 V, for example, the internal power supply voltage intVcc at the same level (2.5 V) as that of the reference voltage Vref in the normal operation is generated. On the other hand, the internal power supply voltage intVcc of 1.5 V which is lower than the reference voltage Vref (2.5 V) by the threshold voltage Vthn (1.0 V) is generated in the self-refreshing operation. In the sixth embodiment, current consumption in the self-refreshing operation can be thus reduced by simple control in an internal circuit.

Seventh Embodiment

The seventh embodiment will be described. In one method of supplying an internal power supply voltage in a DRAM, a supply path to a memory cell array and a supply path to a peripheral circuit are separated, and the internal power supply voltage is supplied independently to the memory cell array and the peripheral circuit. This method is used to prevent the influence of decrease in voltage caused by a large current generated in the sensing operation by a sense amplifier on the peripheral circuit.

The seventh embodiment uses such a configuration. In the seventh embodiment, an example will be described in which the memory cell array and the peripheral circuit are controlled separately to have the internal power supply voltage lower in the self-refreshing operation than in the normal operation.

Figure 15:
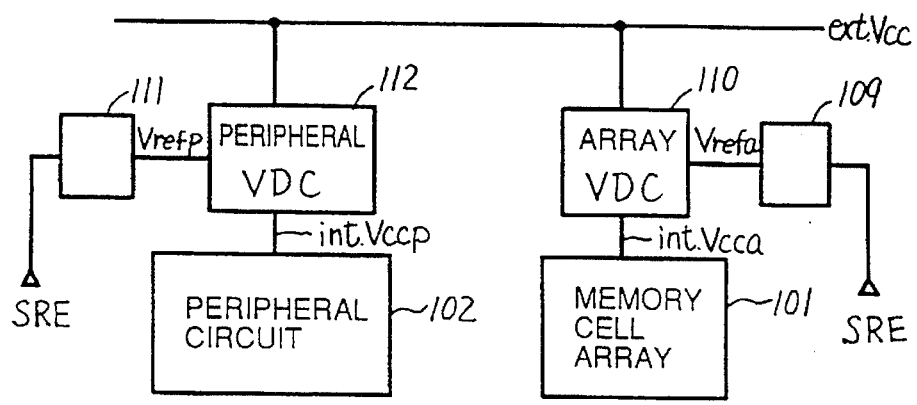
FIG. 15 is a block diagram showing a circuit portion regarding self-refreshing of a DRAM according to a seventh embodiment.

FIG. 15 is a block diagram of a portion regarding the self-refreshing operation of a DRAM according to the seventh embodiment. The circuit of FIG. 15 includes memory cell array 101, peripheral circuit 102, an array reference voltage generating circuit 109, an array internal voltage down-converting circuit 110, a peripheral reference voltage generating circuit 111, and a peripheral internal voltage down-converting circuit 112.

Array reference voltage generating circuit 109 generates a reference voltage Vrefa of an internal power supply voltage intVcca supplied to memory cell array 101. Array reference voltage generating circuit 109 receives such a self-refresh enable signal as shown in FIG. 1, and, in response to the signal, makes the level of the reference voltage Vrefa to be generated lower in the self-refreshing operation than in the normal operation.

Array internal voltage down-converting circuit 110 receives the external power supply voltage extVcc as a power supply voltage, and the reference voltage Vrefa as a control voltage. Array internal voltage down-converting circuit 110 supplies the internal power supply voltage intVcca to memory cell array 101 based on the reference voltage Vrefa.

Peripheral reference voltage generating circuit 111 generates a reference voltage Vrefp of an internal power supply voltage intVccp supplied to peripheral circuit 102. Reference voltage generating circuit 111 receives the signal SRE, and, in response to the signal, makes the reference voltage Vrefp lower in the self-refreshing operation than in the normal operation.

Peripheral internal voltage down-converting circuit 112 receives the external power supply voltage extVcc as a power supply voltage, and the reference voltage Vrefp as a control voltage. Peripheral internal voltage down-converting circuit 112 supplies the internal power supply voltage intVccp to peripheral circuit 102 based on the reference voltage Vrefp.

As described above, the internal power supply voltages intVcca and intVccp are supplied to memory cell array 101 and peripheral circuit 102 from internal voltage down-converting circuits 110 and 112 provided independently. Therefore, by setting these internal power supply voltages intVcca and intVccp to voltages suitable for stable operation of corresponding memory cell array 101 and peripheral circuit 102, respectively, stabilization of operation of the semiconductor memory device can be implemented.

Description will now be given of a specific example of control of respective internal power supply voltages of memory cell array 101 and peripheral circuit 102 by the circuit of FIG. 15.

Figure 16:
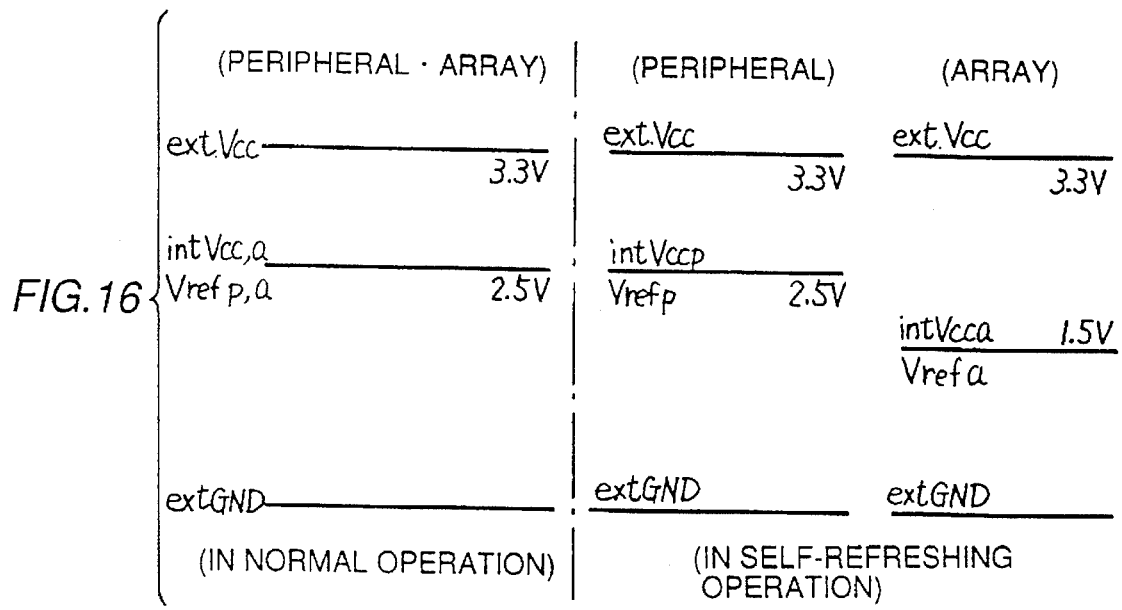
FIG. 16 is a diagram showing a method of controlling respective internal power supply voltages of a peripheral circuit and a memory cell array of FIG. 15.
Figure 17:
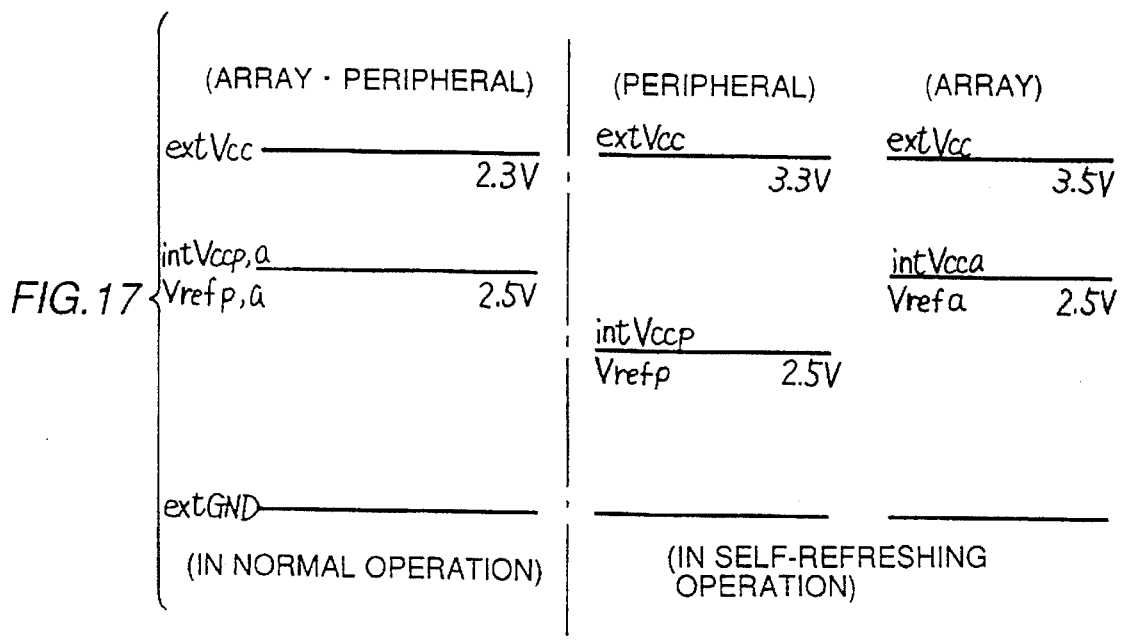
FIG. 17 is a diagram showing a method of controlling respective internal power supply voltages of the peripheral circuit and the memory cell array of FIG. 15.

FIGS. 16 and 17 are diagrams showing a method of controlling respective internal power supply voltages of memory cell array 101 and peripheral circuit 102 by the circuit of FIG. 15.

FIG. 16 shows an example in which only the internal power supply voltage of memory cell array 101 is decreased in the self-refreshing operation. FIG. 17 shows an example in which only the internal power supply voltage of peripheral circuit 102 is decreased in the self-refreshing operation.

Referring to FIG. 16, in the normal operation, the internal power supply voltages intVccp and intVcca of peripheral circuit 102 and memory cell array 101 are set to 2.5 V, for example. In the self-refreshing operation, the reference voltage Vrefa is decreased to 1.5 V, for example, for memory cell array 101 in response to the signal SRE. Accordingly, the internal power supply voltage intVcca is decreased to 1.5 V.

Referring to FIG. 17, in the normal operation, the internal power supply voltages intVccp and intVcca of peripheral circuit 102 and memory cell array 101 are set to 2.5 V, for example. In the self-refreshing operation, the reference voltage Vrefp is decreased to 1.5 V, for example, for peripheral circuit 102 in response to the signal SRE. Accordingly, the internal power supply voltage intVccp is decreased to 1.5 V.

As another example, respective internal power supply voltages of peripheral circuit 102 and memory cell array 101 may be both decreased in the self-refreshing operation.

As described above, in the seventh embodiment, by decreasing one or both of the internal power supply voltages of the peripheral circuit and the memory cell array in the self-refreshing operation, current consumption in the self-refreshing operation can be reduced.

In the seventh embodiment, the voltage swing width was made smaller by decreasing the internal power supply voltage in the self-refreshing operation. However, this embodiment is not limited thereto. The ground potential may be increased as shown in the second embodiment. Both the decrease control and the increase control may be used.

Eighth Embodiment

In a DRAM, a boosted voltage generating circuit is provided in a chip as a word line boosted voltage supplying circuit. The boosted voltage generating circuit is basically configured of a ring oscillator and a pumping circuit. In the boosted voltage generating circuit, current consumption changes according to change of the frequency of the ring oscillator. More specifically, as the frequency of the ring oscillator becomes lower, current consumption is decreased.

In the normal operation, such a boosted voltage generating circuit must always generate a predetermined boosted voltage stably for any load in order to increase the access speed.

However, in the self-refreshing operation, it is not necessary to take care of the access speed seriously. Therefore, by making the frequency of the ring oscillator lower in the self-refreshing operation than in the normal operation, the pumping frequency of the pumping circuit may be decreased.

In the eighth embodiment, an example will be described in which, by making the frequency of the ring oscillator lower in the self-refreshing operation than in the normal operation, the pumping frequency of the pumping circuit is decreased.

Figure 18:
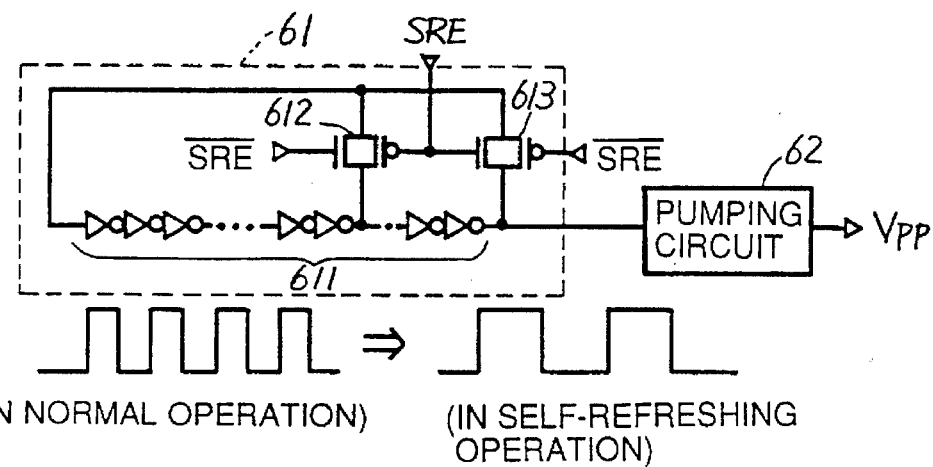
FIG. 18 is a circuit diagram showing a configuration of a boosted voltage generating circuit according to an eighth embodiment.

FIG. 18 is a circuit diagram showing the configuration of the boosted voltage generating circuit according to the eighth embodiment. Referring to FIG. 18, the boosted voltage generating circuit includes a ring oscillator 61 and a pumping circuit 62. Ring oscillator 61 includes an inverter group 611 of a plurality of inverters, and transfer gates 612 and 613.

Inverter group 611 is connected in a circular manner through transfer gate 613 provided between an inverter at the final stage and an inverter at the first stage. Further, inverter group 611 is connected in a circular manner through transfer gate 612 provided between a predetermined node between the inverter at the final stage and the inverter at the first stage and the inverter at the first stage. A pulse signal is applied to pumping circuit 62 from the inverter at the final stage of inverter group 611.

Transfer gate 613 receives the self-refresh enable signal SRE as shown in FIG. 1 at the gate on the N channel side, and a signal $\overline{SRE}$ which is an inverted signal of the signal SRE at the gate on the P channel side. Transfer gate 612 receives the signal $\overline{SRE}$ at the gate on the N channel side, and the signal SRE at the gate on the P channel side.

A pulse signal is applied to pumping circuit 62 from the inverter at the final stage of such inverter group 611. Pumping circuit 62 carries out pumping operation in response to a pulse signal provided from ring oscillator 61, and generates a boosted voltage Vpp.

In the boosted voltage generating circuit, when the signal SRE is at the L level, transfer gate 612 is turned on, and transfer gate 613 is turned off. As a result, a first inverter chain through transfer gate 612 is formed.

On the other hand, when the signal SRE is at the H level, transfer gate 612 is turned off, and transfer gate 613 is turned on. As a result, a second inverter chain through transfer gate 613 is formed. The second inverter chain is longer than the first inverter chain.

Therefore, as shown by pulse waveforms in FIG. 18, a pulse signal having a frequency lower in the self-refreshing operation than in the normal operation is generated by ring oscillator 61. Therefore, pumping circuit 62 receiving the pulse signal carries out pumping operation in a frequency lower in the self-refreshing operation than in the normal operation.

As described above, since pumping operation is carried out in a frequency lower in the self-refreshing operation than in the normal operation, current consumption in the self-refreshing operation can be reduced.

Ninth Embodiment

The ninth embodiment will now be described.

In the ninth embodiment, another boosted voltage generating circuit which reduces current consumption in the self-refreshing operation as in the case of the eighth embodiment will be described.

Figure 19:
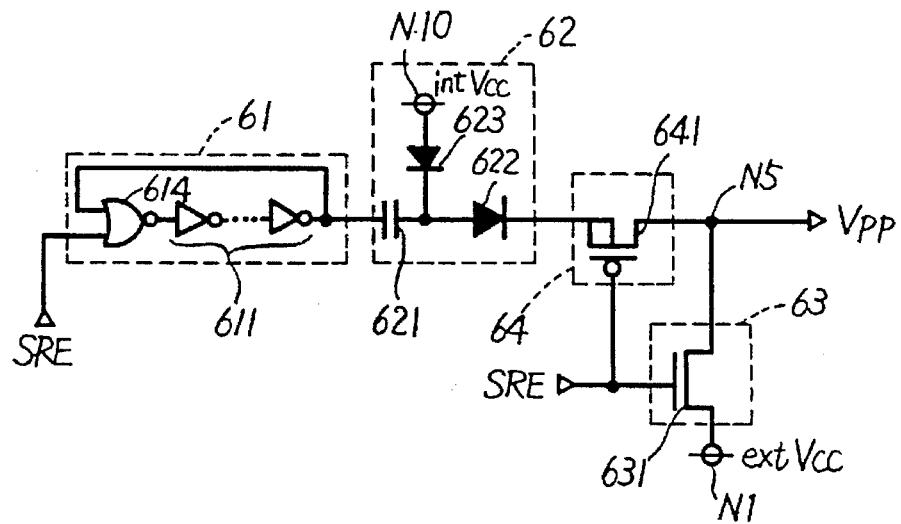
FIG. 19 is a circuit diagram showing a configuration of a boosted voltage generating circuit according to a ninth embodiment.

FIG. 19 is a circuit diagram showing the configuration of a boosted voltage generating circuit according to the ninth embodiment.

Referring to FIG. 19, the boosted voltage generating circuit includes ring oscillator 61, pumping circuit 62, an external voltage supplying circuit 63, and a cut-off circuit 64.

Ring oscillator 61 includes an NOR gate 614 and an inverter group 611. NOR gate 614 and inverter group 611 are connected in a circular manner. Such a self-refresh enable signal as shown in FIG. 1 is applied to one input terminal of NOR gate 614. Pumping circuit 62 includes a capacitor 621, and diodes 622 and 623. Capacitor 621 and diode 622 are connected between ring oscillator 61 and cut-off circuit 64. Diode 623 is connected between internal power supply node N10 receiving the internal power supply voltage intVcc and a node between capacitor 621 and diode 622.

Cut-off circuit 64 includes a PMOS transistor 641. Connected between diode 622 and output node N5, transistor 641 receives the signal SRE at its gate. External voltage supplying circuit 63 includes an NMOS transistor 631. Connected between external power supply node N1 and output node N5, transistor 631 receives the signal SRE at its gate.

Operation of the boosted voltage generating circuit of FIG. 19 will now be described.

The boosted voltage generating circuit operates as follows in the normal operation. Since the signal SRE is at the L level, a pulse signal is supplied to pumping circuit 62 from ring oscillator 61. Pumping circuit 62 carries out pumping operation in response to the supplied pulse signal, and generates the boosted voltage Vpp.

In this case, since transistor 641 is turned on, the boosted voltage Vpp is supplied to output node N5 through transistor 641. Further, since transistor 631 is turned off, the boosted voltage is supplied to output node N5 through transistor 641.

On the other hand, the boosted voltage generating circuit operates as follows in the self-refreshing operation. Since the signal SRE is at the H level, ring oscillator 61 is halted. Accordingly, the pumping operation of pumping circuit 62 is also halted. Further, since transistor 641 is turned off, the boosted voltage from pumping circuit 62 is not supplied to output node N5.

On the other hand, since transistor 631 is turned on, a voltage which is lower than the external power supply voltage extVcc by the threshold voltage of transistor 631 is supplied to output node N5 from external voltage supplying circuit 63.

Description will now be given of the reason why supply of the voltage from pumping circuit 62 is cut off in the self-refreshing operation. Assuming that the internal power supply voltage intVcc is 1.5 V, for example, in the self-refreshing operation, the boosted level of a word line must be 2.2 V or more, for example. In the case of the circuit of FIG. 19, if the external power supply voltage is 3.3 V, for example, it is possible to set a voltage which is lower than 3.3 V by the threshold voltage of transistor 63 to approximately 2.5 V.

Therefore, it is possible to secure a voltage of 2.5 V which is higher than the above described 2.2 V as the boosted level of a word line. Therefore, ring oscillator 61 and pumping circuit 62 are halted without any trouble.

As described above, in the ninth embodiment, ring oscillator 61 and pumping circuit 62 are halted in the self-refreshing operation, and a voltage based on the external power supply voltage extVcc is used in place of the boosted voltage. Therefore, current consumption in the self-refreshing operation can be reduced.

Tenth Embodiment

The tenth embodiment will be described.

The tenth embodiment is another example of external voltage supplying circuit 63 described in the ninth embodiment.

Figure 20:
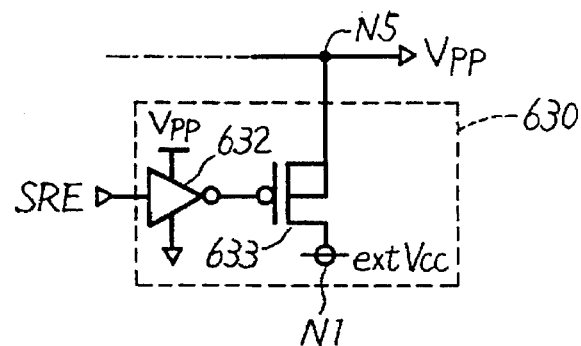
FIG. 20 is a circuit diagram showing a configuration of an external voltage supplying circuit of a boosted voltage generating circuit according to a tenth embodiment.

FIG. 20 is a circuit diagram showing the configuration of an external voltage supplying circuit of a boosted voltage generating circuit according to the tenth embodiment.

Referring to FIG. 20, an external voltage supplying circuit 630 includes an inverter 632 and a PMOS transistor 633. Transistor 633 is connected between external power supply node N1 and output node N5. Inverter 632 inverts the signal SRE, and applies the inverted signal to the gate of transistor 633.

In external voltage supplying circuit 630, transistor 633 is turned on in the self-refreshing operation. As a result, a voltage at the same level as that of the external power supply voltage extVcc is supplied to output node N5 as the boosted voltage.

As described above, the boosted voltage in the self-refreshing operation attains the same level as that of the external power supply voltage extVcc. Therefore, a boosted voltage generating circuit including such external voltage supplying circuit 630 can be used not only in the case where the internal power supply voltage at a level lower in the self-refreshing operation than in the normal operation is generated, but also in the case where the internal power supply voltage at a level equal in the self-refreshing operation and in the normal operation is generated.

Description will now be given of the reason why it is appropriate for the boosted voltage in the self-refreshing operation to be set at the same level as that of the external power supply voltage extVcc.

When the internal power supply voltage in the self-refreshing operation is set to the level of 2.5 V, which is the same as the case of the normal operation, for example, the boosted level of a word line must be 3.0 V or more which is higher than the internal power supply voltage intVcc by the threshold voltage (for example, 0.5 V) of a transfer gate transistor of a memory cell.

In the boosted voltage generating circuit including external voltage supplying circuit 630 of FIG. 20, if the external power supply voltage extVcc is 3.3 V, for example, the boosted level of a word line of 3.0 V or more can be secured.

As described above, in the tenth embodiment, the ring oscillator and the pumping circuit are halted in the self-refreshing operation, and a voltage at the same level as that of the external power supply voltage is used in place of the boosted voltage. Therefore, current consumption in the self-refreshing operation can be reduced.

Eleventh Embodiment

The eleventh embodiment will now be described.

If a peripheral circuit of a DRAM is functionally divided, the peripheral circuit is divided into a CMOS circuit operating based on a CMOS logic and an analog circuit operating in an analog manner.

Although the CMOS circuit operates correctly based on a relatively low internal power supply voltage, the analog circuit does not operate correctly based on an extremely low internal power supply voltage.

Therefore, in order to stabilize operation of the analog circuit in the self-refreshing operation, a power supply line of the CMOS circuit is separated from a power supply line of the analog circuit, and different internal power supply voltages are supplied to these circuits. In the eleventh embodiment, such an example will be described.

Figure 21:
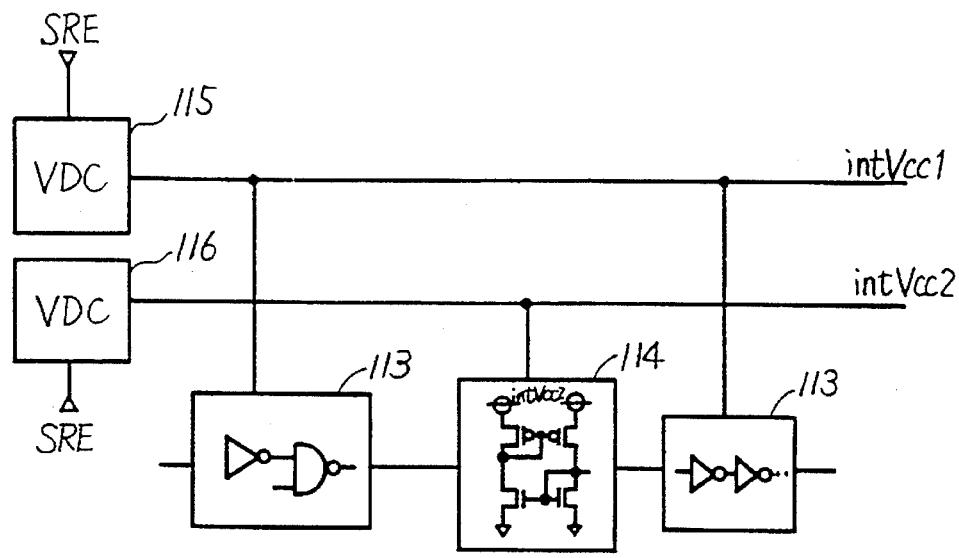
FIG. 21 is a block diagram showing a circuit configuration of a power supply path of a peripheral circuit according to an eleventh embodiment.

FIG. 21 is a block diagram showing the circuit configuration of a power supply path of a peripheral circuit according to the eleventh embodiment.

In FIG. 21, CMOS circuits 113, 113, an analog circuit 114, a first internal voltage down-converting circuit 115, and a second internal voltage down-converting circuit 116 are shown. CMOS circuits 113, 113 and analog circuit 114 form the peripheral circuit.

First internal voltage down-converting circuit 115 generates a first internal power supply voltage intVcc1. First internal voltage down-converting circuit 115 receives such a self-refresh enable signal SRE as shown in FIG. 1, and, in response to the signal, controls the first internal power supply voltage intVcc1 to be lower in the self-refreshing operation than in the normal operation. Second internal voltage down-converting circuit 116 generates a second internal power supply voltage intVcc2. Second internal voltage down-converting circuit 116 receives the signal SRE, and, in response to the signal, controls the second internal power supply voltage intVcc2 to be lower in the self-refreshing operation than in the normal operation.

The level of the second internal power supply voltage intVcc2 generated in the self-refreshing operation by second internal voltage down-converting circuit 116 is set higher than the level of the first internal power supply voltage intVcc1 generated in the self-refreshing operation by first internal voltage down-converting circuit 115.

The first internal power supply voltage intVcc1 is supplied to CMOS circuit 113. The second internal power supply voltage intVcc2 is supplied to analog circuit 114.

Figure 22:
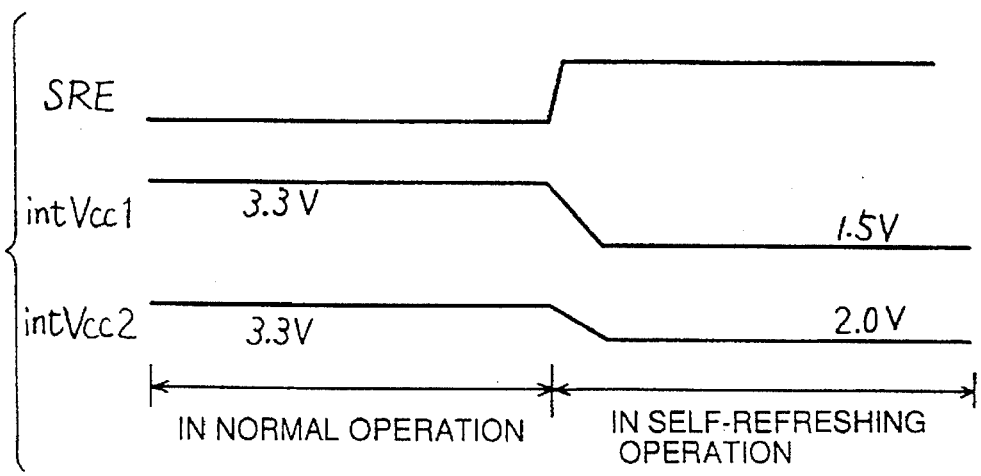
FIG. 22 is a timing chart showing operation timings of first and second internal voltage down-converting circuits of FIG. 21.

Description will now be give of operation of first internal voltage down-converting circuit 115 and second internal voltage down-converting circuit 116 shown in FIG. 21. FIG. 22 is a timing chart showing operation timings of first and second internal voltage down-converting circuits 115 and 116 of FIG. 21.

Referring to FIG. 22, in the normal operation, the first internal power supply voltage intVcc1 and the second internal power supply voltage intVcc2 are set to the same level (for example, 3.3 V). In the self-refreshing operation, in response to the rising of the signal SRE, the first internal power supply voltage intVcc1 is decreased to 1.5 V. On the other hand, in response to the rising of the signal SRE, the second internal power supply voltage intVcc2 is decreased to 2.0 V, for example.

As described above, both the first and second internal power supply voltages intVcc1 and intVcc2 are decreased in the self-refreshing operation. However, since the second internal power supply voltage intVcc2 is set to a level higher than that of the first internal power supply voltage intVcc1, malfunction of analog circuit 114 in the self-refreshing operation is prevented.

In the eleventh embodiment, different internal power supply voltages are supplied from different internal voltage down-converting circuits to the CMOS circuit and the analog circuit in the peripheral circuit, and the internal power supply voltage of the analog circuit is set to a level higher than that of the CMOS circuit in the self-refreshing operation. Therefore, current consumption in the self-refreshing operation can be reduced, and stable operation of the peripheral circuit can be secured.

In the eleventh embodiment, the voltage swing width was made smaller by the decrease control of the internal power supply voltage in the self-refreshing operation. However, this embodiment is not limited thereto. The increase control of the ground potential as shown in the second embodiment may be carried out. Both the decrease control and the increase control may be used.

Twelfth Embodiment

The twelfth embodiment will now be described.

As described in the above embodiments, when the level of the internal power supply voltage is controlled to be lower in the self-refreshing operation than in the normal operation, if the normal operation is carried out after completion of the self-refreshing operation, it is necessary to confirm by an external system that the internal power supply voltage has returned to the level of the normal operation.

In the twelfth embodiment, description will be given of a circuit which provides to the outside world a signal indicating a return state of such an internal power supply voltage.

FIG. 23 is a block diagram of a circuit which provides to the outside world a signal indicating a return state of the internal power supply voltage after completion of the self-refreshing operation.

Referring to FIG. 23, the circuit includes a timing generating circuit 701, an internal voltage down-converting circuit 702, a comparing circuit 703, an NOR gate 704, and an NMOS transistor 705. It should be noted that an output buffer 706 is for providing data.

Timing generating circuit 701 receives the signal extCAS which is an inverted signal of the $\overline{\text{extCAS}}$ signal and the signal SRE, and, in response to these signals, generates an output signal. Timing generating circuit 701 provides the output signal at the L level only when the signal extCAS is at the H level and the signal SRE is at the L level, and provides the output signal at the H level otherwise.

Internal voltage down-converting circuit 702 generates the internal power supply voltage intVcc. Comparing circuit 703 receives the internal power supply voltage intVcc and a predetermined reference voltage Vref0. The reference voltage Vref0 is a reference voltage for determining that the internal power supply voltage intVcc has returned to a level in the normal operation. The reference voltage Vref0 may be a reference voltage in internal voltage down-converting circuit 702, or the other voltages.

Comparing circuit 703 provides an output signal at the L level when the internal power supply voltage intVcc attains the reference voltage Vref0 or more. Comparing circuit 703 provides an output signal at the H level when the internal power supply voltage intVcc is lower than the reference voltage Vref0.

Transistor 705 is connected between external power supply node N1 and output node N6 serving as a data output pin. NOR gate 704 receives the output signal of comparing circuit 703 and the output signal of timing generating circuit 701, and applies an output signal in response to these signals to the gate of transistor 705.

Transistor 705 changes its conductive state in response to the signal applied to its gate. The potential of output node N6 attains the H level when transistor 705 is rendered conductive. As a result, an external output signal extDQ attains the H level. This H level is a level of a voltage based on the external power supply voltage extVcc. On the other hand, when transistor 705 is not rendered conductive, the voltage at output node N6 attains a high impedance state, and the external output signal extDQ also attains a high impedance state.

Operation of the circuit of FIG. 23 will now be described. FIG. 24 is a timing chart showing operation timings of the circuit of FIG. 23.

Referring to FIGS. 23 and 24, when the signal $\overline{\text{extRAS}}$ which triggers completion of the self-refreshing operation rises to the H level, the signal SRE falls to the L level. In response to the falling, the internal power supply voltage intVcc starts to increase. In this case, since the signal int $\overline{\text{CAS}}$ is at the L level, the condition that the signal extCAS is at the H level, and that the signal SRE is at the L level is satisfied. Therefore, the output signal of timing generating circuit 701 attains the L level.

Then, when the internal power supply voltage intVcc attains the reference voltage Vref0 or more, the output signal of comparing circuit 703 attains the L level. At this point, transistor 705 is turned on, and the external output signal extDQ rises to the H level.

Since the signal $\overline{\text{extCAS}}$ then rises to the H level, the signal extCAS attains the L level, and transistor 705 is turned off. As a result, the external output signal extDQ falls to the L level.

In this embodiment, the external output signal extDQ is so set that it attains the H level when the internal power supply voltage has returned to a level of the normal operation. However, this embodiment is not limited thereto. The external output signal extDQ may be set to any level such as the L level.

As described above, in the twelfth embodiment, since an output signal at a predetermined level is provided when the internal power supply voltage has returned to a level of the normal operation after completion of the self-refreshing operation, such a state can be confirmed by an external system.

In the twelfth embodiment, the internal power supply voltage is controlled by internal voltage down-converting circuit 702 in the self-refreshing operation. However, this embodiment is not limited thereto. Control of the ground potential as shown in the second embodiment may be carried out. Both the internal power supply voltage and the ground potential may be controlled.

Thirteenth Embodiment

The thirteenth embodiment will now be described. In the thirteenth embodiment, description will be given of a modification of the twelfth embodiment. FIG. 25 is a block diagram of a circuit providing to the outside world a signal indicating a return state of the internal power supply voltage after completion of the self-refreshing operation according to the thirteenth embodiment.

Referring to FIG. 25, the circuit includes timing generating circuit 701, and a transistor 707. Timing generating circuit 701 is similar to that of FIG. 23.

Transistor 707 is connected between internal power supply node N4 and output node N6. Transistor 707 receives the output signal of timing generating circuit 701 at its gate. Transistor 707 changes its conductive state in response to the level of the signal which it receives at the gate.

When transistor 707 is turned on, the external output signal extDQ attains the H level. On the other hand, when transistor 707 is in an off state, the external output signal extDQ attains a high impedance state. Therefore, the level of the external output signal extDQ depends on the internal power supply voltage intVcc.

Operation of the circuit of FIG. 25 will be described. FIG. 26 is a timing chart showing operation timings of the circuit of FIG. 25. Referring to FIGS. 26 and 25, when the signal extRAS rises to the H level, and the signal SRE falls to the L level in response to the rising, the internal power supply voltage intVcc starts to increase accordingly.

In this case, since the signal extCAS is at the L level, the signal extCAS is at the H level, and the signal SRE attains the L level. Therefore, transistor 707 is turned on at a timing at which the output signal of timing generating circuit 701 attains the L level.

Therefore, the level of the external output signal extDQ increases as the internal power supply voltage intVcc increases.

Then, since the signal extCAS rises to the H level, the signal extCAS attains the L level, and transistor 707 is turned off. As a result, the external output signal extDQ falls to the L level.

In this embodiment, the level of the external output signal extDQ is the same as the level of the internal power supply voltage intVcc. However, this embodiment is not limited thereto. The level of the signal extDQ may be the same as other levels, such as a level of a voltage lower than the internal power supply voltage intVcc by a threshold voltage of an NMOS transistor, as long as they change following the internal power supply voltage intVcc.

As described above, in the thirteenth embodiment, a signal is provided which indicates that the level of the internal power supply voltage has returned to a level of the normal operation after completion of the self-refreshing operation similar to the case of the twelfth embodiment. Therefore, such a state can be confirmed in an external system.

In the thirteenth embodiment, the internal power supply voltage was controlled to decrease by the internal voltage down-converting circuit in the self-refreshing operation. However, this embodiment is not limited thereto. The increase control of the ground potential may be carried out as shown in the second embodiment. Both the decrease control and the increase control may be used.

Fourteenth Embodiment

The fourteenth embodiment will now be described. In the fourteenth embodiment, when the internal power supply voltage is decreased, and the ground potential is increased in the self-refreshing operation, the level of ½ Vcc will not change.

Figure 27:
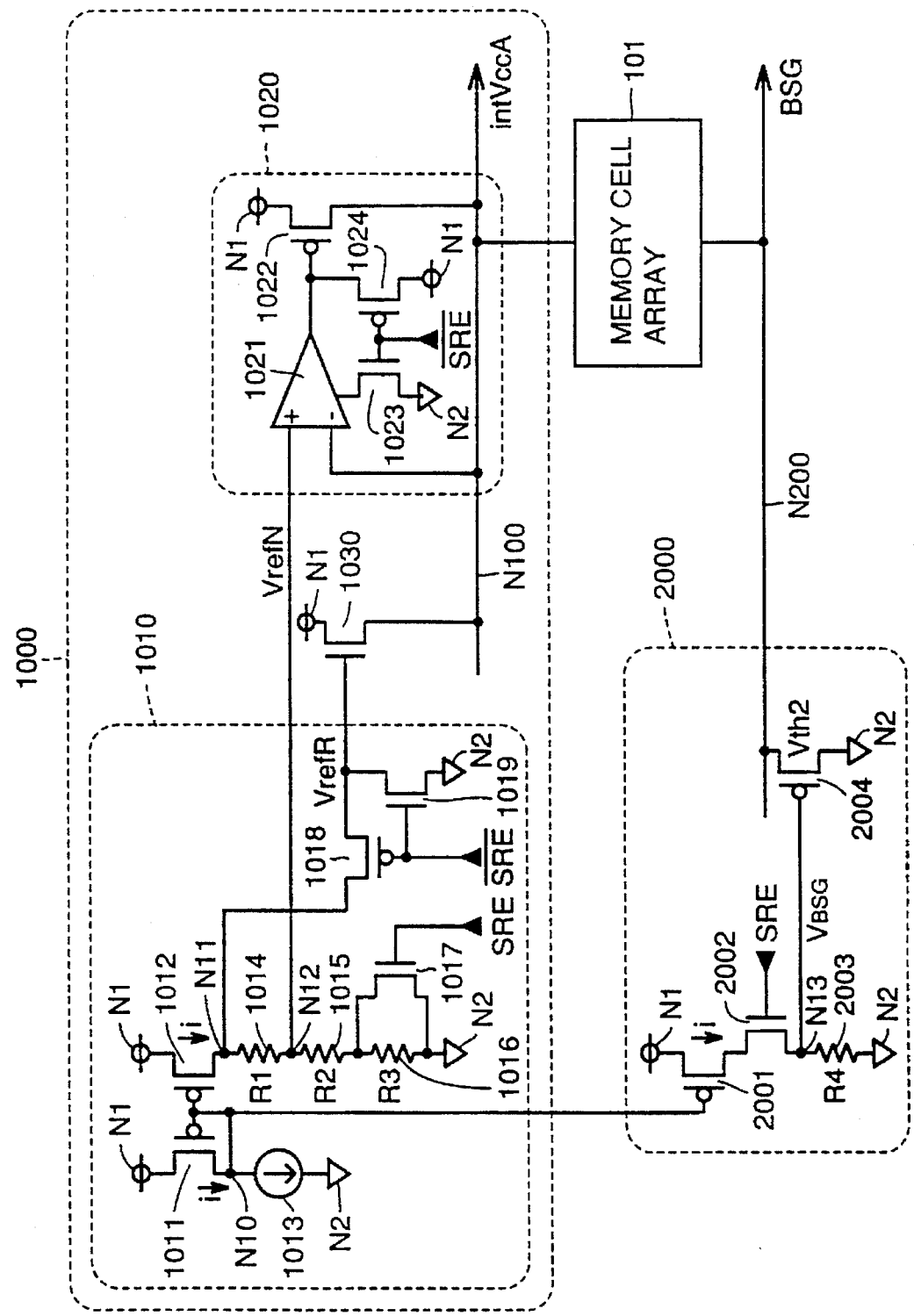
FIG. 27 is a diagram showing a circuit portion regarding self-refreshing of a DRAM according to a fourteenth embodiment.

FIG. 27 is a circuit diagram of a portion regarding self-refreshing of a DRAM according to the fourteenth embodiment.

Referring to FIG. 27, the DRAM includes an internal voltage down-converting circuit 1000, memory cell array 101, and a pseudo GND generating circuit 2000.

Internal voltage down-converting circuit 1000 includes a reference voltage generating circuit 1010, a differential amplifying circuit 1020, and an NMOS transistor 1030.

Reference voltage generating circuit 1010 includes PMOS transistors 1011, 1012, 1018, NMOS transistors 1017, 1019, a constant current source 1013, and resistors 1014, 1015, 1016.

Transistor 1011 and constant current source 1013 are connected in series between external power supply node N1 and ground node N2. Transistor 1012, resistors 1014, 1015 and 1016 are also connected in series between external power supply node N1 and ground node N2. Transistor 1017 is connected between a node between resistors 1015 and 1016, and ground node N2.

Transistors 1011 and 1012 have their gates connected to node N10 between transistor 1011 and constant current source 1013.

Transistor 1030 is connected between external power supply node N1 and an output node N100. Transistor 1018 is connected between a node N11 between transistor 1012 and resistor 1014, and the gate of transistor 1030. Transistor 1019 is connected between the gate of transistor 1030 and ground node N2. A voltage which transistor 1030 receives at its gate is called a refresh time reference voltage VrefR in the following description.

Transistor 1017 receives such a signal SRE as shown in FIG. 1, for example, at its gate. Transistors 1018 and 1019 receive the inverted signal $\overline{SRE}$ of the signal SRE at their gates.

Differential amplifying circuit 1020 includes a differential amplifier 1021, PMOS transistors 1022, 1024, and an NMOS transistor 1023.

Differential amplifier 1021 has its negative side input terminal connected to a node N12, and its positive side input terminal connected to output node N100. As a result, differential amplifier 1021 receives a normal time reference voltage VrefN from node N12, as well as an internal power supply voltage intVccA from output node N100.

Transistor 1022 is connected between external power supply node N1 and output node N100. Transistor 1022 receives the output voltage of differential amplifier 1021 at its gate. Transistor 1024 is connected between external power supply node N1 and the gate of transistor 1022. Transistor 1023 is connected between differential amplifier 1021 and ground node N2. Transistors 1023 and 1024 receive the signal $\overline{SRE}$ at their gates.

Differential amplifying circuit 1020 as configured above has approximately the same configuration as that of FIG. 13. Therefore, differential amplifying circuit 1020 controls the internal power supply voltage intVccA so that the internal power supply voltage intVccA corresponds to the normal time reference voltage VrefN. The internal power supply voltage intVccA is supplied to memory cell array 101 from output node N100.

Such internal voltage down-converting circuit 1000 supplies to memory cell array 101 the internal power supply voltage intVccA based on the normal time reference voltage VrefN when the signal SRE is at the L level. On the other hand, internal voltage down-converting circuit 1000 supplies to memory cell array 101 the internal power supply voltage intVccA based on the refresh time reference voltage VrefR when the signal SRE is at the H level.

Pseudo GND generating circuit 2000 includes PMOS transistors 2001, 2004, an NMOS transistor 2002, and a resistor 2003. Transistors 2001, 2002, and resistor 2003 are connected in series between external power supply node N1 and ground node N2.

Transistor 2004 is connected between an output node N200 and ground node N2. Transistor 2004 has its gate connected to a node N13 between transistor 2002 and resistor 2003. In the following description, the potential which transistor 2004 receives at its gate is referred to as VBSG. Transistor 2001 has its gate connected to node N10. Transistor 2002 receives the signal SRE at its gate.

Such pseudo GND generating circuit 2000 supplies a pseudo GND potential BSG in response to the potential VBSG at node N13 to memory cell array 101 from a node N200. The pseudo GND potential BSG supplies to memory cell array 101 a potential higher when the signal SRE is at the H level than when the signal SRE is at the L level.

Operation of the circuit of FIG. 27 will now be described. In the following description, R1, R2, R3, and R4 denote respective resistance values of resistors 1014, 1015, 1016, and 2003. Assume here that the resistance values R3 and R4 are equal to each other. Further, Vth1 denotes the threshold voltage of transistor 1030, and Vth2 denotes the threshold voltage of transistor 2004. It is also assumed that transistors 1011, 1012, and 2001 are equal to each other in size.

In the circuit of FIG. 27, constant current source 1013 generates a constant current i. Transistors 1011, 1012, and 2001 receive the potential at node N10 at their gates. Therefore, the current i of the same magnitude flows through these transistors.

Operation of internal voltage down-converting circuit 1000 will first be described.

Internal voltage down-converting circuit 1000 operates as follows in the normal operation.

In this case, the signal SRE is at the L level, and the signal $\overline{\text{SRE}}$ is at the H level. Therefore, in reference voltage generating circuit 1010, transistor 1017 is turned off. Therefore, the normal time reference voltage VrefN is i×(R2+R3).

In this case, since transistor 1018 is turned off, and transistor 1019 is turned on, the refresh time reference voltage VrefR attains the ground potential. Therefore, transistor 1030 is not turned on, and the voltage through transistor 1030 is not supplied to output node N100.

In this case, in differential amplifying circuit 1020, transistor 1023 is turned on, and transistor 1024 is turned off. Accordingly, differential amplifying circuit 1020 operates. Therefore, the internal power supply voltage intVccA is controlled by differential amplifying circuit 1020 to be the normal time reference voltage VrefN as represented by the following expression (8):

$$intVccA=VrefN=i\times(R2+R3) \qquad (8)$$

On the other hand, in the self-refreshing operation, internal voltage down-converting circuit 1000 operates as follows. In this case, the signal SRE is at the H level, and the signal $\overline{\text{SRE}}$ is at the L level. Therefore, in differential amplifying circuit 1020, transistor 1023 is turned off, and transistor 1024 is turned on. Therefore, differential amplifying circuit 1020 is halted.

In this case, in reference voltage generating circuit 1010, transistor 1017 is turned on, and resistor 1016 is shorted. Since transistor 1018 is turned on, and transistor 1019 is turned off, the voltage at node N11 is supplied to the gate of transistor 1030 as the refresh time reference voltage VrefR.

In this case, the refresh time reference voltage VrefR is i×(R1+R2). A voltage lower than the refresh time reference voltage VrefR by the threshold voltage Vth1 of transistor 1030 is supplied to output node N100 as the internal power supply voltage intVccA. Therefore, the internal power supply voltage intVccA in this case takes a value represented by the following expression (9):

$$intVccA=VrefR-Vth1=i\times(R1+R2)-Vth1=i\times R2 \qquad (9)$$

Therefore, the level of the internal power supply voltage intVccA in the self-refreshing operation becomes lower than that in the normal operation by i×R3.

Description will now be given of operation of pseudo GND generating circuit 2000.

First, the pseudo GND potential BSG will be described. The pseudo GND potential BSG takes a value represented by the following expression (10):

$$BSG=VBSG+Vth2 \qquad (10)$$

Pseudo GND generating circuit 2000 operates as follows in the normal operation. In this case, since transistor 2002 is turned off, the potential VBSG is 0 V. Therefore, according to the above expression (10), the pseudo GND potential BSG attains the level of Vth2.

On the other hand, pseudo GND generating circuit 2000 operates as follows in the self-refreshing operation. In this case, since transistor 2002 is turned on, the potential VBSG is i×R4. As a result, the pseudo GND potential BSG in the self-refreshing operation takes a value represented by the following expression (11):

$$BSG=i\times R4+Vth2 \qquad (11)$$

As described above, the level of the pseudo GND potential BSG in the self-refreshing operation becomes higher than that in the normal operation by i×R4.

In this case, since the resistance value of resistor 1016 is equal to the resistance value of resistor 2003, the decrease width of the internal power supply voltage intVccA which decreases in the self-refreshing operation becomes equal to the increase width of the pseudo GND potential BSG. Therefore, the level of ½ Vcc in the self-refreshing operation becomes equal to the level of ½ Vcc in the normal operation.

As described above, in the circuit according to the fourteenth embodiment, the level of the internal power supply voltage intVccA is controlled to be lower in the self-refreshing operation than in the normal operation, and the level of the pseudo GND potential BSG is controlled to be higher in the self-refreshing operation than in the normal operation.

As a result, the voltage swing width becomes smaller in the self-refreshing operation than in the normal operation, making it possible to reduce current consumption in the self-refreshing operation.

In addition, in the fourteenth embodiment, the level of ½ Vcc does not change with change of the voltage swing width. The level of ½ Vcc is a potential serving as a reference for reading and writing of data. Therefore, in the fourteenth embodiment, since the level of ½ Vcc does not change when the swing width changes, the semiconductor memory device is not affected by bump at the time of change of the voltage swing width, and the operation is stabilized.

Figure 28:
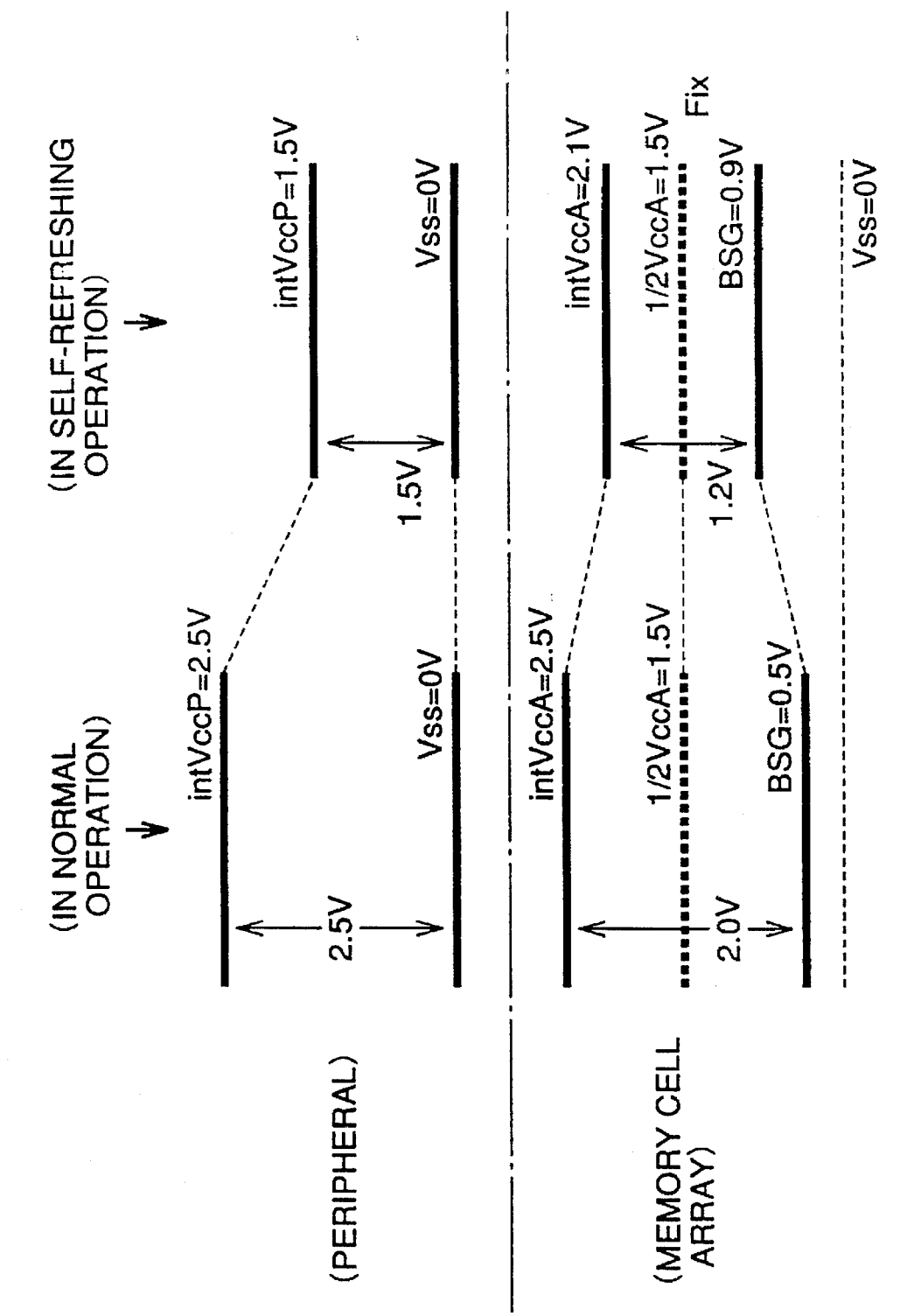
FIG. 28 is a diagram showing one example of a voltage swing width controlled by the circuit of FIG. 27.

FIG. 28 is a diagram showing one example of the voltage swing width controlled by the circuit of FIG. 27. In FIG. 28, a specific example of change of the swing width for the peripheral circuit is shown in the upper section, and a specific example of change of the swing width for memory cell array 101 is shown in the lower section.

As shown in the figure, in memory cell array 101, the voltage swing width changes from 2.0 V in the normal operation to 1.2 V in the self-refreshing operation. In the figure, control of the swing width for the peripheral circuit is carried out by decrease of the internal power supply voltage intVcc. However, the control is not limited thereto. The internal power supply voltage intVccP of the peripheral circuit does not have to be decreased, as far as at least the swing width of memory cell array 101 is decreased.

Fifteenth Embodiment

The fifteenth embodiment will now be described. In the fifteenth embodiment, when the voltage swing width is decreased in a predetermined period in the self-refreshing operation, refreshing is carried out in a refresh cycle shorter than a standard refresh cycle before the swing width is decreased.

Figure 29:
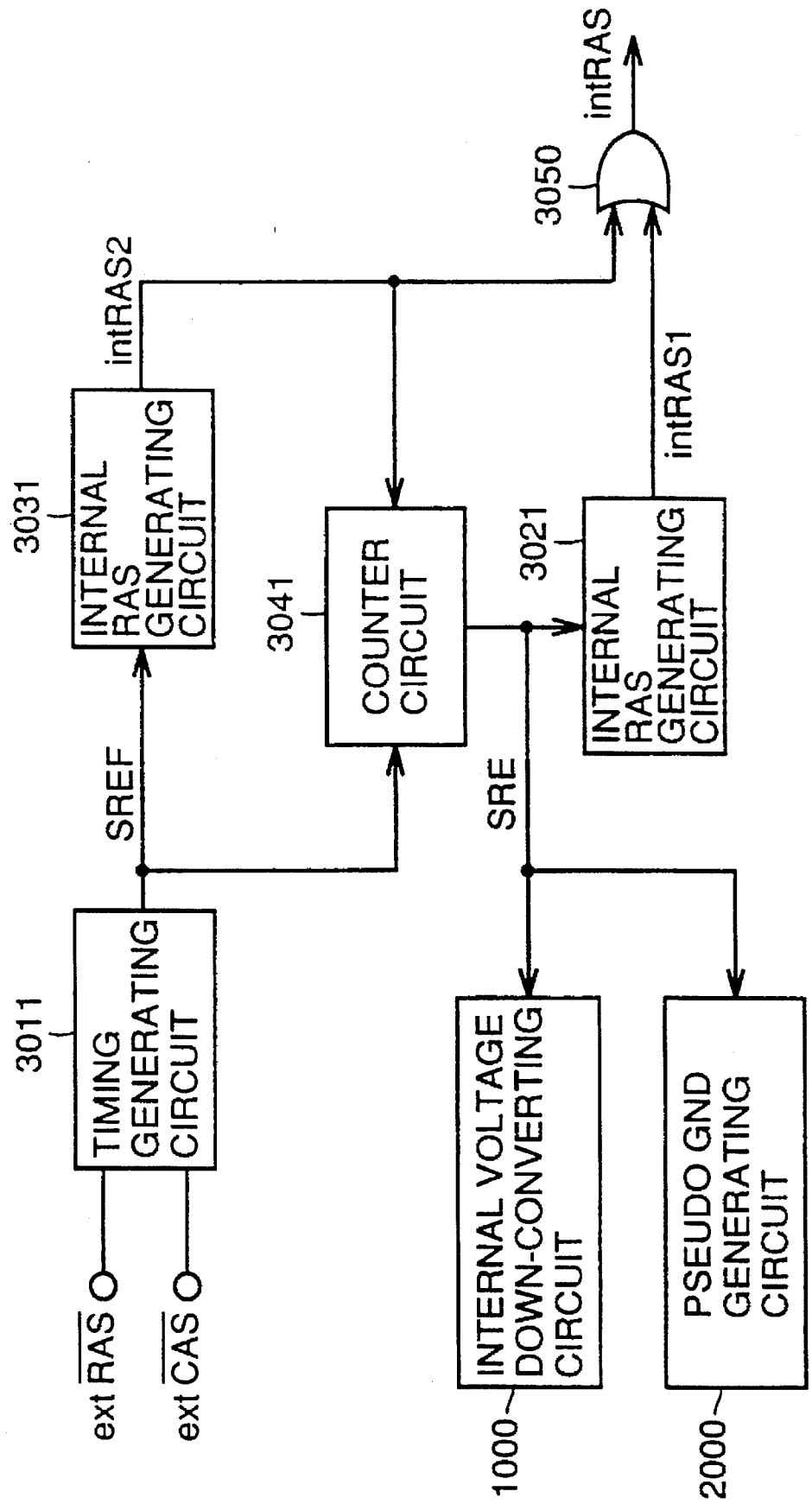
FIG. 29 is a block diagram showing a circuit portion regarding self-refreshing of a DRAM according to a fifteenth embodiment.

FIG. 29 is a block diagram showing a circuit portion regarding self-refreshing of a DRAM according to the fifteenth embodiment. Referring to FIG. 29, the circuit includes a timing generating circuit 3011, internal RAS generating circuits 3021, 3031, a counter circuit 3041, an OR gate 3050, internal voltage down-converting circuit 1000, and pseudo GND generating circuit 2000.

Timing generating circuit 3011 receives the signal ext$\overline{RAS}$ and the signal ext$\overline{CAS}$, and, in response to these signals, generates a signal SREF.

Internal RAS generating circuit 3031 receives the signal SREF, and, in response to the signal, generates for a predetermined period an internal RAS signal intRAS2 which is a pulse signal defining a refresh cycle Tcu relatively shorter the standard refresh cycle.

Counter circuit 3041 receives the signal SREF and the signal intRAS2, and, in response to these signals, generates the signal SRE. In counter circuit 3041, the signal SRE is generated as follows. Counter circuit 3041 starts counting of the signal intRAS2 from the rising of the signal SREF, and pulls up the signal SRE to the H level in response to the count value attaining a predetermined value. Then, counter circuit 3041 pulls down the signal SRE in response to the falling of the signal SREF.

Internal RAS generating circuit 3021 receives the signal SRE, and, in response to the signal, generates an internal RAS signal intRAS1 which is a pulse signal defining the standard refresh cycle Trc. The signal intRAS1 is provided from the rising to the falling of the signal SRE.

Internal voltage down-converting circuit 1000 and pseudo GND generating circuit 2000 are similar to those shown in FIG. 27. Therefore, these circuits carry out such swing width control as described above in response to the signal SRE.

The signal intRAS1 and the signal intRAS2 are provided as the internal row address strobe intRAS via OR gate 3005. Therefore, the signal intRAS is formed into a composite signal of the signal intRAS1 and the signal intRAS2.

Operation of the circuit of FIG. 29 will now be described.

Figure 30:
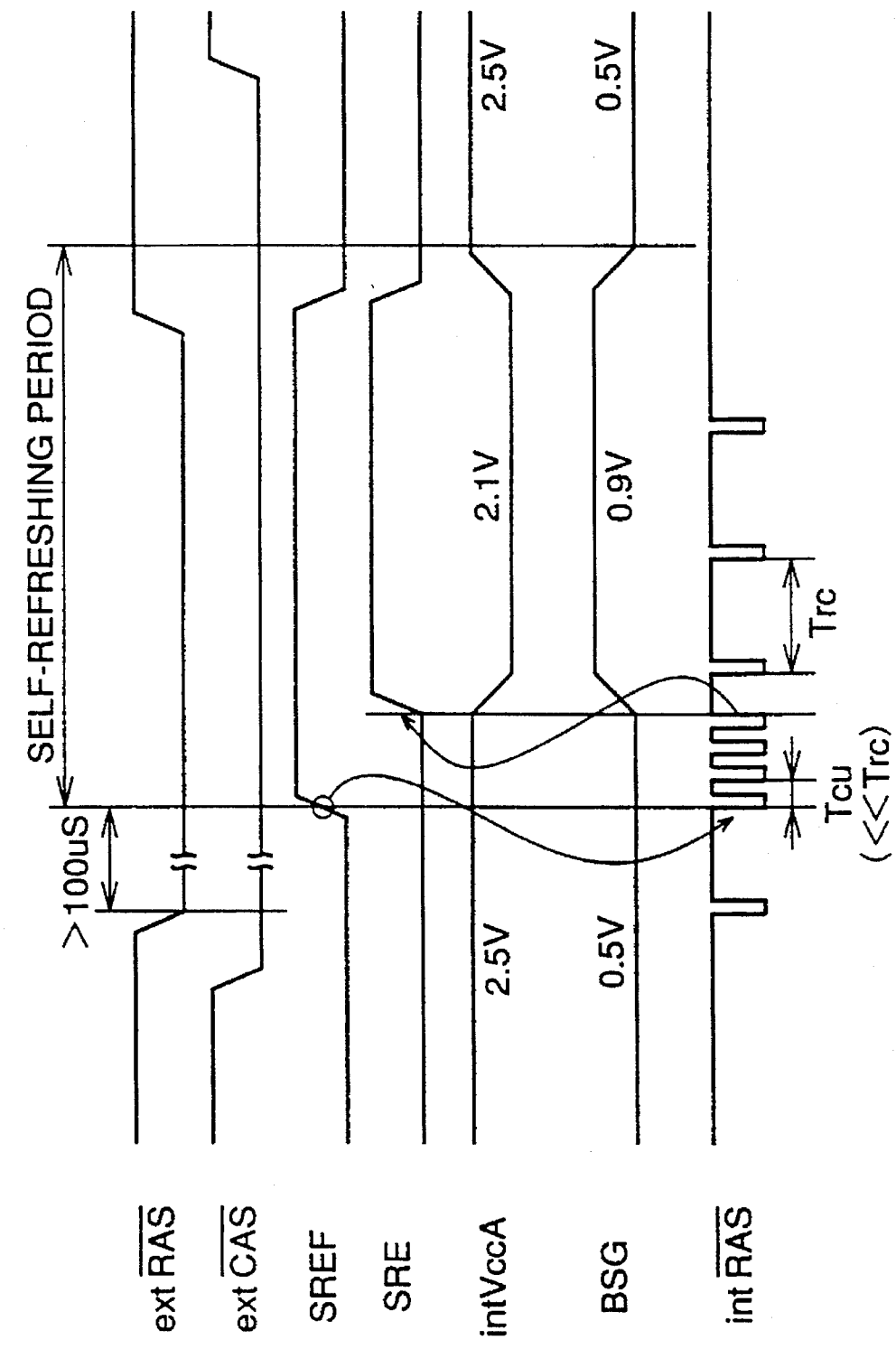
FIG. 30 is a timing chart showing operation timings of the circuit of FIG. 29 in the self-refreshing operation.

FIG. 30 is a timing chart showing operation timings of the circuit of FIG. 29 in the self-refreshing operation. Referring to FIG. 30, when the state after the CBR timing is held for a predetermined period (for example, 100 μs or more), the signal SREF is pulled up to the H level by timing generating circuit 3011, and a period of the self-refreshing operation is started. In response to this, internal RAS generating circuit 3031 starts output of the signal intRAS2. Therefore, the signal intRAS is formed into a signal having the short cycle Tcu.

Then, in response to increment of counter circuit 3041, the signal SRE is pulled up after the signal SREF. Simultaneously with the rising of the signal SRE, output of the signal intRAS2 is stopped, and output of the signal intRAS1 by internal RAS generating circuit 3021 is started. Therefore, simultaneously with the rising of the signal SRE, the cycle of the signal intRAS switches from the short cycle Tcu to the standard cycle Trc.

In response to the rising of the signal SRE, the voltage swing width is decreased by internal voltage down-converting circuit 1000 and pseudo GND generating circuit 2000. Then, the signal ext$\overline{RAS}$ rises to the H level. In response to the rising, the signal SREF falls to the L level. In response to the falling of the signal SREF, the signal SRE is pulled down by counter circuit 3041.

In response to the falling of the signal SRE, the voltage swing width is increased up to a value in the normal operation by internal voltage down-converting circuit 1000 and pseudo GND generating circuit 2000. In this case, the period of the self-refreshing operation is completed at the time when the swing width returns to a value in the normal operation.

In the fifteenth embodiment, the following effects are obtained.

The voltage swing width in the self-refreshing operation is controlled to be smaller than the swing width in the normal operation. As a result, current consumption in the self-refreshing operation can be reduced.

Before start of the self-refreshing operation, a memory cell is in a severe state where stored electric charge is reduced. Therefore, before the self-refreshing operation is carried out, the memory cell is generally refreshed by external complicated control, in order to obtain a state where sufficient electric charge is stored.

However, in the fifteenth embodiment, self-refreshing is carried out in a short cycle before the voltage swing width is decreased. Therefore, such external complicated control as described above is not required. At the beginning of the period of the self-refreshing operation, a refresh ability can be initialized.

Since sufficient electric charge is stored in a memory cell by self-refreshing in such a short cycle, the semiconductor memory device is less likely to be affected by bump which occurs when the voltage swing width is decreased.

Sixteenth Embodiment

The sixteenth embodiment will now be described. In the sixteenth embodiment, when the voltage swing width is decreased in a predetermined period in the self-refreshing operation, refreshing is carried out in a refresh cycle shorter than a standard refresh cycle before the swing width returns to a value in the normal operation.

Figure 31:
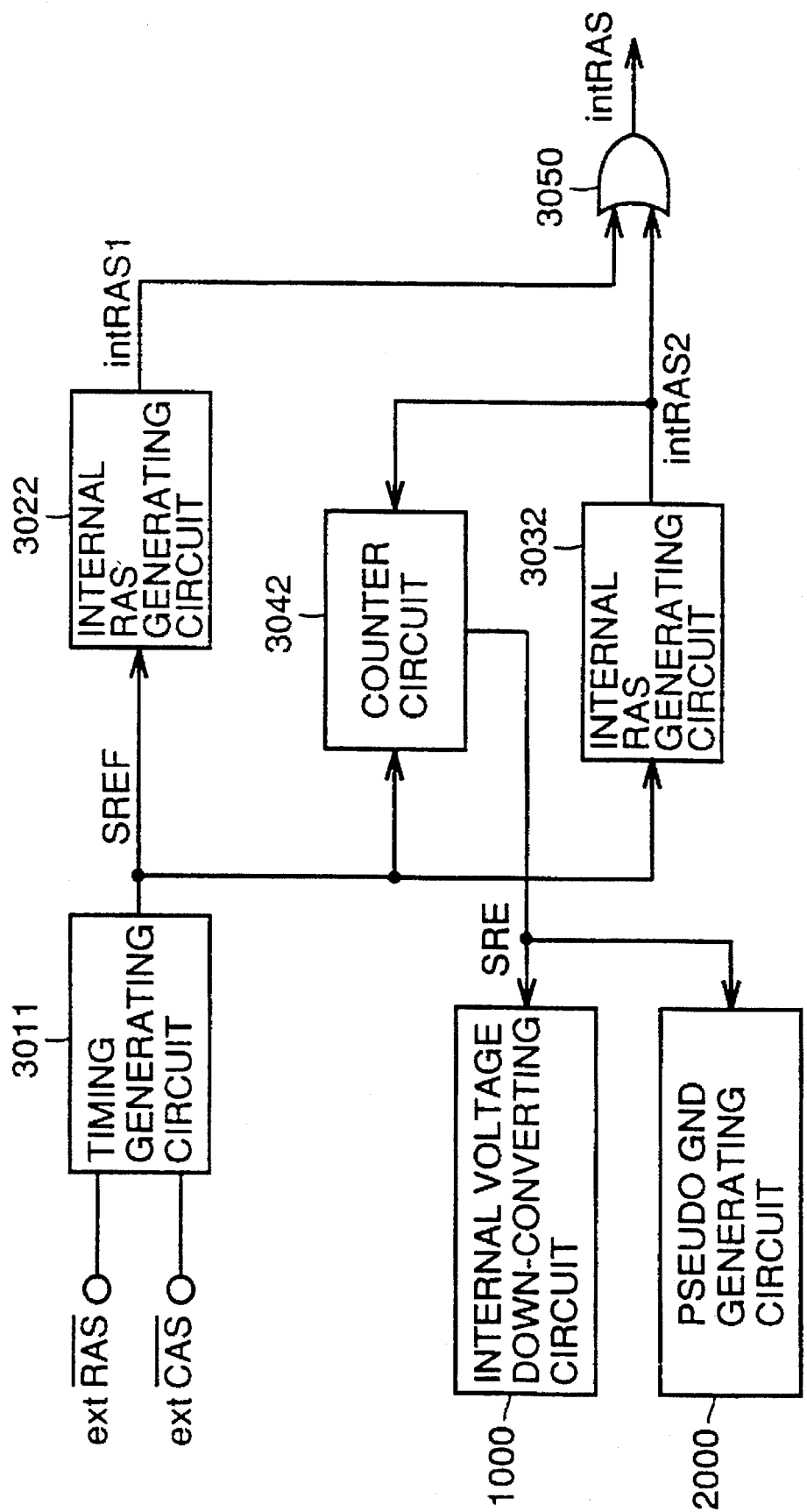
FIG. 31 is a block diagram showing a circuit portion regarding self-refreshing of a DRAM according to a sixteenth embodiment.

FIG. 31 is a block diagram of a circuit portion regarding self-refreshing of a DRAM according to the sixteenth embodiment. In the circuit of FIG. 31, the same reference characters denote the same or corresponding portions of FIG. 29, and the description thereof will not be repeated.

Referring to FIG. 31, the circuit includes timing generating circuit 3011, internal RAS generating circuits 3022, 3032, counter circuit 3042, OR gate 3050, internal voltage down-converting circuit 1000, and pseudo GND generating circuit 2000.

Internal RAS generating circuit 3022 receives the signal SREF, and, in response to the signal, generates an internal RAS signal intRAS1 which is a pulse signal defining the standard refresh cycle Trc. The signal intRAS1 is provided from the rising to the falling of the signal SREF.

Internal RAS generating circuit 3032 receives the signal SRE, and, in response to the signal, generates for a predetermined period an internal RAS signal intRAS2 which is a pulse signal defining the refresh cycle Tcu which is relatively shorter than the standard refresh cycle Trc.

Counter circuit 3042 receives the signal SREF and the signal intRAS2, and, in response to these signals, generates the signal SRE. Counter circuit 3042 generates the signal SRE as follows. Counter circuit 3042 pulls up the signal SRE to the H level in response to the rising of the signal SREF. Counter circuit 3042 starts counting of the signal intRAS2 from the rising of the signal SREF, and pulls down the signal SRE to the L level in response to the count value attaining a predetermined value.

Operation of the circuit of FIG. 31 will now be described.

Figure 32:
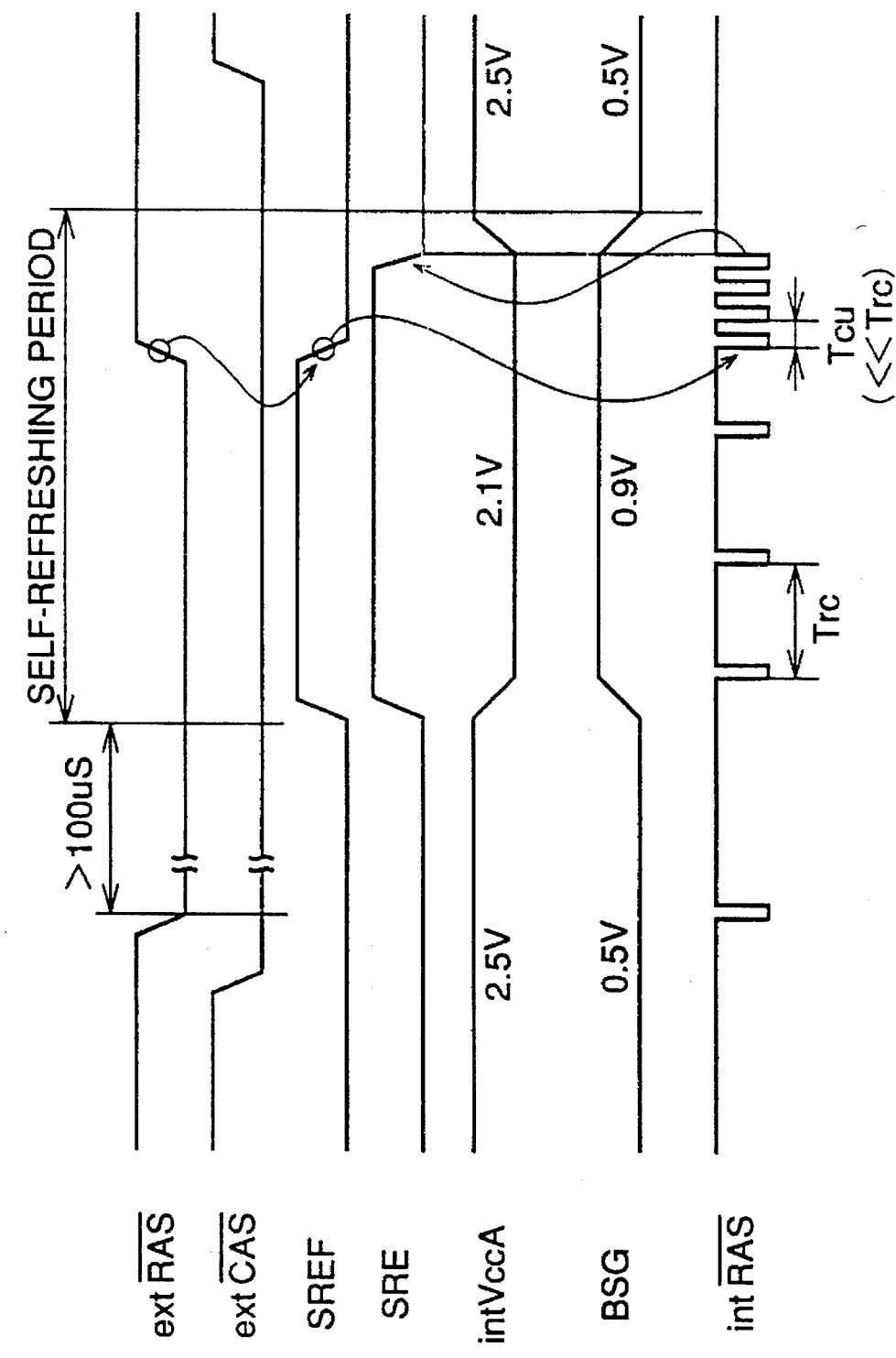
FIG. 32 is a timing chart showing operation timings of the circuit of FIG. 31 in the self-refreshing operation.

FIG. 32 is a timing chart showing operation timings of the circuit of FIG. 31 in the self-refreshing operation.

Referring to FIG. 32, in response to the rising of the signal SREF, internal RAS generating circuit 3022 starts output of the signal intRAS1. Therefore, the signal intRAS becomes a signal having the standard cycle Trc. Simultaneously, in response to the rising of the signal SREF, counter circuit 3042 pulls up the signal SRE to the H level.

In response to the rising of the signal SRE, the voltage swing width is decreased by internal voltage down-converting circuit 1000 and pseudo GND generating circuit 2000.

Then, the signal extRAS rises to the H level. In response to this, the signal SREF falls to the L level. In response to the falling of the signal SREF, output of the signal intRAS1 is stopped and output of the signal intRAS2 is started by internal RAS generating circuit 3032. Therefore, in response to the falling of the signal SREF, the cycle of the signal intRAS switches from the standard cycle Trc to the short cycle Tcu.

In response to the falling of the signal SREF, counter circuit 3042 starts counting of the signal intRAS2. Then, in response to increment of counter circuit 3042, the signal SRE falls to the L level.

In response to the falling of the signal SRE, the voltage swing width is increased by internal voltage down-converting circuit 1000 and pseudo GND generating circuit 2000 so that the voltage swing width returns to a value in the normal operation. In this case, simultaneously with completion of a period of the short cycle Tcu of the signal intRAS, increase in the voltage swing width is started.

As described above, the period of the self-refreshing operation is completed at the time when the swing width returns to a value in the normal operation.

In the sixteenth embodiment, the following effects are obtained.

By controlling the voltage swing width in the self-refreshing operation, current consumption in the self-refreshing operation can be reduced, similar to the case of the fifteenth embodiment.

Before the voltage swing width is increased up to a value in the normal operation, some memory cells are in a severe state where stored electric charge is reduced. Therefore, when the voltage swing width is increased in these memory cells in such a severe state, the memory cells are likely to be affected by bump.

However, according to the sixteenth embodiment, self-refreshing is carried out in a short cycle before the voltage swing width is increased. Therefore, all memory cells have sufficient stored charge before increase of the swing width. Therefore, the semiconductor memory device is less likely to be affected by bump when the voltage swing width is increased.

Seventeenth Embodiment

The seventeenth embodiment will now be described. In the seventeenth embodiment, when the voltage swing width is decreased in a predetermined period in the self-refreshing operation, refreshing is carried out in a refresh cycle shorter than the standard refresh cycle after the swing width returns to a value in the normal operation.

Figure 33:
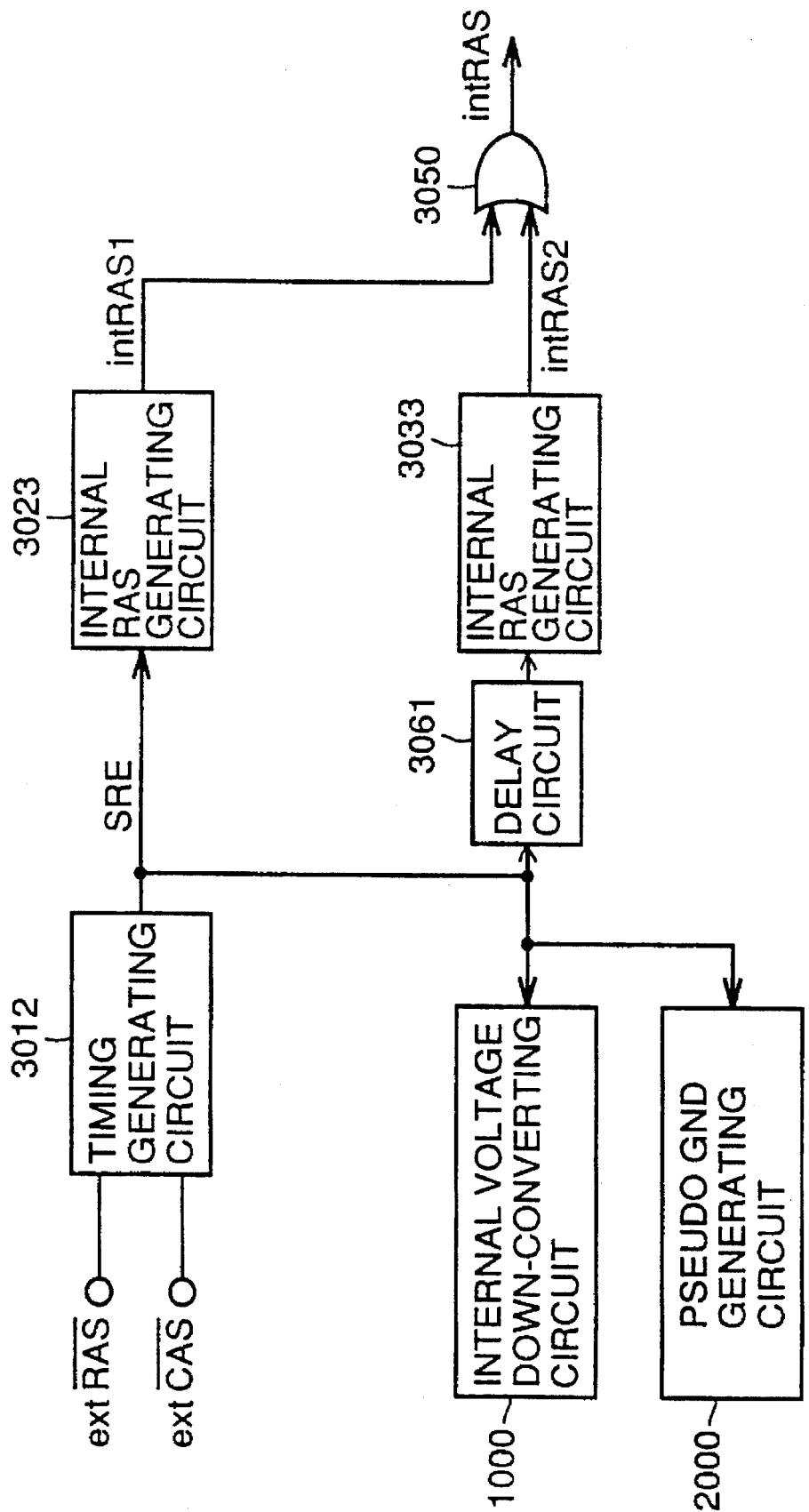
FIG. 33 is a block diagram showing a circuit portion regarding self-refreshing of a DRAM according to a seventeenth embodiment.

FIG. 33 is a block diagram of a circuit portion regarding self-refreshing of a DRAM according to the seventeenth embodiment. In FIG. 33, the same reference characters denote the same or corresponding portions of FIG. 29, and the description will not be repeated.

Referring to FIG. 33, the circuit includes a timing generating circuit 3012, internal RAS generating circuits 3023, 3033, OR gate 3050, a delay circuit 3061, internal voltage down-converting circuit 1000, and pseudo GND generating circuit 2000.

Timing generating circuit 3012 receives the signal ext RAS and the signal extCAS, and, in response to these signals, generates the signal SRE.

Internal RAS generating circuit 3023 receives the signal SRE, and, in response to the signal, generates the internal RAS signal intRAS1 defining the cycle Trc. The signal intRAS1 is provided from the rising to the falling of the signal SRE.

Delay circuit 3061 delays the signal SRE by a predetermined period, and applies the delayed signal to internal RAS generating circuit 3033. Internal RAS generating circuit 3033 receives the delayed signal SRE, and, in response to the signal, generates the internal RAS signal intRAS2 defining the cycle Tcu. The signal intRAS2 is generated for a predetermined period from the falling of the delayed signal SRE.

Operation of the circuit of FIG. 33 will now be described.

Figure 34:
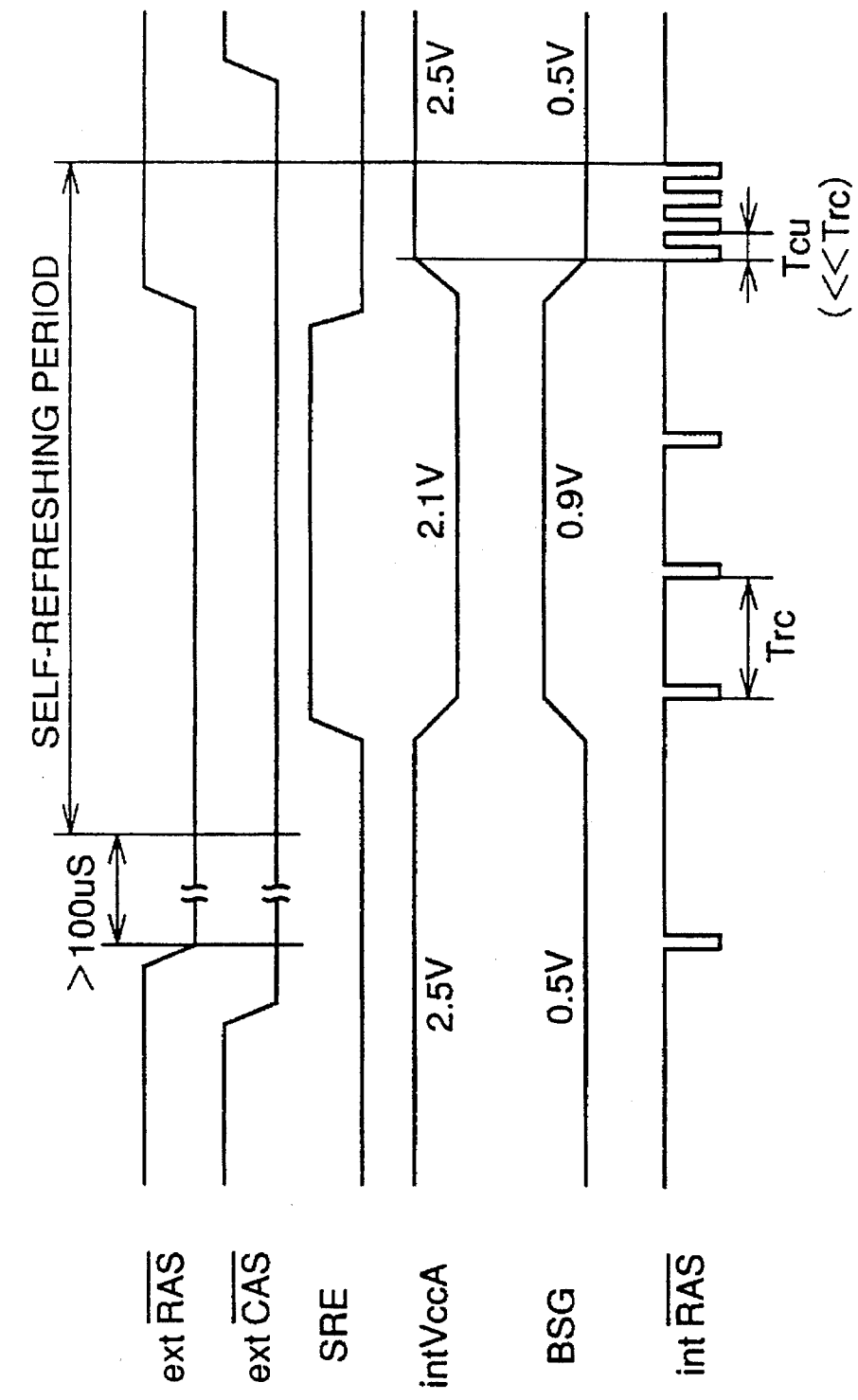
FIG. 34 is a timing chart showing operation timings of the circuit of FIG. 33 in the self-refreshing operation.

FIG. 34 is a timing chart showing operation timings of the circuit of FIG. 33 in the self-refreshing operation.

Referring to FIG. 33, after the CBR timing, the signal SRE is pulled up to the H level by timing generating circuit 3012. A period of the self-refreshing operation in this case starts when the state after the CBR timing is held for a predetermined period (for example, 100 μs or more).

In response to the rising of the signal SRE, internal RAS generating circuit 3023 starts output of the signal intRAS1. Therefore, the signal intRAS is formed into a signal having the standard cycle Trc.

Simultaneously, in response to the rising of the signal SREF, the voltage swing width is decreased by internal voltage down-converting circuit 1000 and pseudo GND generating circuit 2000.

Then, the signal extRAS rises to the H level. In response to this, the signal SRE falls to the L level. In response to the falling of the signal SRE, output of the signal intRAS1 is stopped. At the same time, the voltage swing width starts to be increased to a value in the normal operation by internal voltage down-converting circuit 1000 and pseudo GND generating circuit 2000.

Delay circuit 3061 delays the signal SRE for a period from start to completion of increase of the voltage swing width. Therefore, the delayed signal SRE to be applied to internal RAS generating circuit 3033 falls to the L level when increase of the voltage swing width is completed.

In internal RAS generating circuit 3033, in response to the falling of the signal SRE, output of the signal intRAS2 is started. Therefore, the signal intRAS is formed into a signal having the short cycle Tcu for a predetermined period from completion of increase of the voltage swing width.

When such output of the signal intRAS2 is stopped, the period of the self-refreshing operation in this case is completed.

In the seventeenth embodiment, the following effects are obtained.

By controlling the voltage swing width in the self-refreshing operation, current consumption in the self-refreshing operation can be reduced.

Some memory cells are in a severe state where stored electric charge is reduced before transition from the self-refreshing operation to the normal operation. Therefore, before transition from the self-refreshing operation to the normal operation, refreshing is generally carried out by external control so as to implement the state where all memory cells have sufficient stored charge.

However, according to the seventeenth embodiment, after completion of increase of the voltage swing width, self-refreshing is carried out in a short cycle. Therefore, such external complicated control as described above is not required. Therefore, immediately before completion of the self-refreshing operation, a refresh ability can be initialized.

Eighteenth Embodiment

The eighteenth embodiment will now be described. In the eighteenth embodiment, when the voltage swing width is decreased in a predetermined period in the self-refreshing operation, refreshing is carried out in a refresh cycle shorter than the standard refresh cycle immediately after the swing width is decreased.

Figure 35:
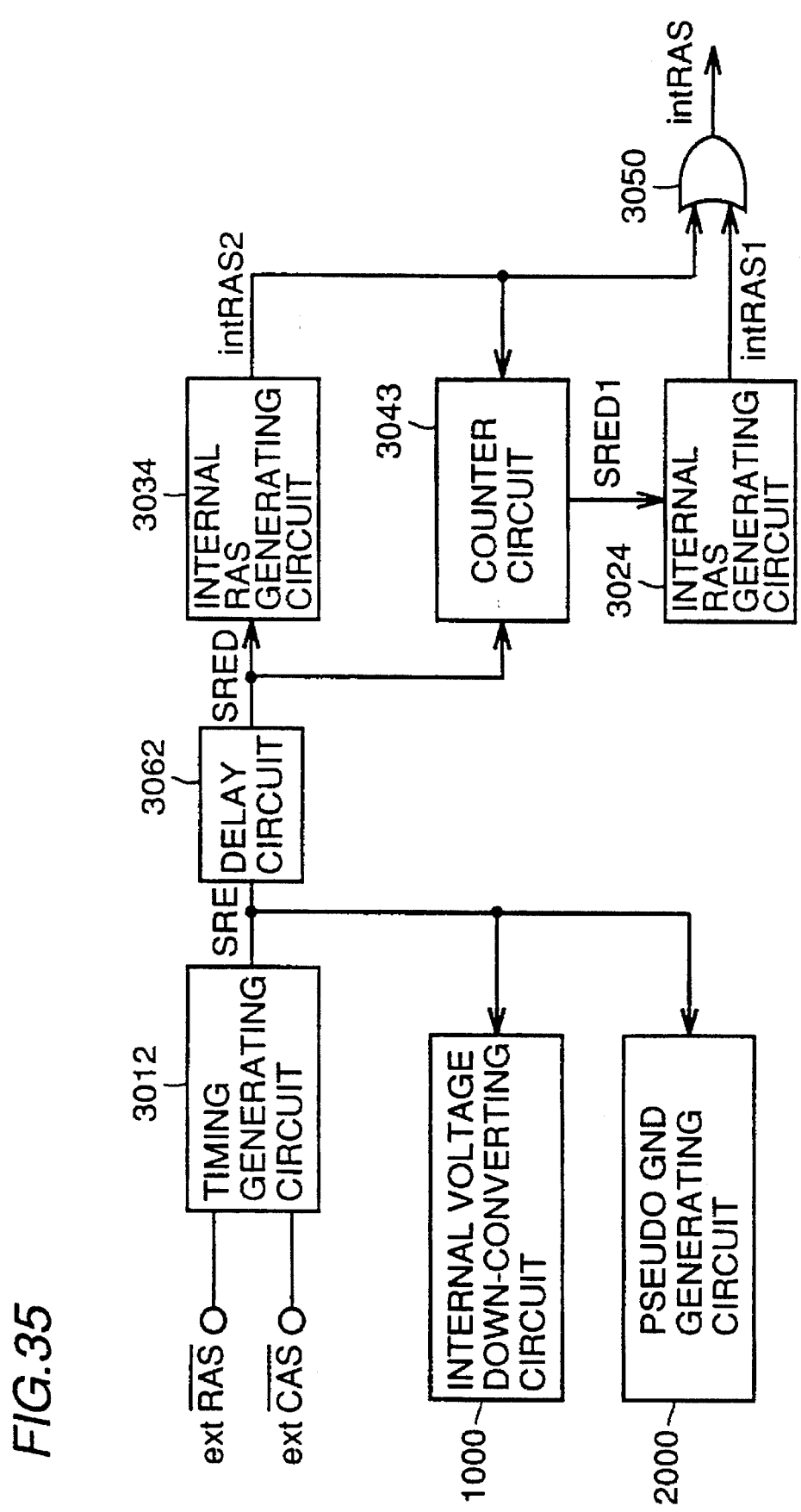
FIG. 35 is a block diagram showing a circuit portion regarding self-refreshing of a DRAM according to an eighteenth embodiment.

FIG. 35 is a block diagram of a circuit portion regarding self-refreshing of a DRAM according to the eighteenth embodiment. In FIG. 35, the same reference characters denote the same or corresponding portions of FIG. 33, and the description thereof will not be repeated.

Referring to FIG. 35, the circuit includes timing generating circuit 3012, internal RAS generating circuits 3024, 3034, a counter circuit 3043, OR gate 3050, delay circuit 3062, internal voltage down-converting circuit 1000, and pseudo GND generating circuit 2000.

Internal RAS generating circuit 3034 receives the signal SRE, and, in response to the signal, generates for a predetermined period the signal intRAS which is a pulse signal defining the short refresh cycle Tcu.

Delay circuit 3062 generates the signal SRED obtained by delaying the signal SRE by the same period as the period from start to completion of decrease of the voltage swing width. Internal RAS generating circuit 3034 receives the signal SRED, and, in response to the signal, generates for a predetermined period the signal intRAS2 which is a pulse signal defining the short refresh cycle Tcu.

Counter circuit 3043 receives the signal SRED and the signal intRAS2, and, in response to these signals, generates a signal SRED1 for operating internal RAS generating circuit 3024.

In counter circuit 3043, the signal SRED1 is generated as follows. Counter circuit 3043 starts counting the signal intRAS2 from the rising of the signal SRED, and pulls up the signal SRED1 to the H level in response to the count value attaining a predetermined value. In response to the falling of the signal SRED, counter circuit 3043 pulls down the signal SRED1.

Internal RAS generating circuit 3024 receives the signal SRED1, and, in response to the signal, generates the signal intRAS1 which is a pulse signal defining the standard refresh cycle Trc. The signal intRAS1 is provided from the rising to the falling of the signal SRED1.

Operation of the circuit of FIG. 35 will be described.

Figure 36:
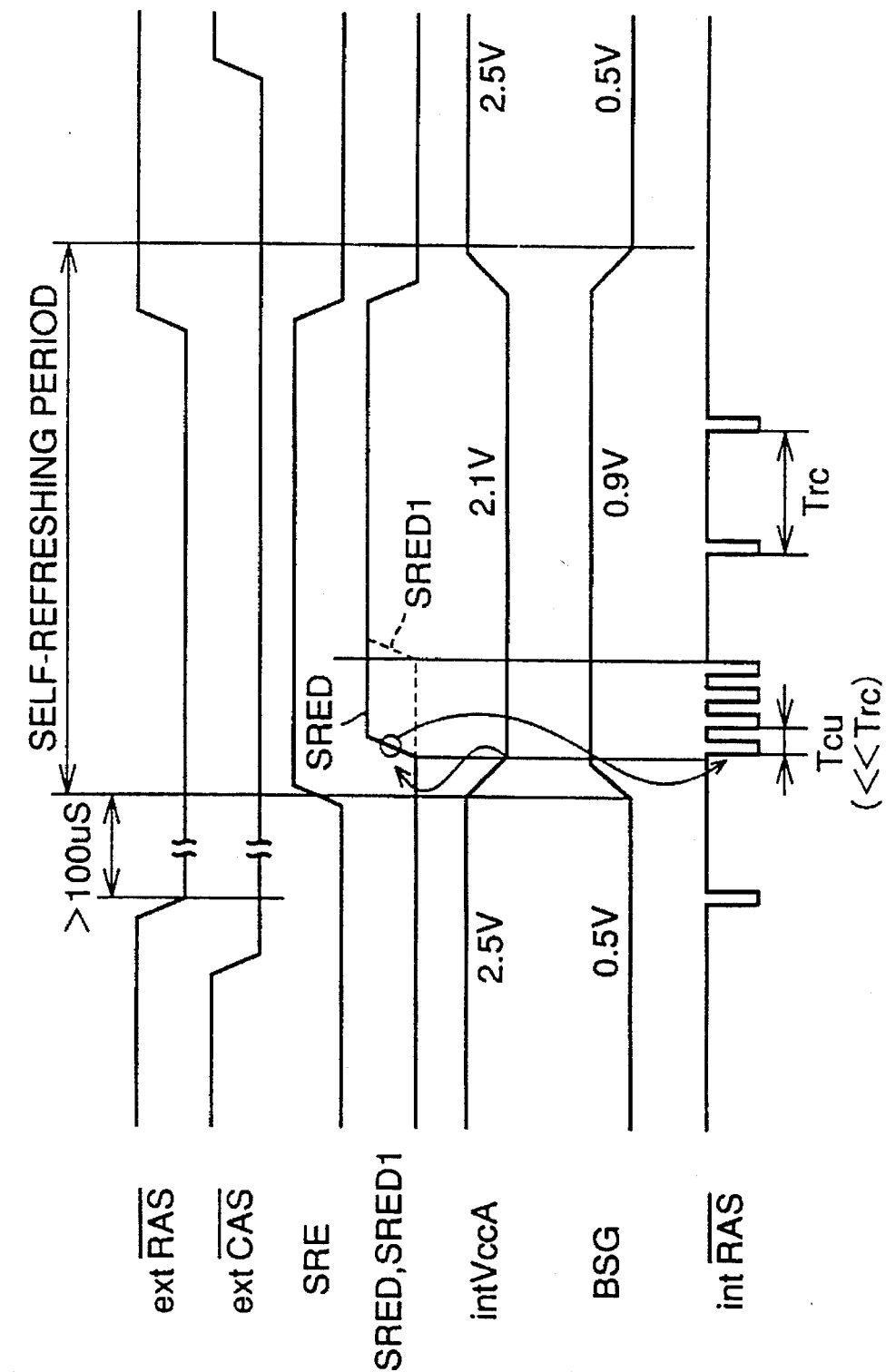
FIG. 36 is a timing chart showing operation timings of the circuit of FIG. 35 in the self-refreshing operation.
Figure 37:
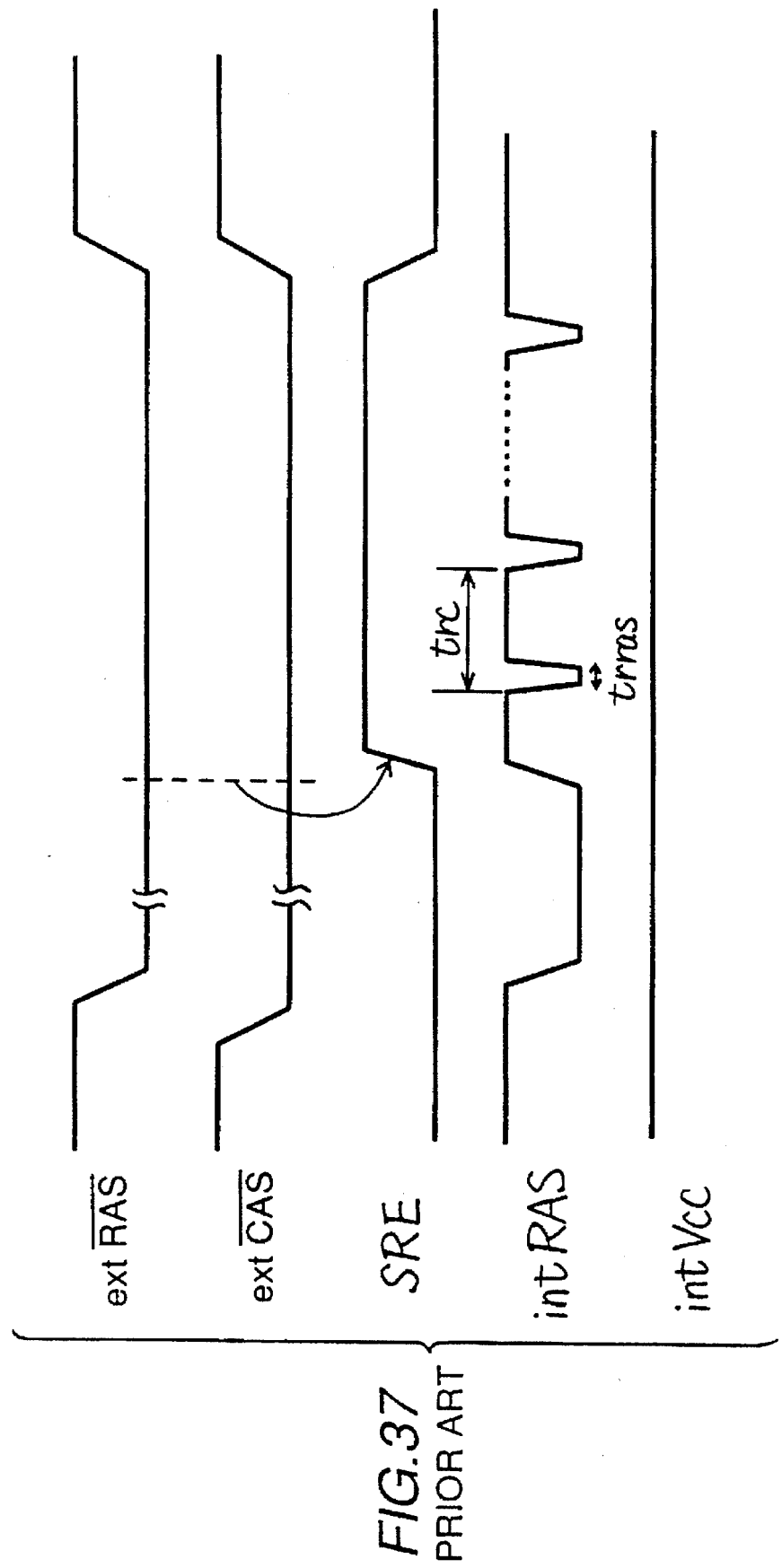
FIG. 37 is a timing chart showing one example of timings in a conventional self-refreshing operation.

FIG. 36 is a timing chart showing operation timings of the circuit of FIG. 35 in the self-refreshing operation. Referring to FIG. 36, when the state after the CBR timing is held for a predetermined period, the signal SRE is pulled up to the H level by timing generating circuit 3012, and a period of the self-refreshing operation is started.

In response to the rising of the signal SRE, the voltage swing width starts to be decreased by internal voltage down-converting circuit 1000 and pseudo GND generating circuit 2000. Simultaneously with completion of decrease of the voltage swing width, the signal SRED rises to the H level.

In response to the rising of the signal SRED, internal RAS generating circuit 3034 starts output of the signal intRAS2. Therefore, the signal intRAS is formed into a signal having the shorter cycle Tcu.

Then, in response to increment of counter circuit 3043, the signal SRED1 rises. Simultaneously with the rising of the signal SRED1, output of the signal intRAS2 is stopped, and output of the signal intRAS1 is started by internal RAS generating circuit 3024. Therefore, simultaneously with the rising of the signal SRED1, the cycle of the signal intRAS switches from the short cycle Tcu to the standard cycle Trc.

Then, in response to the rising of the signal extRAS, the signal SRE falls to the L level. In response to this, the voltage swing width is increased up to a value in the normal operation by internal voltage down-converting circuit 1000 and pseudo GND generating circuit 2000. In response to the falling of the signal SRE, the signal SRED1 falls. In response to the falling, output of the signal intRAS1 is stopped.

In this case, the period of the self-refreshing operation is completed when the voltage swing width returns to a value in the normal operation.

In the eighteenth embodiment, the following effects are obtained.

At the beginning of the self-refreshing operation, the state where sufficient electric charge is stored in memory cells, making it possible to initialize a refresh ability.

In the eighteenth embodiment, refreshing in a short cycle was carried out immediately after completion of decrease of the voltage swing width. However, this embodiment is not limited thereto. Even if such self-refreshing in a short cycle is carried out at the beginning of the self-refreshing operation in which the voltage swing width is not changed, a refresh ability can be initialized similarly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device carrying out a normal operation and a self-refreshing operation based on a voltage swing having a swing width defined by an internal power supply potential difference, comprising:

self-refresh period defining means for generating a self-refresh period definition signal defining a period in which said self-refreshing operation is carried out;

one or a plurality of internal power supply voltage generating means for generating said internal power supply potential difference, and responsive to said self-refresh period definition signal for controlling the internal power supply potential difference to be generated, at least one said internal power supply voltage generating means being responsive to start of the period defined by said self-refresh period definition signal for carrying out control to decrease the internal power supply potential difference to be generated from a first potential difference to a second potential difference, and being responsive to completion of the period defined by said self-refresh period definition signal for carrying out control to increase the internal power supply potential difference to be generated from said second potential difference to said first potential difference;

decrease period definition signal generating means for generating a decrease period definition signal activated in a period in which said internal power supply potential difference is decreased from said first potential difference to said second potential difference by said internal power supply voltage generating means;

increase period definition signal generating means for generating an increase period definition signal activated in a period in which said internal power supply potential difference is increased from said second potential difference to said first potential difference by said internal power supply voltage generating means;

hold period definition signal generating means for generating a hold period definition signal activated in a period in which said internal power supply potential difference is held at said second potential difference by said internal power supply voltage generating means; and refresh cycle setting means responsive to said decrease period definition signal, said increase period definition signal, and said hold period definition for setting a refresh cycle in said self-refreshing operation, wherein said refresh cycle setting means includes first refresh cycle setting means responsive to said decrease period definition signal for setting a first refresh cycle, second refresh cycle setting means responsive to said increase period definition signal for setting a second refresh cycle, and third refresh cycle setting means responsive to said hold period definition signal for setting a third refresh cycle, said first and second refresh cycles being set shorter than said third refresh cycle.

2. The semiconductor memory device as recited in claim 1, wherein said first refresh cycle and said second refresh cycle set by said refresh cycle setting means are different.

3. A semiconductor memory device carrying out a normal operation and a self-refreshing operation based on a voltage swing having a swing width defined by an internal power supply potential difference, comprising;

self-refresh period defining means for generating a self-refresh period definition signal defining a period in which said self-refreshing operation is carried out;

one or a plurality of internal power supply voltage generating means for generating said internal power supply potential difference, and responsive to said self-refresh period definition signal for controlling the internal power supply potential difference to be generated, at least one said internal power supply voltage generating means being responsive to start of the period defined by said self-refresh period definition signal for carrying out control to decrease the internal power supply potential difference to be generated from a first potential difference to a second potential difference, and being responsive to completion of the period defined by said self-refresh period definition signal for carrying out control to increase the internal power supply potential difference to be generated from said second potential difference to said first potential difference, wherein said internal power supply voltage generating means includes voltage control means for controlling the internal power supply potential difference to decrease from said first potential difference to said second potential difference and to increase from said second potential difference to said first potential difference in a plurality of steps.

4. The semiconductor memory device as recited in claim 3, wherein said internal power supply voltage generating means carries out one step of increase and decrease of said internal power supply potential difference in a period which is a multiple of a cycle in which all memory cells are refreshed.

5. A semiconductor memory device carrying out a normal operation and a self-refreshing operation based on a voltage swing having a swing width defined by an internal power supply potential difference, comprising;

self-refresh period defining means for generating a self-refresh period definition signal defining a period in which said self-refreshing operation is carried out;

one or a plurality of internal power supply voltage generating means for generating said internal power supply potential difference, and responsive to said self-refresh period definition signal for controlling the internal power supply potential difference to be generated, at least one said internal power supply voltage generating means being responsive to start of the period defined by said self-refresh period definition signal for carrying out control to decrease the internal power supply potential difference to be generated from a first potential difference to a second potential difference, and being responsive to completion of the period defined by said self-refresh period definition signal for carrying out control to increase the internal power supply potential difference to be generated from said second potential difference to said first potential difference, wherein at least one said internal power supply voltage generating means includes reference voltage generating means for generating a reference voltage of the internal power supply voltage, differential amplifying means based on a difference between the internal power supply voltage to be generated and said reference voltage for providing a control voltage for controlling said internal power supply voltage, halting means responsive to said self-refresh period definition signal for halting operation of said differential amplifying means in the period of the self-refreshing operation defined by the signal, a voltage output node for providing said internal power supply voltage, a power supply node receiving an external power supply voltage, an N channel transistor provided between said power supply node and said voltage output node and responsive to a voltage it receives at its gate electrode for supplying the internal power supply voltage based on said external power supply voltage to said voltage output node, and transistor control means responsive to said self-refresh period definition signal for applying said reference voltage to said gate electrode of said N channel transistor in the period of the self-refreshing operation defined by the signal.

6. A semiconductor memory device carrying out a normal operation and a self-refreshing operation based on a voltage swing having a swing width defined by an internal power supply potential difference, comprising:
- self-refresh period defining means for generating a self-refresh period definition signal defining a period in which said self-refreshing operation is carried out;
- one or a plurality of internal power supply voltage generating means for generating said internal power supply potential difference, and responsive to said self-refresh period definition signal for controlling the internal power supply potential difference to be generated, at least one said internal power supply voltage generating means being responsive to start of the period defined by said self-refresh period definition signal for carrying out control to decrease the internal power supply potential difference to be generated from a first potential difference to a second potential difference, and being responsive to completion of the period defined by said self-refresh period definition signal for carrying out control to increase the internal power supply potential difference to be generated from said second potential difference to said first potential difference; and
- boosted voltage generating means for generating a boosted voltage, wherein
  - said boosted voltage generating means includes
    - ring oscillating means for oscillating a pulse signal,
    - pumping means responsive to said pulse signal for providing the boosted voltage, and
    - frequency changing means responsive to said self-refresh period definition signal for making lower a frequency of the pulse signal oscillated by said ring oscillating means in the period of the self-refreshing operation defined by the signal than in said normal operation.

7. A semiconductor memory device carrying out a normal operation and a self-refreshing operation based on a voltage swing having a swing width defined by an internal power supply potential difference, comprising:
- self-refresh period defining means for generating a self-refresh period definition signal defining a period in which said self-refreshing operation is carried out;
- one or a plurality of internal power supply voltage generating means for generating said internal power supply potential difference, and responsive to said self-refresh period definition signal for controlling the internal power supply potential difference to be generated, at least one said internal power supply voltage generating means being responsive to start of the period defined by said self-refresh period definition signal for carrying out control to decrease the internal power supply potential difference to be generated from a first potential difference to a second potential difference, and being responsive to completion of the period defined by said self-refresh period definition signal for carrying out control to increase the internal power supply potential difference to be generated from said second potential difference to said first potential difference;
- comparing means for comparing the internal power supply potential difference to be generated by said internal power supply voltage generating means and a predetermined potential difference and activating an output signal when said internal power supply voltage becomes approximately equal to said predetermined potential difference; and
- external output means for receiving the output signal of said comparing means, and, when the signal is activated, providing to the outside world a signal at a predetermined level indicating that said internal power supply potential difference has returned to a potential difference in said normal operation.

8. A semiconductor memory device carrying out a self-refreshing operation based on an internal power supply voltage, comprising:
- a power supply node receiving an external power supply voltage;
- self-refresh period defining means for generating a self-refresh period definition signal defining a period in which said self-refreshing operation is carried out; and
- internal voltage down-converting means for down-converting said external power supply voltage and generating said internal power supply voltage, wherein
- said internal voltage down-converting means includes reference voltage generating means for generating a reference voltage of said internal power supply voltage,
- said reference voltage generating means includes
  - an output node for providing said reference voltage,
  - first reference voltage supplying means for supplying a first constant reference voltage to said output node,
  - second reference voltage supplying means receiving said external power supply voltage for, when said external power supply voltage attains a predetermined level or more for a burn-in test, supplying a second reference voltage in response to said external power supply voltage to said output node, and
  - supply stopping means receiving said self-refresh period definition signal for stopping supply of said external power supply voltage to said second reference voltage supplying means in the period of the self-refreshing operation defined by the signal.

9. A semiconductor memory device having a memory cell array and a peripheral circuit and carrying out a normal operation and a self-refreshing operation based on an internal power supply voltage, comprising:
- first internal power supply voltage generating means for generating a first internal power supply voltage to be supplied to said memory cell array;
- second internal power supply voltage generating means for generating a second internal power supply voltage to be supplied to said peripheral circuit;
- first voltage control means for controlling said first internal power supply voltage generated by said first internal power supply voltage generating means to be lower in said self-refreshing operation than in said normal operation; and
- second voltage control means for controlling said second internal power supply voltage generated by said second internal power supply voltage generating means to be lower in said self-refreshing operation than in said normal operation.

10. A semiconductor memory device carrying out a normal operation and a self-refreshing operation based on an internal power supply voltage and a boosted voltage obtained by boosting the internal power supply voltage, comprising:
- self-refresh period defining means for generating a self-refresh period definition signal defining a period in which said self-refreshing operation is carried out; and
- boosted voltage generating means for generating the boosted voltage obtained by boosting said internal power supply voltage, wherein
- said boosted voltage generating means includes
  - a reference power supply node receiving a predetermined reference power supply voltage, a boosted voltage output node for providing the generated boosted voltage, ring oscillating means responsive to said self-refresh period definition signal for oscillating a pulse signal in said normal operation and stopping oscillation of said pulse signal in said self-refreshing operation, pumping means responsive to said pulse signal for supplying the boosted voltage to said boosted voltage output node, cutting-off means responsive to said self-refresh period definition signal for cutting off supply of the boosted voltage from said pumping means to said boosted voltage output node in said self-refreshing operation, and an N channel transistor provided between said reference power supply node and said boosted voltage output node and rendered conductive in said self-refreshing operation in response to said self-refresh period definition signal for supplying the boosted voltage lower than said reference power supply voltage by a threshold voltage to said boosted voltage output node.

11. The semiconductor memory device as recited in claim 10, wherein said reference power supply voltage is an external power supply voltage.

12. A semiconductor memory device carrying out a normal operation and a self-refreshing operation based on an internal power supply voltage and a boosted voltage obtained by boosting the internal power supply voltage, comprising:

self-refresh period defining means for generating a self-refresh period definition signal defining a period in which said self-refreshing operation is carried out; and boosted voltage generating means for generating the boosted voltage obtained by boosting said internal power supply voltage, wherein said boosted voltage generating means includes
a power supply node receiving an external power supply voltage,
a boosted voltage output node for providing the generated boosted voltage,
ring oscillating means responsive to said self-refresh period definition signal for oscillating a pulse signal in said normal operation and stopping oscillation of said pulse signal in said self-refreshing operation,
pumping means responsive to said pulse signal for supplying the boosted voltage to said boosted voltage output node,
cutting-off means responsive to said self-refresh period definition signal for cutting off supply of the boosted voltage from said pumping means to said boosted voltage output node in said self-refreshing operation, and
external power supply voltage supplying means receiving said external power supply voltage and responsive to said self-refresh period definition signal for supplying said external power supply voltage to said boosted voltage output node in said self-refreshing operation.

13. A semiconductor memory device carrying out a normal operation and a self-refreshing operation based on an internal power supply voltage, comprising:

a CMOS circuit operating as a peripheral circuit;
an analog circuit operating as the peripheral circuit;
first internal power supply voltage supplying means provided corresponding to said CMOS circuit for supplying a first internal power supply voltage lower in said self-refreshing operation than in said normal operation; and second internal power supply voltage supplying means provided corresponding to said analog circuit for supplying a second internal power supply voltage lower in said self-refreshing operation than in said normal operation.

14. A semiconductor memory device carrying out a normal operation and a self-refreshing operation based on a potential swing having a swing width defined by a potential difference between a first internal power supply potential and a second internal power supply potential lower than the first internal power supply potential, comprising:

first internal power supply potential generating means for generating said first internal power supply potential; and second internal power supply potential generating means for generating said second internal power supply potential, wherein said first internal power supply potential generating means includes first potential control means for controlling a level of said first internal power supply potential to be lower in said self-refreshing operation by a predetermined width than in said normal operation, said second internal power supply potential generating means includes second potential control means for controlling a level of said second internal power supply potential to be higher in said self-refreshing operation by a predetermined width than in said normal operation, the center value of said potential swing being controlled to be equal or approximately equal in said normal operation and in said self-refreshing operation.

15. A semiconductor memory device carrying out a normal operation and a self-refreshing operation based on a potential swing having a swing width defined by an internal power supply potential difference, comprising:

internal power supply potential difference generating means for generating said internal power supply potential difference, and decreasing said internal power supply potential difference more in said self-refreshing operation than in said normal operation so that the swing width of said potential swing is made smaller in at least a predetermined period in said self-refreshing operation than in said normal operation and holding said internal power supply potential at a constant value, and then, increasing said internal power supply difference in said self-refreshing operation to said internal power supply potential difference in said normal operation;

first refresh cycle setting means for setting a standard refresh cycle in said self-refreshing operation; and second refresh cycle setting means for setting a refresh cycle in self-refreshing before said internal power supply potential difference is decreased by said internal power supply potential difference generating means to a cycle shorter than said standard refresh cycle.

16. A semiconductor memory device carrying out a normal operation and a self-refreshing operation based on a potential swing having a swing width defined by an internal power supply potential difference, comprising:

internal power supply potential difference generating means for generating said internal power supply potential difference, and decreasing said internal power supply potential difference more in said self-refreshing operation than in said normal operation so that the swing width of said potential swing is made smaller in at least a predetermined period in said self-refreshing operation than in said normal operation and holding said internal power supply potential difference at a constant value, and then, increasing said internal power supply potential difference in said self-refreshing operation to said internal power supply potential difference in said normal operation;

first refresh cycle setting means for setting a standard refresh cycle in said self-refreshing operation; and second refresh cycle setting means for setting a refresh cycle in self-refreshing in a predetermined period before said internal power supply potential difference is increased by said internal power supply potential difference generating means to a cycle shorter than said standard refresh cycle.

17. A semiconductor memory device carrying out a normal operation and a self-refreshing operation based on a potential swing having a swing width defined by an internal power supply potential difference, comprising:

internal power supply potential difference generating means for generating said internal power supply potential difference, and decreasing said internal power supply potential difference more in said self-refreshing operation than in said normal operation so that the swing width of said potential swing is made smaller in at least a predetermined period in said self-refreshing operation than in said normal operation and holding said internal power supply potential difference at a constant value, and then, increasing said internal power supply potential difference in said self-refreshing operation to said internal power supply potential difference in said normal operation;

first refresh cycle setting means for setting a standard refresh cycle in said self-refreshing operation; and second refresh cycle setting means for setting a refresh cycle in self-refreshing after said internal power supply potential difference is increased by said internal power supply potential difference generating means to a cycle shorter than said standard refresh cycle.

18. A semiconductor memory device carrying out a normal operation and a self-refreshing operation based on a potential swing having a swing width defined by an internal power supply potential difference, comprising:

first refresh cycle setting means for setting a standard refresh cycle in said self-refreshing operation; and second refresh cycle setting means for setting a refresh cycle in self-refreshing in a predetermined period at a beginning of said self-refreshing operation to a cycle shorter than said standard refresh cycle.

* * * * *